(12) United States Patent
Enoki et al.

(10) Patent No.: US 8,337,982 B2
(45) Date of Patent: *Dec. 25, 2012

(54) BENZOXAZOLE RESIN PRECURSOR, POLYBENZOXAZOLE RESIN, RESIN FILM AND SEMICONDUCTOR DEVICE

(75) Inventors: Takashi Enoki, Ashiya (JP); Atsushi Izumi, Yokohama (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 1053 days.

This patent is subject to a terminal disclaimer.

(21) Appl. No.: 11/722,625

(22) PCT Filed: Jun. 20, 2005

(86) PCT No.: PCT/JP2005/011688
§ 371 (c)(1),
(2), (4) Date: Jun. 22, 2007

(87) PCT Pub. No.: WO2006/070498
PCT Pub. Date: Jul. 6, 2006

(65) Prior Publication Data
US 2008/0206548 A1   Aug. 28, 2008

(30) Foreign Application Priority Data

Dec. 28, 2004 (JP) ................. 2004-380154
Mar. 2, 2005 (JP) ................. 2005-058093

(51) Int. Cl.
*C08G 73/22* (2006.01)
(52) U.S. Cl. ............. 428/319.3; 528/211; 528/367; 528/396; 525/420; 525/421
(58) Field of Classification Search .......... 528/211, 528/367, 396; 525/420, 421; 428/319.3
See application file for complete search history.

(56) References Cited

U.S. PATENT DOCUMENTS

| 3,852,239 | A  | 12/1974 | Bellmann et al. |
| 7,049,371 | B2 | 5/2006  | Enoki et al.    |
| 2004/0002572 | A1 | 1/2004 | Enoki et al.    |

FOREIGN PATENT DOCUMENTS

| EP | 1333050 | 8/2003 |
| GB | 1379357 | 1/1975 |
| JP | 49-52293 | 5/1974 |
| JP | 2000-195853 | 7/2000 |
| JP | 2003-105085 | 4/2003 |
| JP | 2004-018593 | * 1/2004 |
| JP | 2004-18593 | 1/2004 |
| JP | 2004-224900 | * 8/2004 |
| WO | WO 02/24788 | 3/2002 |

OTHER PUBLICATIONS

Yingmin Cao, "Latest Development of Diamondoid and Diamondoid Chemistry" Chemistry progress, pp. 40-42.
Japanese Office Action for corresponding JP Application No. 2005-058093, Feb. 10, 2009.
Japanese Office Action for corresponding JP Application No. 2005-058093, Jan. 26, 2010.
International Search Report for corresponding International Application No. PCT/JP2005/011688, Aug. 9, 2005.

* cited by examiner

Primary Examiner — James J Seidleck
Assistant Examiner — Gregory Listvoyb
(74) Attorney, Agent, or Firm — Ditthavong Mori & Steiner, P.C.

(57) ABSTRACT

A benzoxazole resin precursor comprising a first repeating unit which is obtained by the reaction of a bisaminophenol compound and a dicarboxylic acid compound, at least one of which has the diamondoid structure; a benzoxazole resin precursor further comprising a second repeating unit which is obtained by the reaction of a bisaminophenol compound having no diamondoid structure and a dicarboxylic acid compound having no diamondoid structure; a polybenzoxazole resin obtained by the ring-closing reaction with dehydration of the above benzoxazole resin precursor; a resin film constituted with the benzoxazole resin precursor or the polybenzoxazole resin. A polybenzoxazole resin and a resin film having excellent heat resistance and a small permittivity and a semiconductor device using the resin film can be obtained from the benzoxazole resin precursor.

19 Claims, 1 Drawing Sheet

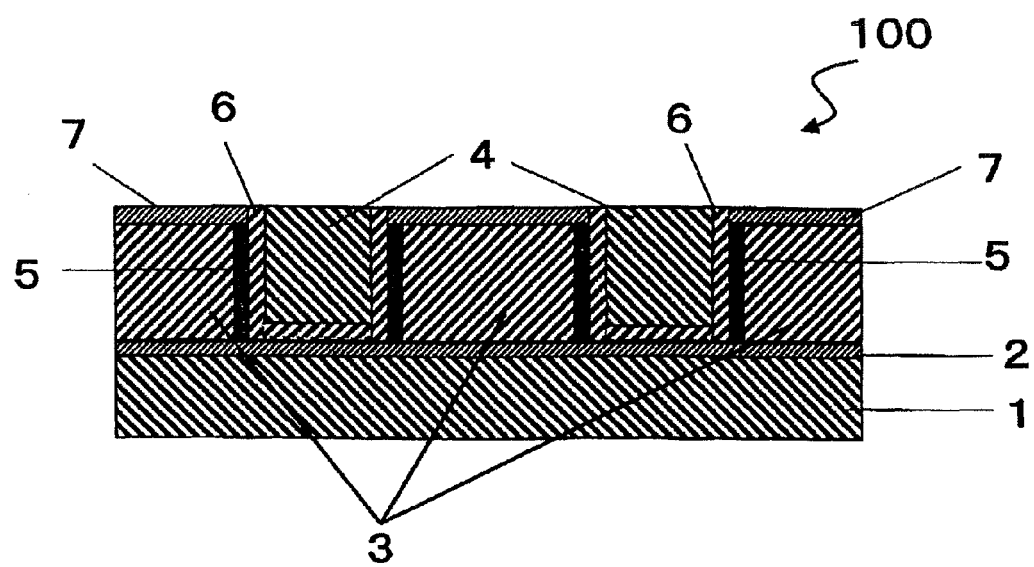

BENZOXAZOLE RESIN PRECURSOR, POLYBENZOXAZOLE RESIN, RESIN FILM AND SEMICONDUCTOR DEVICE

TECHNICAL FIELD

The present invention relates to a benzoxazole resin precursor, a polybenzoxazole resin, a resin film and a semiconductor device.

BACKGROUND ART

As the interlayer insulation film for semiconductors, oxide films (SiOx films) prepared in accordance with the chemical vapor deposition process (the CVD process) are mainly used at present. However, due to the great permittivity, the use of inorganic insulation films such as oxide films is becoming difficult as faster semiconductors exhibiting more excellent performance are required. Therefore, the application of organic materials to obtain interlayer insulation films having a small permittivity is studied. For the organic material used for the interlayer insulation film, excellent heat resistance and electric properties and a small permittivity are required.

Heretofore, polyimide resins, polyquinoline resins and poly-quinoxaline resins have been studied as the organic material (for example, refer to Patent Reference 1).

However, polyimide resins have drawbacks in that heat resistance is poor, permittivity is great and moisture absorption is great, and the application of polyimides has been limited to some types of semiconductor elements such as bipolar semiconductor elements from the standpoint of the reliability.

Although polyquinoline resins and polyquinoxaline resins exhibit a combination of more excellent heat resistance, a smaller permittivity and a smaller moisture absorption than the polyimide resins, polyquinoline resins and polyquinoxaline resins are thermoplastic, and patterns of the resins are deformed when the resins are exposed to a temperature higher than the glass transition temperature. This phenomenon occasionally causes a problem in the production of semiconductors.

[Patent Reference 1] Japanese Patent Application Laid Open No. 2000-195853

DISCLOSURE OF THE INVENTION

The present invention has an object of providing a benzoxazole resin precursor which exhibits excellent heat resistance when a polybenzoxazole resin is prepared from the precursor.

The present invention has a further object of providing a polybenzoxazole resin and a resin film exhibiting excellent heat resistance and a small permittivity and a semiconductor device using the resin film.

The above objects can be achieved by the present invention described in the following in (1) to (23).

(1) A benzoxazole resin precursor comprising a repeating unit obtained by reaction of a bisaminophenol compound and a dicarboxylic acid compound, wherein the repeating unit is a first repeating unit which is a group selected from a group consisting of:

(a) repeating units obtained by reaction of a bisaminophenol compound having a diamondoid structure and a dicarboxylic acid compound having no diamondoid structure;
(b) repeating units obtained by reaction of a bisaminophenol compound having no diamondoid structure and a dicarboxylic acid compound having a diamondoid structure; and
(c) repeating units obtained by reaction a bisaminophenol compound having a diamondoid structure and a dicarboxylic acid compound having a diamondoid structure.

(2) The benzoxazole resin precursor described in (1), which comprises a second repeating unit obtained by reaction of a bisaminophenol compound having no diamondoid structure and a dicarboxylic acid compound having no diamondoid structure.

(3) The benzoxazole resin precursor described in any one of (1) and (2), wherein the diamondoid structure is bonded to a functional group other than the diamondoid structure.

(4) The benzoxazole resin precursor described in any one of (1) to (3), wherein one or both of the bisaminophenol compound having no diamondoid structure and the dicarboxylic acid compound having no diamondoid structure are compounds having the functional group other than the diamondoid structure.

(5) The benzoxazole resin precursor described in any one of (1) to (4), wherein the diamondoid structure is at least one group selected from a group consisting of adamantyl group, diamantyl group, triamantyl group, tetramantyl group, pentamantyl group, hexamantyl group, heptamantyl group, octamantyl group, nonamantyl group, decamantyl group, undecamantyl group, biadamantyl group, triadamantyl group, tetraadamantyl group, pentaadamantyl group, hexaadamantyl group, heptaadamantyl group, octaadamantyl group, nonaadamantyl group, decaadamantyl group and undecaadamantyl group.

(6) The benzoxazole resin precursor described in any one of (1) to (5), wherein the diamondoid structure has an alkyl group.

(7) The benzoxazole resin precursor described in any one of (3) to (6), wherein the functional group other than the diamondoid structure has an acetylene bond.

(8) The benzoxazole resin precursor described in any one of (1) to (7), wherein the dicarboxylic acid compound is at least one compound selected from a group consisting of phthalic acid, bisbenzoic acid and biphenyldicarboxylic acid.

(9) The benzoxazole resin precursor described in any one of (1) to (8), wherein the dicarboxylic acid having a diamondoid structure is at least one dicarboxylic acid selected from a group consisting of adamantane-dicarboxylic acid, biadamantanedicarboxylic acid and tetraadamantane-dicaroboxylic acid.

(10) The benzoxazole resin precursor described in any one of (2) to (9), wherein the first repeating unit and the second repeating unit are components of a copolymer.

(11) The benzoxazole resin precursor described in (1), which comprises a third repeating unit represented by following formula [1]:

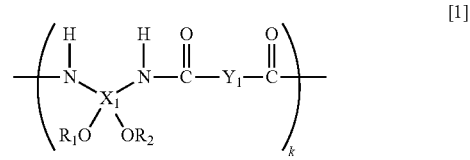

[1]

wherein

R₁ and R₂ each independently represent hydrogen atom or an organic group;

k represents an integer of 2 to 1,000;

X₁ represents at least one group selected from a group consisting of:

groups represented by following formulae [2-1] and [2-2]:

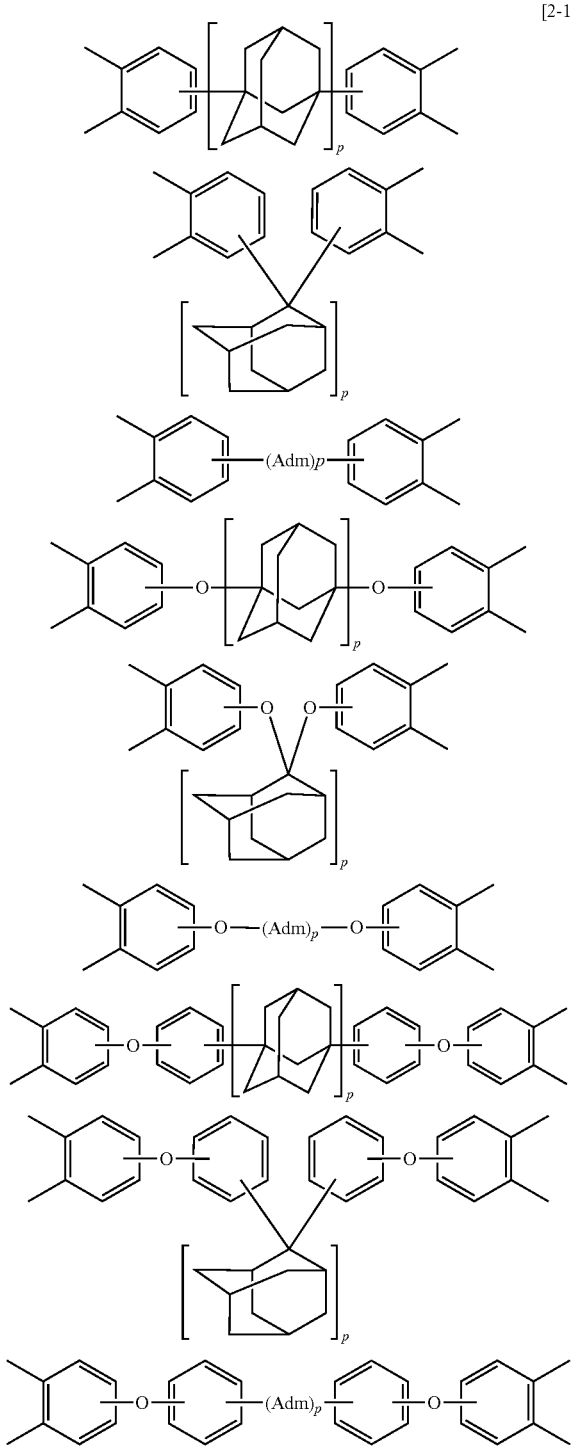

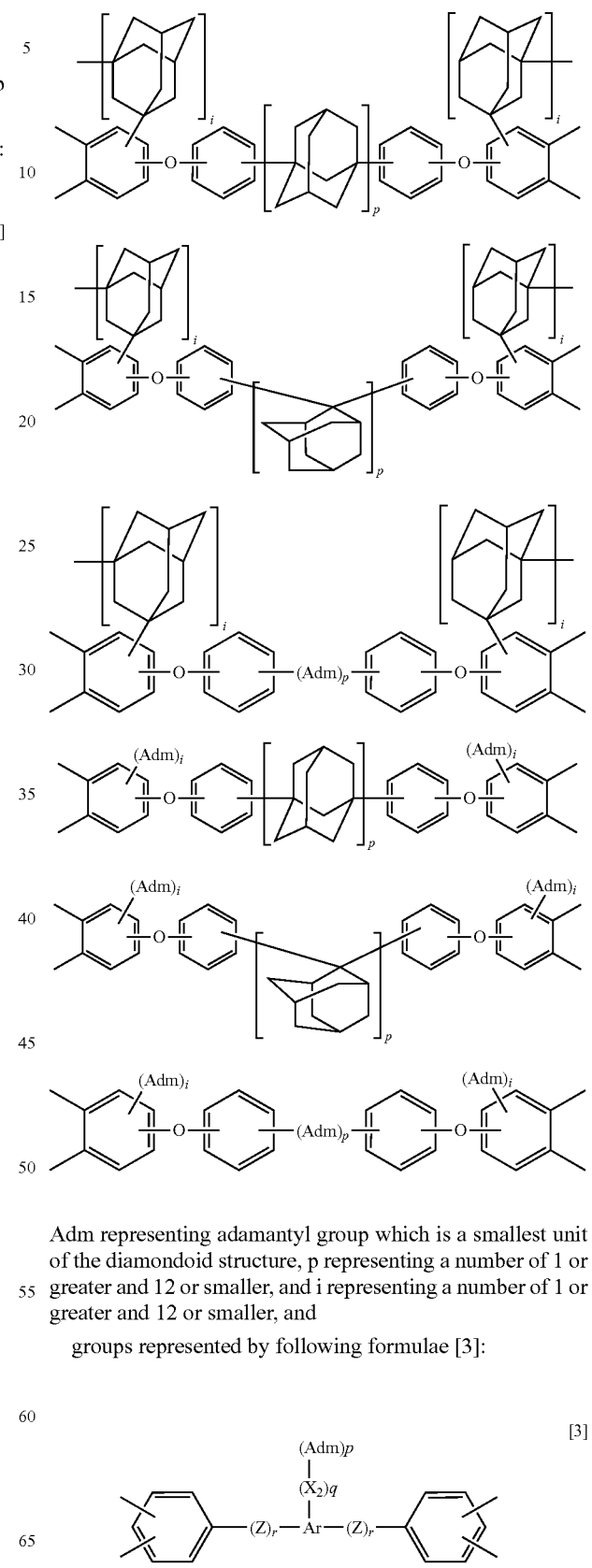

Adm representing adamantyl group which is a smallest unit of the diamondoid structure, p representing a number of 1 or greater and 12 or smaller, and i representing a number of 1 or greater and 12 or smaller, and groups represented by following formulae [3]:

-continued

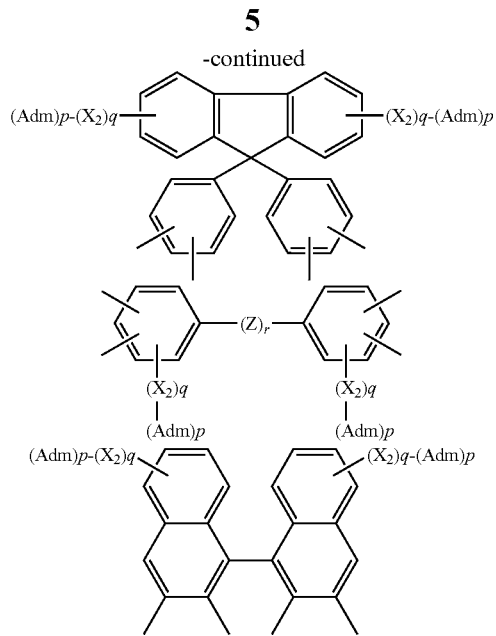

Adm representing adamantyl group which is a smallest unit of the diamondoid structure, p representing a number of 1 or greater and 12 or smaller, $X_2$ representing ethynyl group or propargyl ether group, Z representing —O—, —$SO_2$—, —$CH_2$—, —$C(CH_3)_2$—, —$C(CF_3)_2$— or an aromatic group, A representing an aromatic group having a functionality of 3 or greater, r representing 0 or 1, and q representing an integer of 1 to 4; and $Y_1$ represents at least one group selected from a group consisting of:

groups represented by following formula [4]:

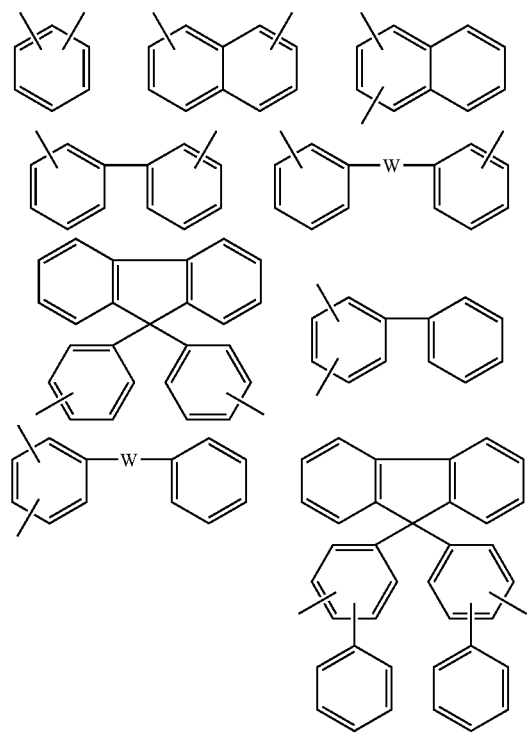

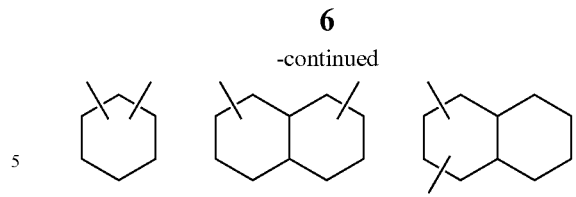

W representing at least one group selected from a group consisting of groups expressed by following formulae [5]:

[5]

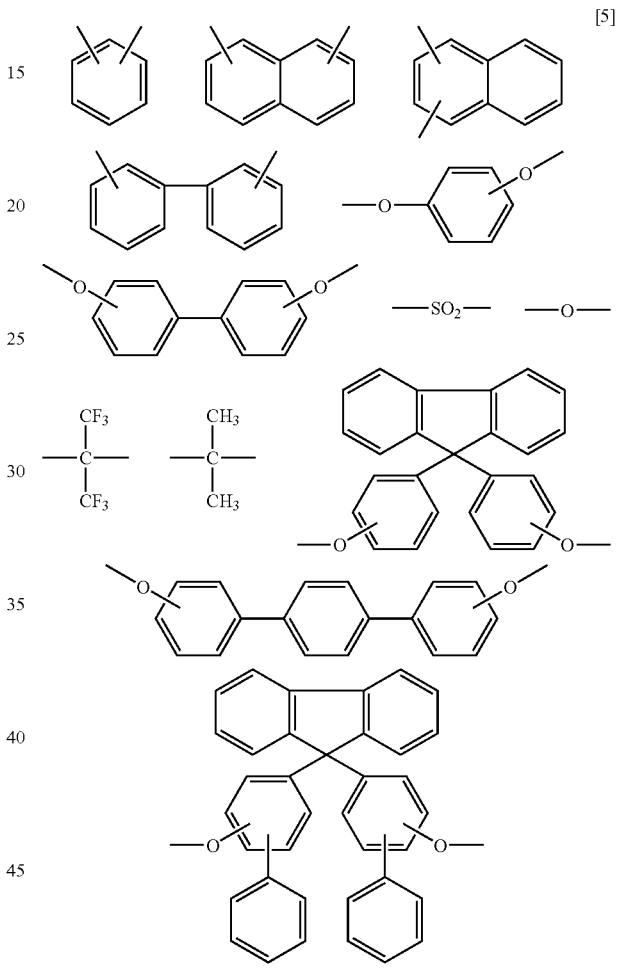

groups expressed by following formulae [6-1] and [6-2]:

[6-1]

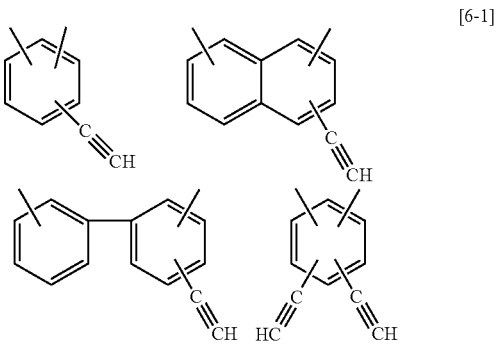

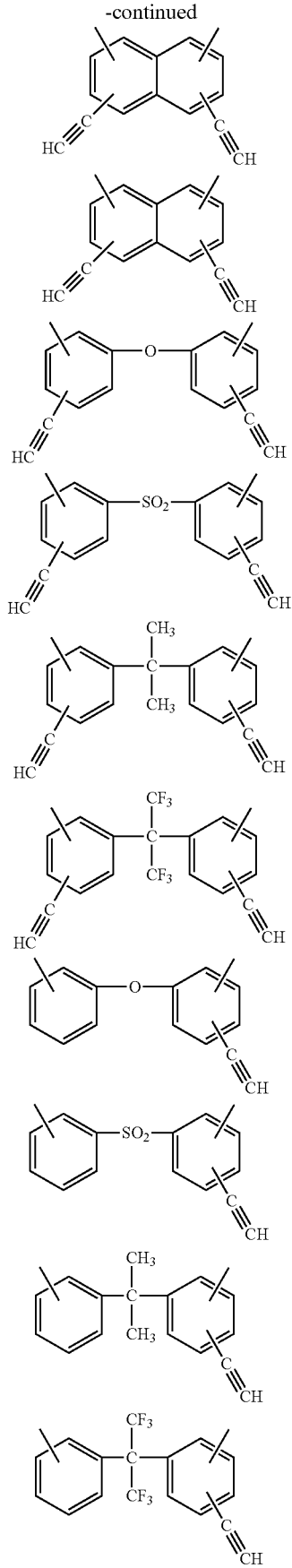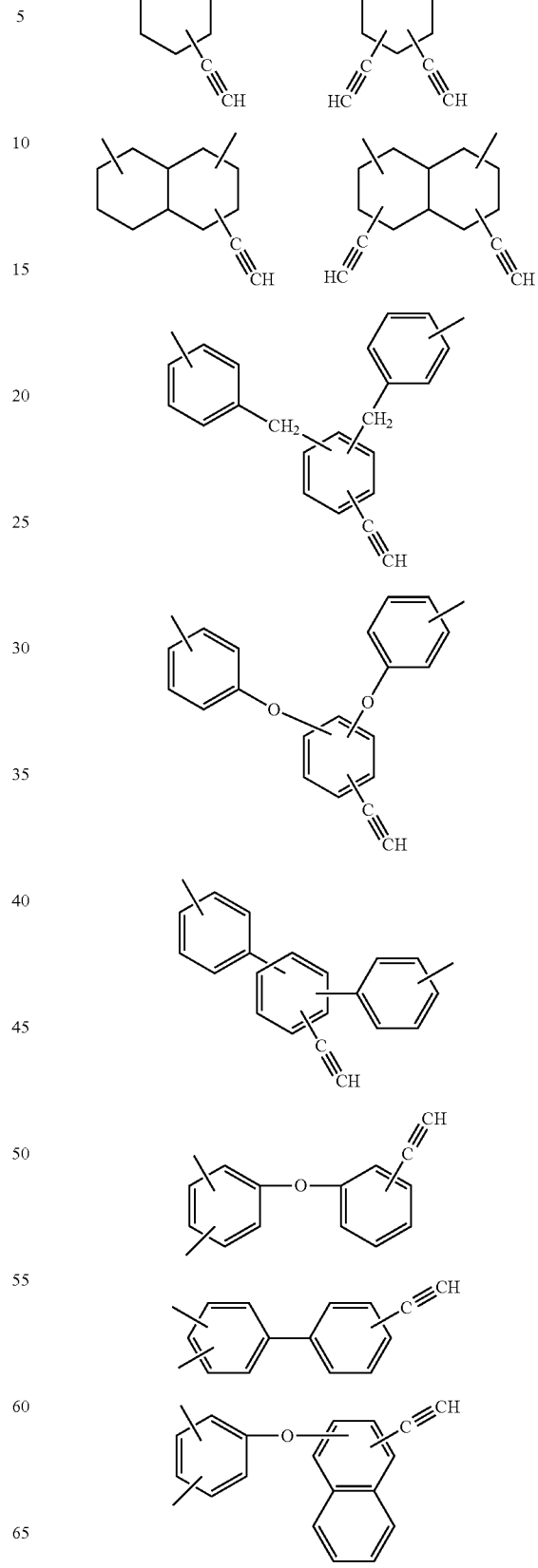

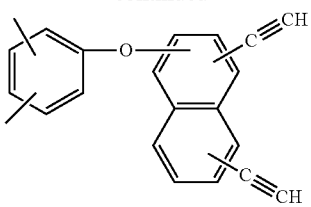
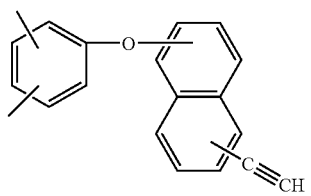
groups represented by following formulae [7-1] and [7-2]:
[7-1]
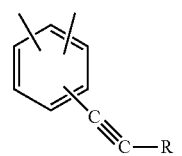 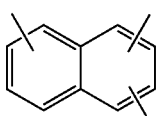
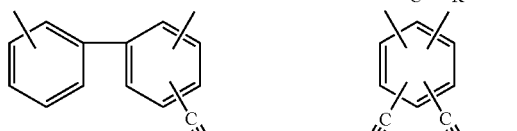
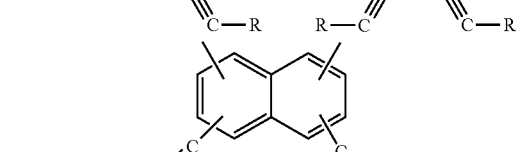
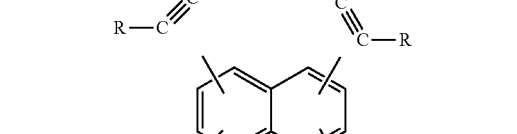
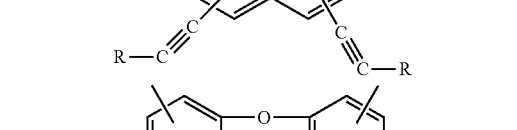
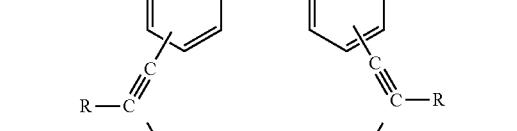
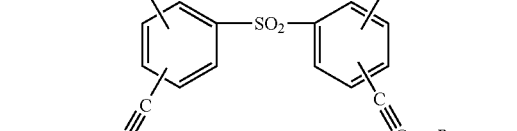
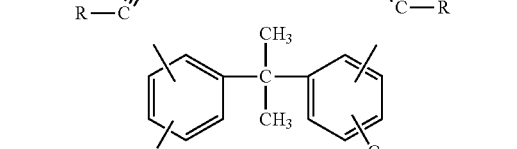
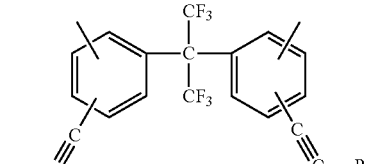
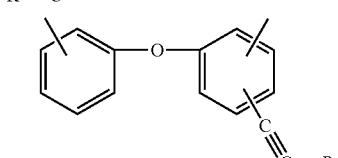
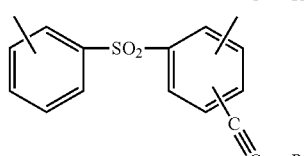
[7-2]
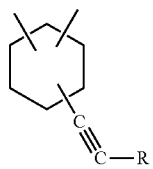
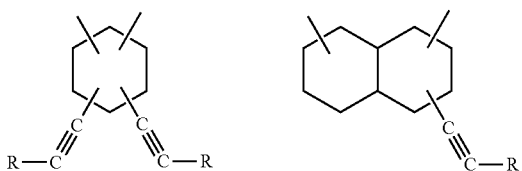
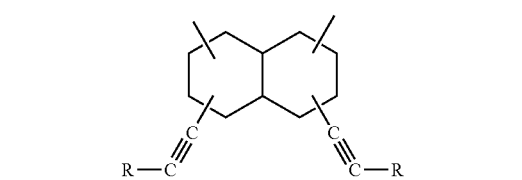
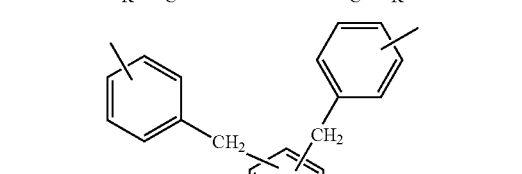
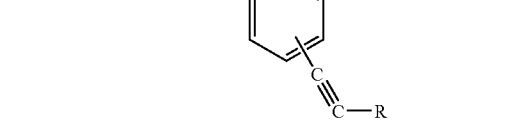

-continued

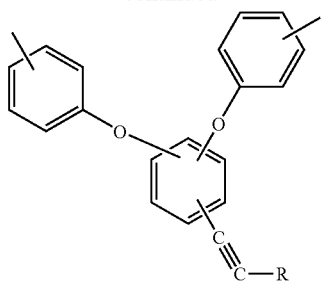

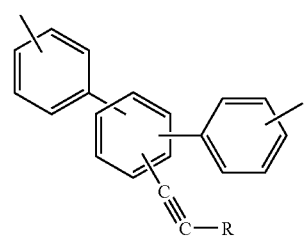

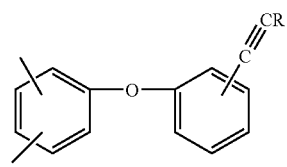

[7-2]

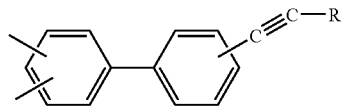

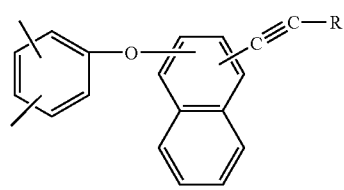

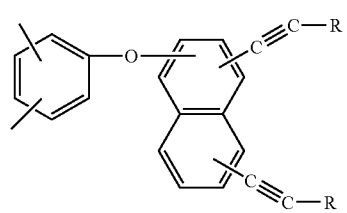

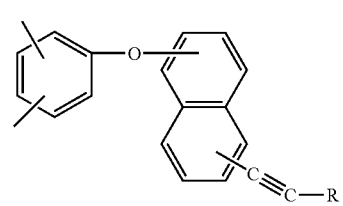

R representing an organic group, group expressed by following formula [8]:

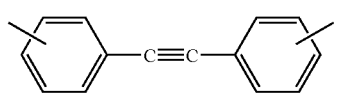

[8]

and
groups expressed by following formula [9]:

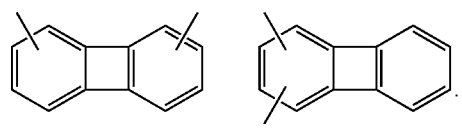

[9]

(12) The benzoxazole resin precursor described in (1), which comprises a fourth repeating unit represented by following formula [10]:

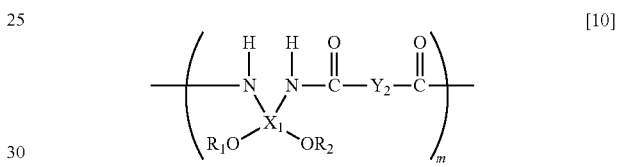

[10]

wherein
$R_1$ and $R_2$ each independently represent hydrogen atom or an organic group;
m represents a number of 2 to 1,000;
$X_1$ represents a group selected from a group consisting of the groups represented by formulae [2-1], [2-2] and [3], which are described in (11); and
$Y_2$ represents at least one group selected from a group consisting of groups represented by following formulae [11-1] and [11-2]:

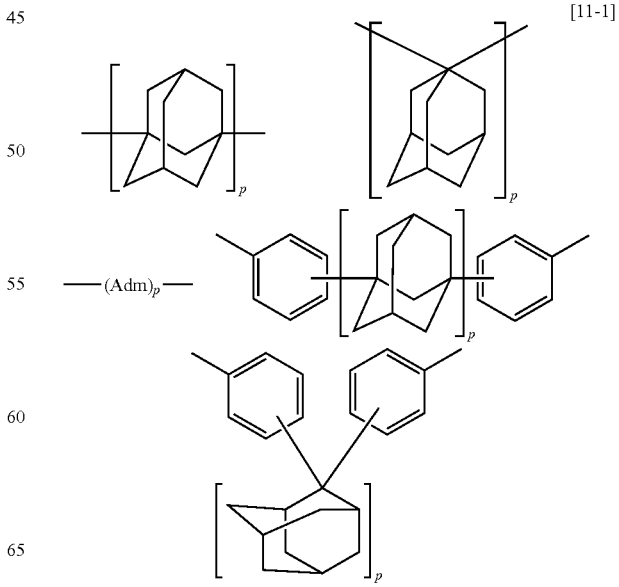

[11-1]

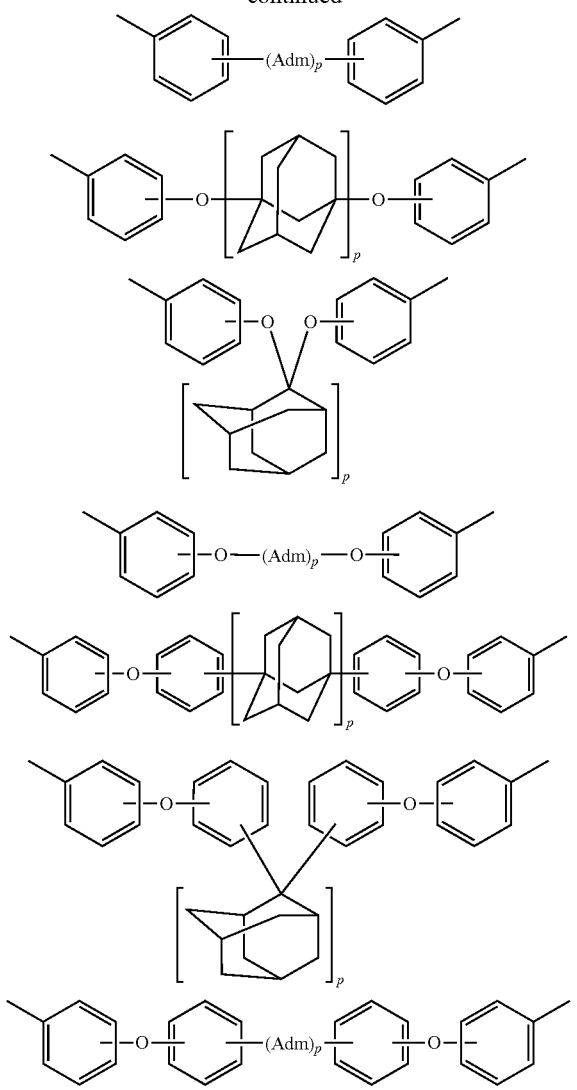
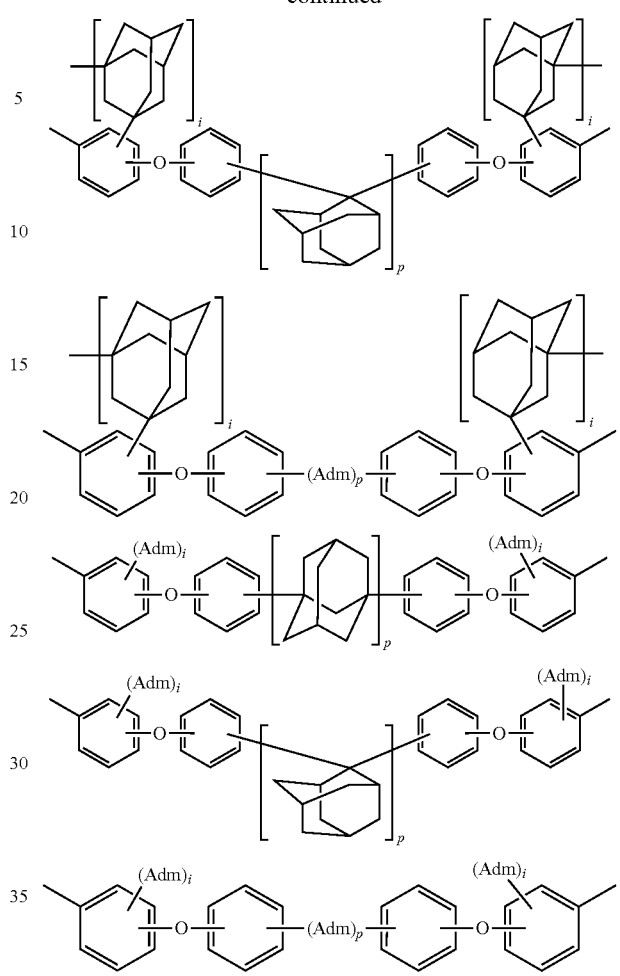
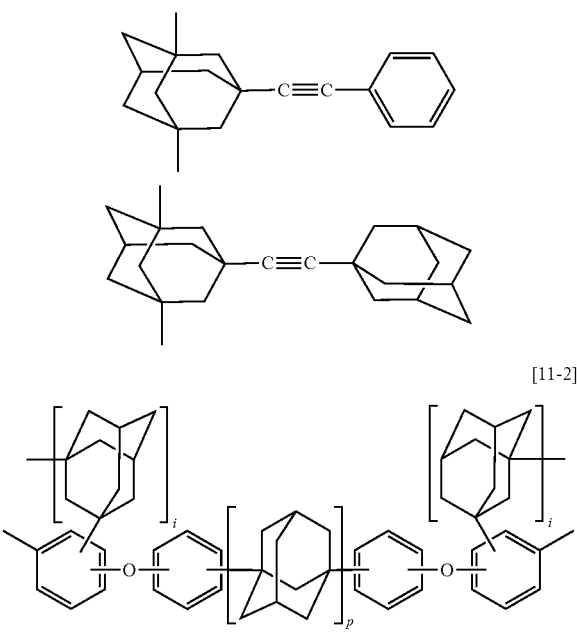
and groups represented by following formulae [12-1] and [12-2]:
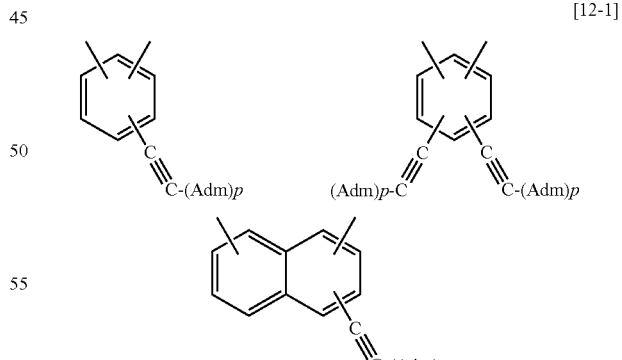
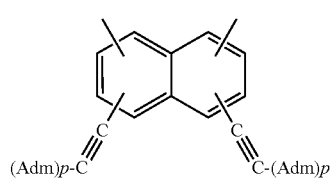

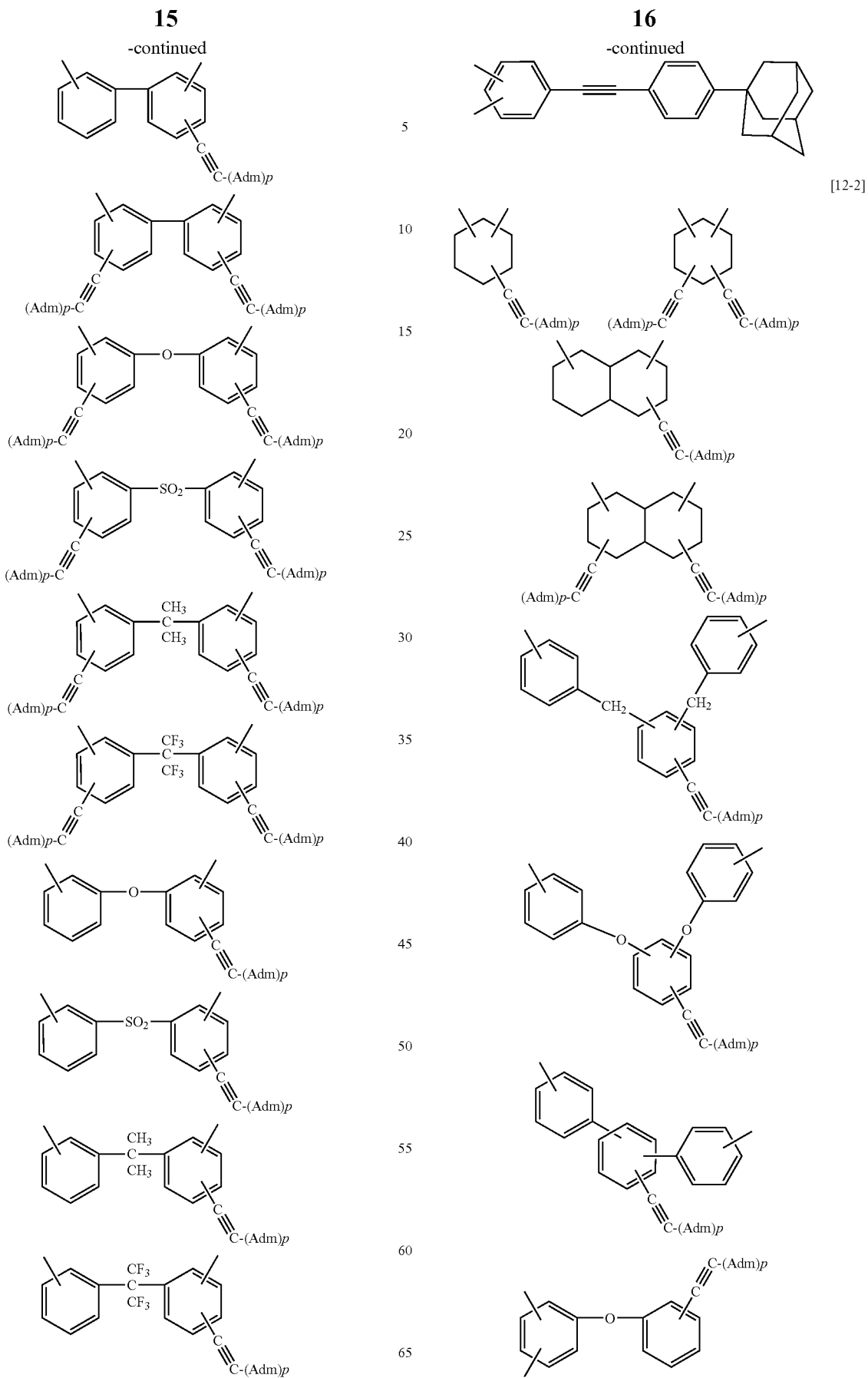

-continued

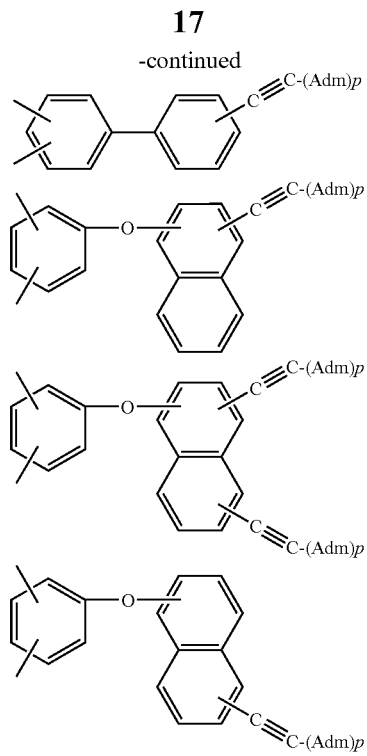

in formulae [11-1], [11-2], [12-1] and [12-2], Adm representing adamantyl group which is a smallest unit of the diamondoid structure, p representing a number of 1 or greater and 12 or smaller, and i representing a number of 1 or greater and 12 or smaller.

(13) The benzoxazole resin precursor described in (12), which further comprises the third repeating unit described in (11).

(14) The benzoxazole resin precursor described in (1), which comprises a fifth repeating unit represented by following formula [13]:

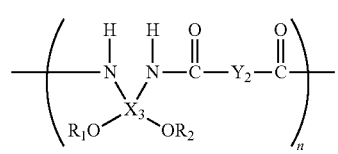

[13]

wherein $R_1$ and $R_2$ each independently represent hydrogen atom or an organic group;

n represents an integer of 2 to 1,000;

$X_3$ represents at least one group selected from a group consisting of:

groups represented by following formulae [14]:

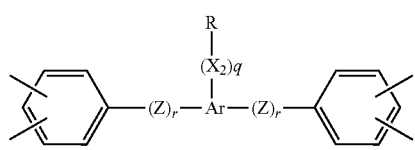

[14]

-continued

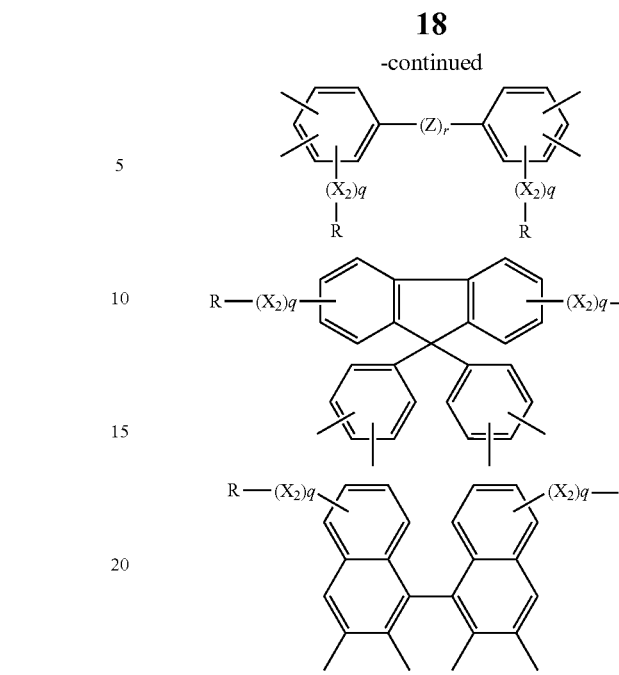

$X_2$ representing ethynyl group or propargyl ether group, Z representing —O—, —SO$_2$—, —CH$_2$—, —C(CH$_3$)$_2$—, —C(CF$_3$)$_2$— or an aromatic group, Ar representing an aromatic group having a functionality of 3 or greater, R representing a hydrogen atom or an organic group, r representing 0 or 1, and q representing an integer of 1 to 4, and groups represented by following formulae [15]

[15]

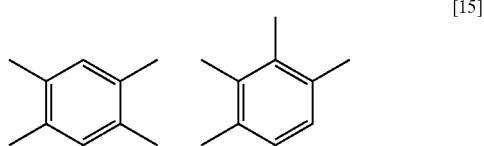

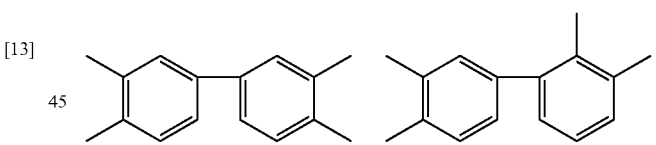

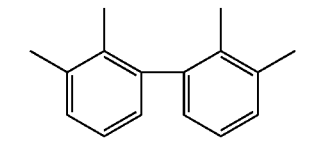

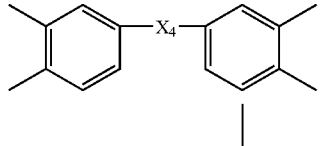

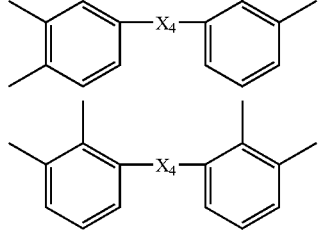

-continued

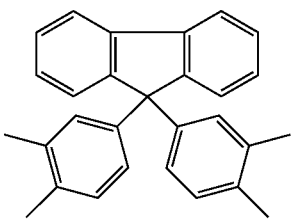

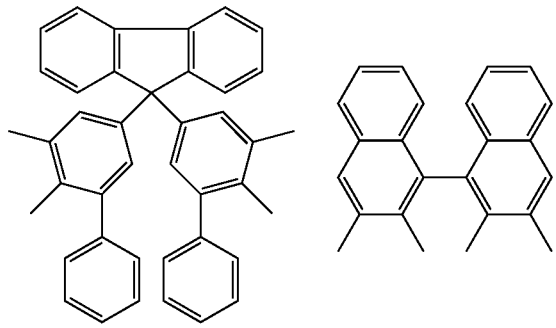

$X_4$ representing at least one group selected from a group consisting of groups expressed by following formulae [16]:

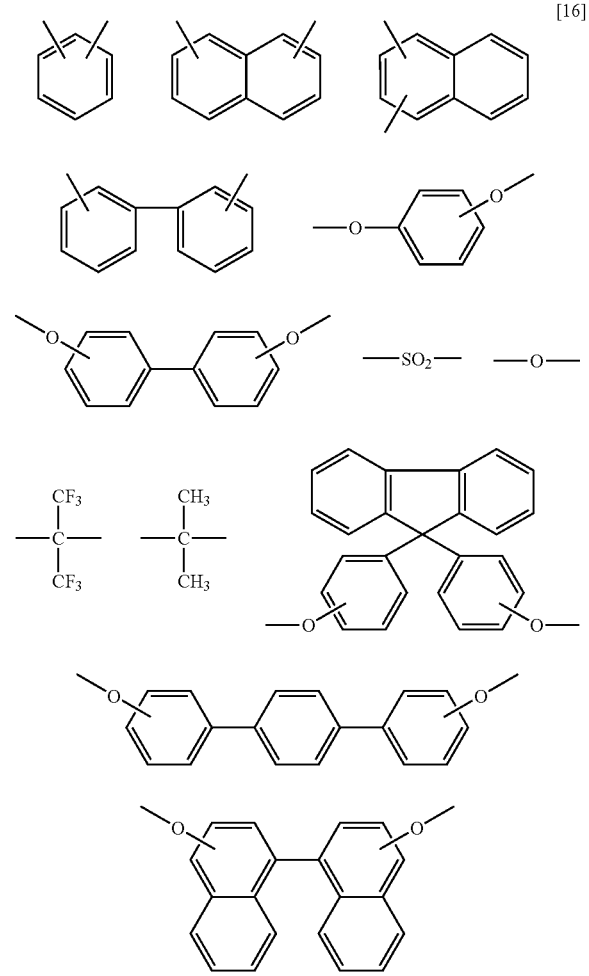

[16]

-continued

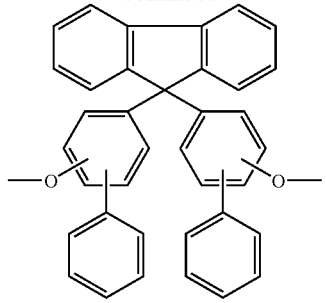

and $Y^2$ represents at least one group selected from the groups represented by formulae [11-1], [11-2], [12-1] and [12-2] which are described in (11).

(15) The benzoxazole resin precursor described in (14), which further comprises one or both of the third repeating unit described in (11) and the fourth repeating unit described in (12).

(16) The benzoxazole resin precursor described in any one of (11) to (15), which comprises a sixth repeating unit represented by following formula [17]:

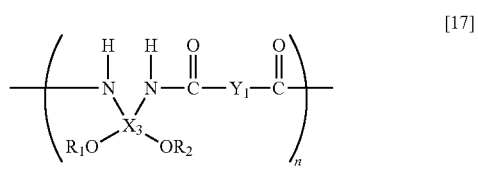

[17]

wherein $R_1$ and $R_2$ each independently represent hydrogen atom or an organic group; n represents an integer of 2 to 1,000; $X_3$ represents at least one group selected from the groups represented by formulae [14] and the groups represented by formulae [15]; and $Y_1$ represents at least one group selected from the groups represented by formulae [4], the groups expressed by formulae [6-1] and [6-2], the groups represented by formulae [7-1] and [7-2], the group expressed by formula [8] and the group expressed by formula [9].

(17) A polybenzoxazole resin obtained by a ring-closing reaction with dehydration of the benzoxazole resin precursor described in any one of (1) to (16).

(18) A benzoxazole resin precursor composition comprising at least two benzoxazole resin precursors selected from a group consisting of benzoxazole resin precursors described in (11) to (16), which comprises at least one benzoxazole resin precursor selected from benzoxazole resin precursors described in (11) to (15).

(19) A varnish which comprises the benzoxazole resin precursor described in any one of (1) to (16), the polybenzoxazole resin described in (17) or the benzoxazole resin precursor composition described in (18) and an organic solvent which can dissolve or disperse the benzoxazole resin precursor, the polybenzoxazole resin or the benzoxazole resin precursor composition.

(20) A resin film which is constituted with the benzoxazole resin precursor described in any one of (1) to (16), the polybenzoxazole resin described in (17) or the benzoxazole resin precursor composition described in (18).

(21) The resin film described in (20), which has fine pores having an average diameter of 10 nm or smaller.

(22) The resin film described in any one of (20) and (21), which is a film selected from a group consisting of interlayer insulation films for semiconductors, protective films for semiconductors and protective films for etching.

(23) A semiconductor device which comprises a resin film described in any one of (20) to (22).

BRIEF DESCRIPTION OF THE DRAWINGS

FIG. 1 shows a diagram schematically exhibiting a sectional view of an embodiment of the semiconductor device of the present invention. In the FIGURE, the mark 1 means a semiconductor substrate, the mark 2 means a silicon nitride film, the mark 3 means an interlayer insulation film, the mark 4 means a copper wiring layer, the mark 5 means a layer treated by modification, the mark 6 means a barrier layer, the mark 7 means a hard mask layer, and the mark 100 means a semiconductor device.

THE MOST PREFERRED EMBODIMENT TO CARRY OUT THE INVENTION

The benzoxazole resin precursor, the polybenzoxazole resin, the resin film and the semiconductor device of the present invention will be described in the following.

The benzoxazole resin precursor of the present invention is a compound comprising a first repeating unit obtained by the reaction of a bisaminophenol compound and a dicarboxylic acid compound, at least one of which has the diamondoid structure.

The polybenzoxazole resin of the present invention is characterized in that the polybenzoxazole resin is obtained by the reaction of the benzoxazole resin precursor described above.

The resin film of the present invention is constituted with a resin composition comprising the polybenzoxazole resin precursor or the polybenzoxazole resin.

The semiconductor device of the present invention comprises the resin film described above.

The benzoxazole resin precursor of the present invention will be described in the following.

The benzoxazole resin precursor of the present invention is a benzoxazole resin precursor comprising a repeating unit obtained by the reaction of a bisaminophenol compound and a dicarboxylic acid compound, wherein the repeating unit is the first repeating unit derived from the bisaminophenol compound and the dicarboxylic acid compound at least one of which has the diamondoid structure. For example, the benzoxazole resin precursor comprises a repeating unit obtained by the reaction of a bisaminophenol compound having the diamondoid structure and a dicarboxylic acid compound having no diamondoid structure, a repeating unit obtained by the reaction of a bisaminophenol compound having no diamondoid structure and a dicarboxylic acid compound having the diamondoid structure or a repeating unit obtained by the reaction of a bisaminophenol compound having the diamondoid structure and a dicarboxylic acid compound having the diamondoid structure. The diamondoid structure may comprise functional groups other than the diamondoid structure. As for the bisaminophenol compound having no diamondoid structure and the dicarboxylic acid compound having no diamondoid structure, it is preferable that at least one of the bisaminophenol compound having no diamondoid structure and the dicarboxylic acid compound having no diamondoid structure has a functional group other than the diamondoid structure. When the above combinations are used, the benzoxazole resin precursor comprising the diamondoid structure can be obtained, and the polybenzoxazole resin obtained from the benzoxazole resin precursor can exhibit the excellent heat resistance, a great modulus and a small permittivity. The resistance to moisture can also be improved. It is preferable that the diamondoid structure described above is a structure having an alkyl group. When the diamondoid structure has an alkyl group, solubility in organic solvents can be improved.

The diamondoid structure in the present invention is a structure comprising the adamantane structure as the smallest unit. Examples of the groups having the structure comprising the adamantane structure as the smallest unit include groups having a polycyclic skeleton structure such as adamantyl group, diamantyl group, triamantyl group, tetramantyl group, pentamantyl group, hexamantyl group, heptamantyl group, octamantyl group, nonamantyl group, decamantyl group and undecamantyl group. Further examples include groups having a plurality of the groups having a polycyclic skeleton structure described above. Examples of the group having a plurality of the groups having a polycyclic skeleton structure described above include groups having an oligo-structure or a poly-structure. When the group having a polycyclic skeleton structure is adamantyl group, examples of the group having an oligo-structure or a polystructure include biadamantyl groups such as di(1,3-adamantane) group and di(2,2-adamantane) group; triadamantyl groups such as tri(1,3-adamantane) group and tri(2,2-adamantane) group; tetraadamantyl groups such as tetra(1,3-adamantane) group and tetra(2,2-adamantane) group; pentaadamantyl groups such as penta(1,3-adamantane) group and penta(2,2-adamantane) group; heptaadamantyl groups such as hepta(1,3-adamantane) group and hepta(2,2-adamantane) group; groups having an oligo-adamantane structure such as hexaadamantyl group, octaadamantyl group, nonaadamantyl group, decaadamantyl group and undecaadamantyl group; and groups having a polyadamantane structure having a greater number of adamantyl groups. When the group having a polycyclic skeleton structure is a group other than adamantyl group, examples of the group having an oligo-structure or a poly-structure include groups obtained by replacing the adamantyl group in the groups having an oligo-adamantane structure or a polyadamantane structure when the group having a polycyclic skeleton structure is adamantyl group as described above with other groups. Examples of such groups include groups having a plurality of diamantane groups such as bi(diamantane) group, tri(di-amantane) group, tetra(diamantane) group, penta(diamantane) group, hexa(diamantane) group, hepta(diamantane) group, octa(diamantane) group, nona(diamantane) group, deca(diamantane) group and undeca-(diamantane) group; groups having a plurality of triamantane groups such as bi(triamantane) group, tri(triamantane) group, tetra(triamantane) group, penta(triamantane) group, hexa(triamantane) group, hepta(tri-amantane) group, octa(triamantane) group, nona(triamantane) group, deca(triamantane) group and undeca(triamantane) group; and groups having a plurality of tetraamantane groups such as bi(tetraamantane) group, tri(tetraamantane) group, tetra(tetraamantane) group, penta(tetra-amantane) group, hexa(tetraamantane) group, hepta(tetraamantane) group, octa(tetraamantane) group, nona(tetraamantane) group, deca-(tetraamantane) group and undeca(tetraamantane) group. Among these groups, adamantyl group, diamantyl group, triamantyl group, tetramantyl group, pentamantyl group, hexamantyl group, heptamantyl group, octamantyl group, nonamantyl group, decamantyl group, undecamantyl group, biadamantyl group, triadamantyl group, tetraadamantyl group, pentaadamantyl group, hexaadamantyl group, heptaadamantyl group, octaadamantyl group, nonaadamantyl group, decaadamantyl group and undecaadamantyl group are preferable, and adamantyl group, diamantyl group, triamantyl group, tetramantyl group, pentamantyl group, di(1,3-adamantane) group, tri(1,3-adamantane) group, tetra(1,3-adamantane) group, penta(1,3-adamantane) group, di(2,2-adamantane) group, tri(2,2-adamantane) group, tetra(2,2-adamantane) group and penta (2,2-adamantane) group are more preferable. The polybenzoxazole resin obtained from the benzoxazole resin precursor comprising the above structure can maintain the heat resistance, decrease the permittivity and improve the moisture resistance. To the group having the adamantane structure described above, alkyl groups such as methyl group, ethyl group, n-propyl group, isopropyl group, n-butyl group, isobutyl group and tert-butyl group and fluoroalkyl groups such as fluoromethyl group, fluoroethyl group, fluoropropyl group and fluorobutyl group may be bonded.

In the present invention, examples of the group in which the diamondoid structure is bonded to a functional group other than the diamondoid structure include adamantylethynyl group, diamantylethynyl group, triamantylethynyl group, tetramantylethynyl group, pentamantyl-ethynyl group, hexamantylethynyl group, heptamantylethynyl group, octamantylethynyl group, nonamantylethynyl group, decamantylethynyl group, undecamantylethynyl group, biadamantylethynyl group, tri-adamantylethynyl group, tetraadamantylethynyl group, pentaadamantyl-ethynyl group, hexaadamantylethynyl group, heptaadamantylethynyl group, octaadamantylethynyl group, nonaadamantylethynyl group, decadamantylethynyl group and undecadamantylethynyl group, adamantylphenylethynyl group, diamantylphenylethynyl group, tri-amantylphenylethynyl group, tetramantylphenylethynyl group, penta-mantylphenylethynyl group, hexamantylphenylethynyl group, hepta-mantylphenylethynyl group, octamantylphenylethynyl group, nona-mantylphenylethynyl group, decamantylphenylethynyl group and undecamantylphenylethynyl group, biadamantylphenylethynyl group, triadamantylphenylethynyl group, tetraadamantylphenylethynyl group, pentaadamantylphenylethynyl group, hexaadamantylphenylethynyl group, heptaadamantylphenylethynyl group, octaadamantylphenyl-ethynyl group, nonaadamantylphenylethynyl group, decaadamantylphenylethynyl group and undecaadamantylphenylethynyl group, adamantylphenoxyphenylethynyl group, diamatylphenoxyphenylethynyl group, triamatylphenoxyphenylethynyl group, tetramantylphenoxy-phenylethynyl group, pentamantylphenoxyphenylethynyl group, hexamantylphenoxyphenylethynyl group, heptamantylphenoxyphenyl-ethynyl group, octamantylphenoxyphenylethynyl group, nonamantyl-phenoxyphenylethynyl group, decamantylphenoxyphenylethynyl group and undecamantylphenoxyphenylethynyl group, biadamatylphenoxy-phenylethynyl group, triadamatylpheoxyphenylethynyl group, tetraadamantylphenoxyphenylethynyl group, pentaadamantylphenoxyphenyl-ethynyl group, hexaadamantylphenoxyphenylethynyl group, hepta-adamantylphenoxyphenylethynyl group, octaadamantylphenoxyphenyl-ethynyl group, nonaadamantylphenoxyphenylethynyl group, deca-adamantylphenoxyphenylethynyl group and undecaadamantylphenoxy-phenylethynyl group. Examples of the group to which the diamondoid structure is bonded other than the ethynyl group described above include functional groups such as a functional groups having the acetylene bond, biphenylene group, cyanato group, maleimido group, nadimido group, vinyl group and cyclopentadienyl group to which the diamondoid structure is bonded. To the diamondoid structure which is bonded to the functional group other than the diamondoid structure, alkyl groups such as methyl group, ethyl group, n-propyl group, isopropyl group, n-butyl group, isobutyl group and tert-butyl group and fluoroalkyl groups such as fluoromethyl group, fluoroethyl group, fluoropropyl group and fluorobutyl group may be bonded. Among the above groups, adamantylphenyl-ethynyl group, dimethyladamantylphenylethynyl group, trimethyladamantylphenylethynyl group, biadamantylphenylethynyl group, tetramethylbiadamantylphenylethynyl group, pentamethylbiadamantyl-phenylethynyl group, adamantylphenoxyphenylethynyl group, dimethyl-adamantylphenylethynyl group, trimethyladamantylphenylethynyl group, biadamantylphenoxyphenylethynyl group, tetramethylbi-adamantyl-phenoxyphenylethynyl group and pentamethylbi-adamanylphenoxy-phenylethynyl group are preferable.

In the present invention, examples of the group other than the diamondoid structure include functional groups having the acetylene bond, biphenylene group, cyanato group, maleimido group, nadimido group, vinyl group and cyclopentadienyl group. When the above group is present, solubility of the benzoxazole resin precursor into solvents can be improved. Moreover, heat resistance of the polybenzoxazole resin obtained from the benzoxazole resin precursor can be improved.

Among the above groups, the functional group having the acetylene bond is preferable. Examples of the functional group having the acetylene bond include ethynyl group, phenylethynyl group, naphthyl-ethynyl group, anthrylethynyl group, quinolylethynyl group, quinoxalyl-ethynyl group, alkylethynyl groups and propargyl ether group. Among these groups, one or more functional groups selected from ethynyl group, phenylethynyl group and naphthylethynyl group are preferable. When the above group is present, heat resistance and, in particular, the glass transition temperature of the obtained polybenzoxazole resin can be improved. The heat resistance of the polybenzoxazole resin is improved since the crosslinking density of the obtained polybenzoxazole resin can be improved due to the presence of the functional group in the benzoxazole resin precursor. When an interlayer insulation film is obtained by forming a nano-foam using the polybenzoxazole resin, it is made possible that the shape of the nano-foam is maintained without aggregation due to the improvement in the crosslinking density of the polybenzoxazole resin. The permittivity of the interlayer insulation film can be decreased due to the above effect.

1. Benzoxazole Resin Precursor Comprising the First Repeating Unit 1-1 Bisaminophenol Compound Having the Diamondoid Structure The bisaminophenol compound having the diamondoid structure is a compound having a unit structure of the diamondoid in the molecule.

1-1-1 Bisaminophenol Compound Having the Diamondoid Structure

Examples of the above bisaminophenol compound include compounds having the smallest unit of the diamondoid structure such as bis(3-amino-4-hydroxylphenyl)adamantane, bis (3-hydroxy-4-amino-phenyl)adamantane, bis(3-amino-4-hydroxyphenoxy)adamantane and bis(4-amino-3-hydroxyphenoxyphenyl)adamantane; compounds having a polycyclic skeleton structure of the diamondoid structure such as bis(3-amino-4-hydroxyphenyl)diamantane, bis(3-hydroxy-4-aminophenyl)-diamantane, bis(3-amino-4-hydroxyphenyl)trimantane, bis(3-hydroxy-4-aminophenyl)trimantane, bis(3-amino-4-hydroxyphenyl)tetramantane, bis(3-hydroxy-4-aminophenyl)tetramantane, bis(3-amino-4-hydroxy-phenyl)heptamantane, bis(3-hydroxy-4-aminophenyl)heptamantane, bis(3-amino-4-hydroxyphenyl) hexamantane, bis(3-hydroxy-4-amino-phenyl)hexamantane, bis(3-amino-4-hydroxyphenoxy)diamantane, bis(3-hydroxy-4-aminophenoxy)diamantane, bis(3-amino-4-hydroxyphenoxy)-trimantane, bis(3-hydroxy-4-aminophenoxy)trimantane, bis(3-amino-4-hydroxyphenoxy)tetramantane, bis(3-hydroxy-4-aminophenoxy)-tetramantane, bis(3-amino-4-hydroxyphenoxy)heptamantane, bis(3-hydroxy-4-aminophenoxy)heptamantane, bis(3-amino-4-hydroxyphenoxy)-hexamantane, bis(3-hydroxy-4-aminophenoxy)hexamantane, bis(3-amino-4-hydroxyphenoxyphenyl)diamantane, bis(3-hydroxy-4-aminophenoxy-phenyl)diamantane, bis(3-amino-4-hydroxyphenoxyphenyl)trimantane, bis(3-hydroxy-4-aminophenoxyphenyl)triamantane, bis(3-amino-4-hydroxyphenoxyphenyl)tetramantane, bis(3-hydroxy-4-aminophenoxy phenyl)tetramantane, bis(3-amino-4-hydroxyphenoxyphenyl)hepta-mantane, bis(3-hydroxy-4-aminophenoxyphenyl)heptamantane, bis(3-amino-4-hydroxyphenoxyphenyl)hexamantane and bis(3-hydroxy-4-aminophenoxyphenyl)hexamantane; compounds having an oligo-adamantane structure and compounds having a polyadamantane structure having a still greater number of the adamantyl groups such as bis(3-amino-4-hydroxyphenyl)biadamantane, bis(3-hydroxy-4-amino-phenyl)biadamantane, bis(3-amino-4-hydroxyphenyl)triadamantane, bis(3-hydroxy-4-aminophenyl)triadamantane, bis(3-amino-4-hydroxy-phenyl)tetraadamantane, bis(3-hydroxy-4-aminophenyl)tetraadamantane, bis(3-amino-4-hydroxyphenyl)heptaadamantane, bis(3-hydroxy-4-amino-phenyl)heptaadamantane, bis(3-amino-4-hydroxyphenyl)hexaadamantane, bis(3-hydroxy-4-aminophenyl)hexaadamantane, bis(3-amino-4-hydroxy-phenoxy)biadamantane, bis(3-hydroxy-4-aminophenoxy)biadamantane, bis(3-amino-4-hydroxyphenoxy)triadamantane, bis(3-hydroxy-4-amino-phenoxy)triadamantane, bis(3-amino-4-hydroxyphenoxy)tetraadamantane, bis(3-hydroxy-4-aminophenoxy)tetraadamantane, bis(3-amino-4-hydroxy-phenoxy)heptaadamantane, bis(3-hydroxy-4-aminophenoxy)hepta-adamantane, bis(3-amino-4-hydroxyphenoxy)hexaadamantane, bis(3-hydroxy-4-aminophenoxy)hexaadamantane, bis(3-amino-4-hydroxy-phenoxyphenyl)biadamantane, bis(3-hydroxy-4-aminophenoxyphenyl)biadamantane, bis(3-amino-4-hydroxyphenoxyphenyl)triadamantane, bis(3-hydroxy-4-aminophenoxyphenyl)triadamantane, bis(3-amino-4-hydroxy-phenoxyphenyl)tetraadamantane, bis(3-hydroxy-4-aminophenoxyphenyl)-tetraadamantane, bis(3-amino-4-hydroxyphenoxyphenyl)hepta-adamantane, bis(3-hydroxy-4-aminophenoxyphenyl)heptaadamantane, bis(3-amino-4-hydroxyphenoxyphenyl)hexaadamantane and bis(3-hydroxy-4-aminophenoxyphenyl)hexaadamantane; compounds having the diamondoid structure in the main chain which may have the diamondoid structure in side chains such as 3,3'-bis[4-(4-amino-3-hydroxy-6-adamantylphenoxy)phenyl]-1,1'-biadamantane, 3,3'-bis[4-(4-amino-3-hydroxy-6-(3-adamantyladamantyl)phenoxy)phenyl]-1,1'-biadamantane and 3,3'-bis[4-(4-amino-3-hydroxy-6-tetramantylphenoxy)phenyl]-1,1'-biadamantane. However, the above bisaminophenol compound is not limited to the compounds described above as the examples. Further examples of the above bisaminophenol compound include bisaminophenols having pentamantyl group, hexamantyl group, heptamantyl group, octamantyl group, nonamantyl group, decamantyl group, undecamantyl group, pentaadamantyl group, hexaadamantyl group, heptaadamantyl group, octaadamantyl group, nonaadamantyl group, decaadamantyl group or undecamantyl group.

Examples of the compound having an oligo structure having a plurality of the above polycyclic skeleton structure include 6,6'-bis(3-amino-4-hydroxylphenyl)-1,1'-bi(diamantane), 6,6'-bis(3-amino-4-hydroxyphenoxy)-1,1'-bi(diamantane) and 6,6'-bis[4-(3-hydroxy-4-aminophenoxy)phenyl]-1,1'-bi(diamantane). However, the above compound is not limited to the compounds described above as the examples as long as the compound has the structure in agreement with the definition of the diamondoid structure. The position of bonding of the group having the polycyclic skeleton structure is not limited to those described above as the examples.

To the group having the adamantane structure in the bisphenol compound, alkyl groups such as methyl group, ethyl group, n-propyl group, isopropyl group, n-butyl group, isobutyl group and tert-butyl group and fluoroalkyl groups such as fluoromethyl group, fluoroethyl group, fluoropropyl group and fluorobutyl group may be bonded. Examples of such compounds include 3,3'-bis(3-amino-4-hydroxyphenyl)-(5,5',7,7'-tetramethyl)-1,1'-biadamantane, 3,3'-bis[4-(4-amino-3-hydroxyphenoxy)phenyl]-(5,5',7,7'-tetramethyl)-1,1'-biadamantane, 3,3'-bis[4-(4-amino-3-hydroxy-6-(3,5-dimethyladamantyl)phenoxy)-phenyl]-(5,5',7,7'-tetramethyl)-1,1'-biadamantane and 3,3'-bis(3-amino-4-hydroxyphenyl)-(5,5'-dibutyl)-1,1'-biadamantane. However, the above compound is not limited to the compounds described above as the examples.

The bisaminophenol compound may be used singly or in combination of two or more.

As the process for introducing the diamondoid structure into a bisaminophenol compound, for example, bis(3-amino-4-hydroxyphenyl)-1,3-adamantane can be synthesized by synthesizing bis(4-hydroxyphenyl)-1,3-adamantane from dibromoadamantane and phenol in accordance with the Friedel-Crafts reaction, followed by nitration at the ortho-position of hydroxyl group and then reduction of the formed nitro group into amino group; and bis[4-(4-amino-3-hydroxyphenoxy)phenyl]-1,3-adamantane can be synthesized from bis(4-hydroxyphenyl)-1,3-adamantane and 4-nitro-3-benzyloxy-1-fluorobenzene in accordance with the etherification reaction, followed by removal of protection with benzyloxy group and reduction of nitro group.

1-1-2 Bisaminophenol Compound Having the Diamondoid Structure Bonded to a Functional Group Other than the Diamondoid Structure Examples of the bisaminophenol compound having the diamondoid structure via ethynyl group among the above bisaminophenol compounds include bisaminophenol compounds having ethynyl(phenylethynyl)-binaphthalene such as 2,2'-bis(3-hydroxy-4-aminophenoxy)-6,6'-bisadamantylethynyl-1,1'-binaphthalene and 2,2'-bis(3-hydroxy-4-aminophenoxy)-6,6'-bisdiamantylethynyl-1,1'-binaphthalene; bisaminophenol compounds having ethynylnaphthalene such as 1,5-bis(3-hydroxy-4-aminophenoxy)-2,6-bisadamantylethynylnaphthalene, 1,5-bis(3-hydroxy-4-aminophenoxy)-2,6-bisdiamantylethynylnaphthalene, 1,5-bis(3-hydroxy-4-aminophenoxy)-2-adamantylethynylnaphthalene and 1,5-bis(3-hydroxy-4-aminophenoxy)-3-adamantylethynyl-naphthalene; bisaminophenol compounds having ethynylfluorene such as 9,9-bis-4-(3-hydroxy-4-aminophenoxy)phenyl-2,7-bisadamantylethynylfluorene, 9,9-bis-4-(3-hydroxy-4-aminophenoxy)phenyl-2,7-bisdiamantylethynylfluorene, 9,9-bis-4-(3-amino-4-hydroxyphenyl)-2,7-bisadamantylethynylfluorene and 9,9-bis-4-(3-amino-4-hydroxyphenyl)-2,7-bisdiamantylethynylfluorene; bis-aminophenol compounds having ethynylbenzene such as 1,3-bis(3-hydroxy-4-aminophenoxy)-4-adamantylethynylbenzene, 1,3-bis(3-hydroxy-4-aminophenoxy)-4-diamantylethynylbenzene, 1,4-bis(3-hydroxy-4-amino-phenoxy)-3-adamantylethynylbenzene and 1,4-bis(3-hydroxy-4-amino-phenoxy)-3-diamantylethynylbenzene; bisaminophenol compounds having ethynyldiphenyl ether such as 3,3'-diamino-4,4'-dihydroxy-2-adamantyl-ethynyldiphenyl ether, 3,3'-diamino-4,4'-dihydroxy-5-diamantylethynyl-diphenyl ether and 3,3'-diamino-4,4'-dihydroxy-6-triamantylethynyldiphenyl ether; bisaminophenol compounds having ethynylbiphenyl such as 3,3'-diamino-4,4'-dihydroxy-2-adamantyl-ethynylbiphenyl, 3,3'-diamino-4,4'-dihydroxy-5-diamantyl-ethynylbiphenyl and 3,3'-diamino-4,4'-dihydroxy-6-triamantylethynylbiphenyl; bisaminophenol compounds having ethynyldiphenyl sulfone such as 3,3'-diamino-4,4'-dihydroxy-6,6'-bisadamantylethynyldiphenyl sulfone, 3,3'-dihydroxy-4,4'-diamino-6,6'-bisdiamantylethynyldiphenyl sulfone and 3,3'-diamino-4,4'-dihydroxy-2,2'-bistriamantylethynyldiphenyl sulfone; bisaminophenol compounds having ethynylphenylpropane such as 2,2-bis(3-amino-4-hydroxy-6-adamantylethynylphenyl)propane, 2,2-bis(3-amino-4-hydroxy-6-di-amantylethynylphenyl)propane, 2,2-bis(3-hydroxy-4-amino-6-triamantyl-ethynylphenyl)propane and 2,2-bis(3-amino-4-hydroxy-2-tetramantyl-ethynylphenyl)propane; and bisaminophenol compounds having ethynylphenylhexafluoropropane such as 2,2-bis(3-amino-4-hydroxy-6-adamantylethynylphenyl)hexafluoropropane, 2,2-bis(3-amino-4-hydroxy-6-diamantylethynylphenyl)hexafluoropropane, 2,2-bis(3-hydroxy-4-amino-6-triamantyl-ethynylphenyl)hexafluoropropane and 2,2-bis(3-amino-4-hydroxy-2-tetramantylethynylphenyl)hexafluoropropane. However, the above compound is not limited to the compounds described above as the examples. Further examples include bisaminophenol compounds in which a group such as those shown in the following is bonded to ethynyl group: pentamantyl group, hexamantyl group, heptamantyl group, octamantyl group, nonamantyl group, decamantyl group, undecamantyl group, pentaadamantyl group, hexaadamantyl group, heptaadamantyl group, octaadamantyl group, nonaadamantyl group, decaadamantyl group, undecamantyl group, adamantylphenyl group, diamantylphenyl group, triamantylphenyl group, tetramantylphenyl group, pentamantylphenyl group, hexamantylphenyl group, heptamantylphenyl group, hepta-mantylphenyl group, octamantylphenyl group, nonamantylphenyl group, decamantylphenyl group, undecamantylphenyl group, biadamantylphenyl group, triadamantylphenyl group, tetraadamantylphenyl group, pentaadamantylphenyl group, hexaadamantylphenyl group, heptaadamantyl-phenyl group, octaadamantylphenyl group, nonaadamantylphenyl group, decaadamantylphenyl group, undecaadamantylphenyl group, adamantyl-phenoxyphenyl group, diamantylphenoxyphenyl group, triamantyl-phenoxylphenyl group, tetramantylphenoxyphenyl group, pentamantyl-phenoxyphenyl group, hexamantylphenoxyphenyl group, heptamantyl-phenoxyphenyl group, heptamantylphenoxyphenyl group, octamantyl-phenoxyphenyl group, nonamantylphenoxyphenyl group, decamantyl-phenoxyphenyl group, undecamantylphenoxyphenyl group, biadamantyl-phenoxyphenyl group, triadamantylphenoxyphenyl group, tetra-adamantylphenoxyphenyl group, pentaadamantylphenoxyphenyl group, hexaadamantylphenoxyphenyl group, heptaadamantylphenoxyphenyl group, octaadamantylphenoxyphenyl group, nonaadamantylphenoxy-phenyl group, decaadamantylphenoxyphenyl group, and undeca-adamantylphenoxyphenyl group. The bisaminophenol compound may be used singly or in combination of two or more.

To the group having the adamantane structure in the bisphenol compound, alkyl groups such as methyl group, ethyl group, n-propyl group, isopropyl group, n-butyl group, isobutyl group and tert-butyl group and fluoroalkyl groups such as fluoromethyl group, fluoroethyl group, fluoropropyl group and fluorobutyl group may be bonded.

Examples of the process for introducing the functional group having the diamondoid structure include the coupling reaction between 1-ethynyladamantane and a halogenated compound in the case of the ethynyl group having the diamondoid structure. Specifically, the coupling reaction between a halogenated compound having the ortho-hydroxynitrobenzene structure and ethynyladamantane is conducted as the basic reaction, and adamantylethynyl group can be introduced into the bisaminophenol compound by the amination reaction without reduction of the acetylene bond by selecting the most suitable catalyst.

1-2 Bisaminophenol Compound Having No Diamondoid Structure 1-2-1 Bisaminophenol Compound Having a Functional Group Other than the Diamondoid Structure Examples of the bisaminophenol compound having a functional group other than the diamondoid structure include bisaminophenol compounds having ethynyl(phenylethynyl) binaphthalene such as 2,2'-bis(3-hydroxy-4-aminophenoxy)-6,6'-bisethynyl-1,1'-binaphthalene and 2,2'-bis(3-hydroxy-4-aminophenoxy)-6,6'-bisphenylethynyl-1,1'-binaphthalene; bisaminophenol compounds having ethynyl(phenylethynyl)-naphthalene such as 1,5-bis(3-hydroxy-4-aminophenoxy)-2,6-bisethynyl-naphthalene, 1,5-bis(3-hydroxy-4-aminophenoxy)-2,6-bisphenylethynyl-naphthalene, 1,5-bis(3-hydroxy-4-aminophenoxy)-2-phenylethynyl-naphthalene and 1,5-bis(3-hydroxy-4-aminophenoxy)-3-phenylethynyl-naphthalene; bisaminophenol compounds having ethynyl (phenylethynyl)-fluorene such as 9,9-bis-4-(3-hydroxy-4-aminophenoxy)phenyl-2,7-bisethynylfluorene, 9,9-bis-4-(3-hydroxy-4-aminophenoxy)phenyl-2,7-bis-phenylethynylfluorene, 9,9-bis-4-(3-amino-4-hydroxyphenyl)-2,7-bis-ethynylfluorene and 9,9-bis(3-amino-4-hydroxyphenyl)-2,7-bisphenyl-ethynylfluorene; bisaminophenol compounds having ethynyl(phenyl-ethynyl)benzene such as 1,3-bis(3-hydroxy-4-aminophenoxy)-4-ethynyl-benzene, 1,3-bis(3-hydroxy-4-aminophenoxy)-4-phenylethynylbenzene, 1,4-bis(3-hydroxy-4-aminophenoxy)-3-ethynylbenzene and 1,4-bis(3-hydroxy-4-aminophenoxy)-3-phenylethynylbenzene; bisaminophenol compounds having ethynyl(phenylethynyl) diphenyl ether such as 3,3'-diamino-4,4'-dihydroxy-2-phenylethynyldiphenyl ether, 3,3'-diamino-4,4'-dihydroxy-5-phenylethynyldiphenyl ether and 3,3'-diamino-4,4'-dihydroxy-6-phenylethynyldiphenyl ether; bisaminophenol compounds having ethynyl(phenylethynyl)biphenyl such as 3,3'-diamino-4,4'-dihydroxy-2-phenylethynylbiphenyl, 3,3'-diamino-4,4'-dihydroxy-5-phenyl-ethynylbiphenyl and 3,3'-diamino-4,4'-dihydroxy-6-phenylethynyl-biphenyl; bisaminophenol compounds having ethynyl(phenylethynyl)-diphenyl sulfone such as 3,3'-diamino-4,4'-dihydroxy-6,6'-diphenyl-ethynyldiphenyl sulfone, 3,3'-dihydroxy-4,4'-diamino-6,6'-diphenylethynyl-diphenyl sulfone and 3,3'-diamino-4,4'-dihydroxy-2,2'-diphenylethynyl-diphenyl sulfone; bisaminophenol compounds having ethynyl-(phenylethynyl)phenylpropane such as 2,2-bis(3-amino-4-hydroxy-6-ethynylphenyl)propane, 2,2-bis(3-amino-4-hydroxy-6-phenylethynyl-phenyl)propane, 2,2-bis(3-hydroxy-4-amino-6-phenylethynylphenyl)-propane and 2,2-bis(3-amino-4-hydroxy-2-phenylethynylphenyl)propane; and bisaminophenol compounds having ethynyl(phenylethynyl) phenyl-hexafluoropropane such as 2,2-bis(3-amino-4-hydroxy-6-ethynylphenyl)-hexafluoropropane, 2,2-bis(3-amino-4-hydroxy-6-phenylethynylphenyl)-hexafluoropropane, 2,2-bis(3-hydroxy-4-amino-6-phenylethynylphenyl)-hexafluoropropane and 2,2-bis(3-amino-4-hydroxy-2-phenylethynyl-phenyl)hexafluoropropane. The above compound may be used singly or in combination of two or more.

Among the above compounds, at least one bisaminophenol compound having a functional group selected from bisaminophenol compounds having ethynyl(phenylethynyl)naphthalene and bisamino-phenol compounds having ethynyl (phenylethynyl)fluorene are preferable. When the above compound is used, the modulus of the polybenzoxazole resin at high temperatures can be increased.

As the process for introducing the functional group other than the diamondoid structure into the bisaminophenol compound, for example, the coupling reaction can be applied to a halogenated compound. Specifically, the coupling reaction of a halogenated compound having the structure of ortho-hydroxynitrobenzene and ethynylbenzene is used as the basic reaction, and the functional group can be introduced into the bisaminophenol compound by the amination reaction without reduction of the acetylene bond by selecting the most suitable catalyst.

1-2-2 Bisaminophenol Compound Having No Diamondoid Structure and No Functional Group Other than the Diamondoid Structure Examples of the bisaminophenol compound having no diamondoid structure and no functional group other than the diamondoid structure include compounds having a dihydroxybenzene such as 3,4-diamino-resorcinol and 2,5-diamino-1,4-dihydroxybenzene; compounds having dihydroxybiphenyl such as 3,3'-diamino-4,4'-dihydroxybiphenyl and 3,3'-dihydroxy-4,4'-diaminobiphenyl; bisaminophenol compounds having dihydroxydiphenyl ether such as 3,3'-diamino-4,4'-dihydroxydiphenyl ether; compounds having the skeleton structure of fluorene such as 9,9-bis(3-amino-4-hydroxyphenyl)fluorene and 9,9-bis(4-(4-amino-3-hydroxy)phenoxyphenyl)fluorene; compounds having the skeleton structure of binaphthalene such as 2,2'-bis(4-amino-3-hydroxyphenoxy)-1,1'-binaphthalene; compounds having sulfone group such as 3,3'-diamino-4,4'-dihydroxydiphenyl sulfone, bis(4-(4-amino-3-hydroxy)phenoxyphenyl)sulfone and bis(4-(4-hydroxy-3-amino)phenoxyphenyl)sulfone; and compounds having fluorine or a fluoroalkyl group such as 2,2-bis(3-amino-4-hydroxyphenyl)hexafluoropropane. The above bisaminophenol compound may be used singly or in combination of two or more.

Among the above compounds, at least one bisaminophenol compound selected from the compounds having dihydroxybenzene, the compounds having dihydroxydiphenyl ether, the compounds having the skeleton structure of fluorene and the compounds having the skeleton structure of binaphthalene is preferable.

1-3 Dicarboxylic Acid Having the Diamondoid Structure

The dicarboxylic acid having the diamondoid structure is a dicarboxylic acid having a unit structure of the diamondoid structure described above in the molecule and is not particularly limited. When this compound is used, the modulus of the polybenzoxazole resin can be further increased.

1-3-1 Dicarboxylic Acid Having the Diamondoid Structure

Examples of the dicarboxylic acid having the diamondoid structure and no functional group other than the diamondoid structure include adamantanedicarboxylic acids such as 1,3-adamantanedicarboxylic acid, 2,2-adamantanedicarboxylic acid and 1,2-adamantanedicarboxylic acid; diamantanedicarboxylic acids such as 1,6-diamantanedicarboxylic acid, 4,9-diamantanedicarboxylic acid and 2,2-diamantanedicarboxylic acid; triamantanedicarboxylic acids such as 1,3-triamantanedicarboxylic acid and 1,6-triamantanedicarboxylic acid; tetramantanedicarboxylic acids such as 1,3-tetramantanedicarboxylic acid, 1,6-tetramantanedicarboxylic acid and 1,8-tetramantanedicarboxylic acid; biadamantanedicarboxylic acids such as 3,3'-(1,1'-biadamantane)dicarboxylic acid, 3,5-(1,1'-biadamantane)dicarboxylic acid, 2,2-(1,1'-biadamantane)dicarboxylic acid, 2,2'-(1,1'-biadamantane)dicarboxylic acid and 2,5-(1,1'-biadamantane)-dicarboxylic acid; triadamantanedicarboxylic acids such as 1,3"-(1,1',1"-triadamantane)dicarboxylic acid, 2,2-(1,1',1"-triadamantane)dicarboxylic acid, 2',2'-(1,1',1"-triadamantane)dicarboxylic acid, 3,5-(1,1',1"-tri-adamantane)dicarboxylic acid, 3',5'-(1,1',1"-triadamantane)dicarboxylic acid and 3',5"-(1,1',1"-triadamantane)dicarboxylic acid; bisbenzoic acids having a polycyclic skeleton structure of the diamondoid structure such as 1,3-bis(4-carboxyphenyl)adamantane, 1,3-bis(3-carboxyphenyl)-adamantane, 1,3-bis(2-carboxyphenyl)adamantane, bis(4-carboxyphenyl)-diamantane, bis(3-carboxyphenyl)diamantane, bis(2-carboxyphenyl)-diamantane, bis(4-carboxyphenyl)triamantane, bis(3-carboxyphenyl)-triamantane, bis(2 carboxyphenyl)triamantane, bis(4-carboxyphenyl)-tetraamantane, bis(3-carboxyphenyl)tetraamantane, bis(2-carboxy-phenyl)tetraamantane, 3-bis(4-carboxyphenoxy)adamantane, 1,3-bis(3-carboxyphenoxy)adamantane, 1,3-bis(2-carboxyphenoxy)adamantane, bis(4-carboxyphenoxy)diamantane, bis(3-carboxyphenoxy)diamantane, bis(2-carboxyphenoxy)diamantane, bis(4-carboxyphenoxy)triamantane, bis(3-carboxyphenoxy)triamantane, bis(2-carboxyphenoxy)triamantane, bis(4-carboxyphenoxy)tetraamantane, bis(3-carboxyphenoxy)tetra-amantane, bis(2-carboxyphenoxy)tetraamantane, 1,3-bis(4-carboxyphenoxyphenyl)adamantane, 1,3-bis(3-carboxyphenoxyphenyl)-adamantane, 1,3-bis(2-carboxyphenoxyohenyl)adamantane, bis(4-carboxyphenoxyphenyl)diamantane, bis(3-carboxyphenoxyphenyl)diamantane, bis(2-carboxyphenoxyphenyl)dibiamantane, bis(4-carboxyphenoxyphenyl)-triamantane, bis(3-carboxyphenoxyphenyl)triamantane, bis(2-carboxyphenoxyphenyl)triamantane, bis(4-carboxyphenoxyphenyl)tetraamantane, bis(3-carboxyphenoxyphenyl)tetraamantane and bis(2-carboxyphenoxy-phenyl)tetraamantane; bisbenzoic acids having the diamondoid structure having a greater number of oligo-adamantane structures and adamantyl groups such as bis(4-carboxyphenyl)-1,1'-biadamantane, bis(3-carboxy-phenyl)-1,1'-biadamantane, bis(2-carboxyphenyl)-1,1'-biadamantane, bis(4-carboxyphenyl)-1,1',1"-triadamantane, bis(3-carboxyphenyl)-1,1',1"-triadamantane, bis(2-carboxyphenyl)-1,1',1"-triadamantane bis(4-carboxyphenyl)-1,1',1',1"-tetraadamantane, bis(3-carboxyphenyl)-1,1',1"',1'''-tetraadamantane, bis(2-carboxyphenyl)-1,1',1",1'''-tetraadamantane, bis(4-carboxyphenoxy)-1,1'-biadamantane, bis(3-carboxyphenoxy)-1,1'-bi-adamantane, bis(2-carboxyphenoxy)-1,1'-biadamantane, bis(4-carboxyphenoxy)-1,1',1"-triadamantane, bis(3-carboxyphenoxy)-1,1',1"-tri-adamantane, bis(2-carboxyphenoxy)-1,1',1"-triadamantane, bis(4-carboxy-phenoxy)-1,1',1",1'''-tetraadamantane, bis(3-carboxyphenoxy)-1,1',1",1'''-tetraadamantane, bis(2-carboxyphenoxy)-1,1',1",1'''-tetraadamantane, bis(4-carboxyphenoxyphenyl)-1,1'-biadamantane, bis(3-carboxyphenoxy-phenyl)-1,1'-biadamantane, bis(2-carboxyphenoxyphenyl)-1,1'-bi-adamantane, bis(4-carboxylphenoxyphenyl)-1,1',1"-triadamantane, bis(3-carboxylphenoxyphenyl)-1,1',1"-triadamantane, bis(2-carboxylphenoxy-phenyl)-1,1',1"-triadamantane, bis(4-carboxyphenoxyphenyl)-1,1',1",1'''-tetraadamantane, bis(3-carboxyphenoxyphenyl)-1,1',1",1''',-tetra-adamantane and bis(2-carboxyphenoxyphenyl)-1,1',1",1'''-tetra-adamantane; and compounds having the diamondoid structure at the main chain which may have the diamondoid structure at side chains such as 3,3'-bis[4-(3-carboxy-6-adamantylphenoxy)phenyl]-1,1'-biadamantane, 3,3'-bis[4-(3-carboxy-6-(3-adamantyladamantyl)phenoxy) phenyl]-1,1'-biadamantane and 3,3'-bis[4-(4-carboxy-6-tetramantylphenoxy)phenyl]-1,1'-biadamantane. However, the above compound is not limited to the compounds described above as the examples. Further examples include dicarboxylic acids having pentamantyl group, hexamantyl group, heptamantyl group, octamantyl group, nonamantyl group, decamantyl group, undecamantyl group, hexaadamantyl group, pentaadamantyl group, hexaadamantyl group, heptaadamantyl group, octaadamantyl group, nonaadamantyl group, decaadamantyl group and undecamantyl group. Examples of the compound having an oligo structure having a plurality of groups having a polycyclic skeleton structure described above include 1,1'-bi(diamantane)-6,6'-dicarboxylic acid, 6,6'-bis(4-carboxy-phenyl)-1,1'-bi(diamantane), 6,6'-bis(4-carboxyphenoxy)-1,1'-bi-(diamantane) and 6,6'-bis[4-(4-carboxyphenoxy)phenyl]-1,1'-bi-(diamantane). However, the above compound is not limited to the compounds described as the examples as long as the compound has the structure in agreement with the definition of the diamondoid structure. The position of bonding of the group having a polycyclic structure is not particularly limited.

To the group having the adamantane structure in the dicarboxylic acid, alkyl groups such as methyl group, ethyl group, n-propyl group, isopropyl group, n-butyl group, isobutyl group and tert-butyl group and fluoroalkyl groups such as fluoromethyl group, fluoroethyl group, fluoropropyl group and fluorobutyl group may be bonded. Examples of such compounds include 3,3'-(5,5',7,7'-tetramethyl-1,1'-biadamantane)-dicarboxylic acid, 3,3'-(5,5',7,7'-tetraethyl-1,1'-biadamantane)dicarboxylic acid, 3,3'-(5,5',7,7'-tetrabutyl-1,1'-biadamantane)dicarboxylic acid, 3,3'-(5,5'-dimethyl-1,1'-biadamantane)dicarboxylic acid, 3,3'-(5,5'-diethyl-1,1'-biadamantane)dicarboxylic acid, 3,3'-(5,5'-dibutyl-1,1'-biadamantane)-dicarboxylic acid, 3,3'-bis(4-carboxyphenyl) (5,5',7,7'-tetramethyl)-1,1'-biadamantane, 3,3'-bis[4-(4-carboxyphenoxy)phenyl]-(5,5',7,7')-1,1'-bi-adamantane, 3,3'-bis[4-(4-carboxy-6-(3,5-dimethyladamantyl)phenoxy)-phenyl]-(5,5',7,7'-tetramethyl)biadamantane and 3,3'-bis(3-amino-4-hydroxyphenyl)(5,5''-dibutyl)-1,1'-biadamantane. However, the above compound is not limited to the compounds described above as the examples.

The above dicarboxylic acid may be used singly or in combination of two or more.

As the process for introducing the functional group having the diamondoid structure into the above dicarboxylic acid compound, for example, bis(4-bromophenyl)-1,3-adamantane is synthesized from dibromoadamantane and bromobenzene in accordance with the Friedel-Crafts reaction, and bis (4-carboxyphenyl)-1,3-adamantane can be synthesized by converting the bromine group into an anion with an alkyllithium, followed by treating with carbon dioxide gas and an acid; and bis[4-(4-carboxyphenoxy)phenyl]-1,3-adamantane can be synthesized by etherification of bis(4-hydroxyphenyl)-1,3-adamantane and methyl 4-bromobenzoate, followed by removal of the ester with reduction.

1-3-2 Dicarboxylic Acid Having the Diamondoid Structure in a Functional Group Other than the Diamondoid Structure Examples of the dicarboxylic acid having the diamondoid structure via ethynyl group among the above dicarboxylic acids include ethynylphthalic acids examples of which include ethynylphthalic acids such as 3-adamantylethynylphthalic acid and 4-amantylethynylphthalic acid, ethynylisophthalic acids such as 5-amantylethynylisophthalic acid and ethynylterephthalic acids such as 2-amantylethynylterephthalic acid and 3-amantylethynylterephthalic acid; ethynylnaphthalenedicarboxylic acids such as 2-amantylethynyl-1,5-naphthalenedicarboxylic acid and 3-amantylethynyl-1,5-naphthalenedicarboxylic acid; diethynylbiphenyl-dicarboxylic acids such as 4,4'-bisadamantylethynyl-2,2'-biphenyl-dicarboxylic acid and 5,5'-bisamantylethynyl-2,2'-biphenyldicarboxylic acid; bis(carboxyethynylphenyl) propanes such as 2,2-bis(2-carboxy-3-amantylethynylphenyl)propane and 2,2-bis(2-carboxy-4-amantylethynyl-phenyl)propane; bis(carboxyethynylphenyl) hexafluoropropanes such as 2,2-bis(2-carboxy-4-amantylethynylphenyl)hexafluoropropane and 2,2-bis-(3-carboxy-5-amantylethynylphenyl)hexafluoropropane; 4-adamantyl-ethynyl-1,3-dicarboxycyclopropane; 5-amantylethynyl-2,2-dicarboxycyclo-propane; structural isomers of 1,3-bis(4-carboxyphenoxy)-5-adamantylethynylbenzene; structural isomers of 1,3-bis(4-carboxyphenyl)-5-adamantylethynylbenzene; and (ethynylphenoxy)phthalic acids, examples of which include (ethynylphenoxy)isophthalic acids such as 5-(3-adamantylethynylphenoxy)isophthalic acid and (ethynylphenoxy)-terephthalic acids such as 2-(1-adamantylethynylphenoxy)terephthalic acid. The portion of the adamantylethynyl group in the above dicarboxylic acids may be a group such as diamantylethynyl group, triamantylethynyl group, tetramantylethynyl group, pentamantylethynyl group, hexamantylethynyl group, heptamantylethynyl group, octamantyl-ethynyl group, nonamantylethynyl group, decamantylethynyl group and undecamantylethynyl group; a group such as biadamantylethynyl group, triadamantylethynyl group, tetraadamantylethynyl group, penta-adamantylethynyl group, hexaadamantylethynyl group, heptaadamantyl-ethynyl group, octaadamantylethynyl group, nonaadamantylethynyl group, decaadamantylethynyl group and undecaadamantylethynyl group; a group such as adamantylphenylethynyl group, diamantylphenylethynyl group, triamantylphenylethynyl group, tetramantylphenylethynyl group, pentamantylphenylethynyl group, hexamantylphenylethynyl group, heptamantylphenylethynyl group, octamantylphenylethynyl group, nonamantylphenylethynyl group, decamantylphenylethynyl group and undecamantylphenylethynyl group; a group such as biadamantylphenyl-ethynyl group, triadamantylphenylethynyl group, tetraadamantylphenyl-ethynyl group, pentaadamantylphenylethynyl group, hexaadamantyl-phenylethynyl group, heptaadamantylphenylethynyl group, octa-adamantylphenylethynyl group, nonaadamantylphenylethynyl group, decaadamantylphenylethynyl group and undecaadamantylphenylethynyl group; a group such as adamantylphenoxyphenylethynyl group, diamantylphenoxyphenylethynyl group, triamantylphenoxyphenylethynyl group, tetramantylphenoxyphenylethynyl group, pentamantylphenoxy-phenylethynyl group, hexamantylphenoxyphenylethynyl group, hepta-mantylphenoxyphenylethynyl group, octamantylphenoxyphenylethynyl group, nonamantylphenoxyphenylethynyl group, decamantylphenoxy-phenylethynyl group and undecamantylphenoxyphenylethynyl group; or a group such as biadamantylphenoxyphenylethynyl group, triadamantyl-phenoxyphenylethynyl group, tetraadamantylphenoxyphenylethynyl group, pentaadamantylphenoxyphenylethynyl group, hexaadamantyl-phenoxyphenylethynyl group, heptaadamantylphenoxyphenylethynyl group, octaadamantylphenoxyphenylethynyl group, nonaadamantyl-phenoxyphenylethynyl group, decaadamantylphenoxyphenylethynyl group and undecaadamantylphenoxyphenylethynyl group. Among the above groups, adamantylphenylethynyl group, biadamantylphenylethynyl group, adamantylphenoxyphenylethynyl group and biadamantylphenoxy-phenylethynyl group are preferable.

Compounds in which a carboxylic acid is bonded to the adamantane structure such as 5-phenylethynyladamantane-1,3-dicarboxylic acid, 5-ethynyladamantane-1,3-dicarboxylic acid, 5-phenylethynyl-1,1'-biadamantane-3,3'-dicarboxylic acid and 5-ethynyl-1,1'-biadamantane-3,3'-dicarboxylic acid are also preferable. The dicarboxylic acid may be used singly or in combination of two or more. To the group having the adamantane structure in the above dicarboxylic acids, alkyl groups such as methyl group, ethyl group, n-propyl group, isopropyl group, n-butyl group, isobutyl group and tert-butyl group and fluoroalkyl groups such as fluoromethyl group, fluoroethyl group, fluoropropyl group and fluorobutyl group may be bonded. Among the above groups, dimethyladamantyl-phenylethynyl group, trimethyladamantylphenylethynyl group, tetra-methylbiadamantylphenylethynyl group, pentamethylbiadamantylphenyl-ethynyl group, dimethyladamantylphenylethynyl group, trimethyl-adamantylphenylethynyl group, tetramethylbiadamantylphenoxyphenylethynyl group and pentamethylbiadamantylphenoxyphenylethynyl group are preferable.

1-4 Dicarboxylic Acid Having No Diamondoid Structure 1-4-1 Dicarboxylic Acids Having a Functional Group Other than the Diamondoid Structure Examples of the dicarboxylic acids having a functional group other than the diamondoid structure include dicarboxylic acids having ethynyl group, dicarboxylic acids having phenylethynyl group and other dicarboxylic acids. Examples of the dicarboxylic acid having ethynyl group include ethynylphthalic acids such as 3-ethynylphthalic acid and 4-ethynylphthalic acid; ethynylisophthalic acids such as 4-ethynylisophthalic acid and 5-ethynylisophthalic acid; ethynylterephthalic acids such as 2-ethynylterephthalic acid and 3-ethynylterephthalic acid; ethynylnaphthalenedicarboxylic acids such as 2-ethynyl-1,5-naphthalene-dicarboxylic acid and 3-ethynyl-1,5-naphthalenedicarboxylic acid; diethynylbiphenyldicarboxylic acids such as 4,4'-diethynyl-2,2'-biphenyl-dicarboxylic acid and 5,5'-diethynyl-2,2'-biphenyldicarboxylic acid; bis(carboxyethynylphenyl)propanes such as 2,2-bis(2-carboxy-3-ethynyl-phenyl)propane and 2,2-bis(2-carboxy-4-ethynylphenyl)propane; bis(carboxyethynylphenyl)hexafluoropropanes such as 2,2-bis(2-carboxy-4-ethynylphenyl)hexafluoropropane and 2,2-bis(3-carboxy-5-ethynylphenyl)-hexafluoropropane; 4-ethynyl-1,3-dicarboxycyclopropane; 5-ethynyl-2,2-dicarboxycyclopropane; structural isomers of 1,3-bis(4-carboxyphenoxy)-5-ethynylbenzene; structural isomers of 1,3-bis(4-carboxyphenyl)-5-ethynylbenzene; (ethynylphenoxy)isophthalic acids such as 5-(4-ethynyl-phenoxy)isophthalic acid and 5-(3-ethynylphenoxy)isophthalic acid; (ethynylphenoxy)terephthalic acids such as 2-(1-ethynylphenoxy)terephthalic acid; ethynylphenoxyphthalic acids such as 4-(4-ethynylphenoxy)phthalic acid; (ethynylphenyl)isophthalic acids such as 5-(1-ethynyl-phenyl)isophthalic acid; (ethynylphenyl)terephthalic acids such as 2-(1-ethynylphenyl)terephthalic acid; and ethynylphenylphthalic acids. Examples of the dicarboxylic acid having phenylethynyl group include phenylethynylphthalic acids such as 3-phenylethynylphthalic acid and 4-phenylethynylphthalic acid; phenylethynylisophthalic acids such as 4-phenylethynylisophthalic acid and 5-phenylethynylisophthalic acid; phenylethynylterephthalic acids such as 2-phenylethynylterephthalic acid and 3-phenylethynylterephthalic acid; phenylethynylnaphthalene-dicarboxylic acids such as 2-phenylethynyl-1,5-naphthalenedicarboxylic acid; diphenylethynylbiphenyldicarboxylic acids such as 3,3'-diphenylethynyl-2,2'-biphenyldicarboxylic acid; bis(carboxyphenylethynyl-phenyl)propanes such as 2,2-bis(2-carboxy-3-phenylethynylphenyl)-propane; bis(carboxyphenylethynylphenyl)hexafluoropropanes such as 2,2-bis(2-carboxy-4-phenylethynylphenyl)hexafluoropropane; (phenyl-ethynylphenoxy)isophthalic acids such as 5-(1-phenylethynylphenoxy)-isophthalic acid, 5-(2-phenylethynylphenoxy)isophthalic acid and 5-(3-phenylethynylphenoxy)isophthalic acid; (phenylethynylphenoxy)-terephthalic acids such as 2-(1-phenylethynylphenoxy)terephthalic acid; and (phenylethynylphenoxy)phthalic acids. Examples of the dicarboxylic acids other than the dicarboxylic acids described above include 3-hexynylphthalic acid, 2-hexynylterephthalic acid, 2-hexynyl-1,5-naphthalenedicarboxylic acid, 3,3'-dihexynyl-2,2'-biphenyldicarboxylic acid, 2,2-bis(2-carboxy-3-hexynylphenyl)propane, 2,2-bis(3-carboxy-5-hexynylphenyl)hexafluoropropane, 4-hexynyl-1,3-dicarboxycyclopropane, structural isomers of 1,3-bis(4-carboxyphenoxy)-5-hexynylbenzene, dicarboxylic acids having an alkyl group and ethynyl group such as 5-(3-hexynylphenoxy)isophthalic acid, dicarboxylic acids having the skeleton structure of acetylene in the molecule of tolane such as 4,4'-tolanedicarboxylic acid and 3,4-tolanedicarboxylic acid, and dicarboxylic acids having the skeleton structure of biphenylene such as 1,2-biphenylenedicarboxylic acid and 1,3-biphenylenedicarboxylic acid. The above dicarboxylic acids may be used singly or in combination of two or more. Among the above dicarboxylic acids, at least one dicarboxylic acid selected from ethynylisophthalic acid, (ethynylphenoxy)isophthalic acid, phenylethynylisophthalic acid and (phenylethynylphenoxy)-isophthalic acid is preferable. When the above dicarboxylic acid is used, the crosslinking density of the finally obtained polybenzoxazole resin can be increased.

As the process for introducing the functional group other than the diamondoid structure, for example, the process described in Japanese Patent Application Laid-Open No. 2002-201158 can be used. In accordance with the process, the functional group can be introduced using a halogenated dicarboxylic acid ester or a dicarboxylic acid ester having hydroxyl group. Specifically, phenylethynyldicarboxylic acid can be obtained by obtaining an ester of phenylethynyldicarboxylic acid using a halogenated dicarboxylic acid ester as the starting material in accordance with the coupling reaction with phenylacetylene, followed by removing the ester group by hydrolysis with an alkali.

The above tolanedicarboxylic acid can be obtained, for example, in accordance with a process in which the tolanedicarboxylic acid is synthesized by preparing stilbene from an ester derivative of benzoic acid, followed by preparing the skeleton structure of tolane or a process in which the skeleton structure of tolane is introduced from a benzoic acid ester and a phenylethynyl derivative in accordance with the Heck reaction.

The dicarboxylic acid having the skeleton structure of bephenylene described above can be obtained, for example, in accordance with the process described in Journal of Polymer Science: Polymer Letters Edition, Vol. 16, 653-656 (1978). Specifically, 2,7-biphenylenedicarboxylic acid can be obtained by iodination of dimethyl 4,4'-biphenyldicarboxylate, followed by removal of iodine to obtain a biphenylene compound and, then, removal of the ester.

1-4-2 Dicarboxylic Acid Having No Diamondoid Structure and No Functional Group Other than the Diamondoid Structure Examples of the above dicarboxylic acid include phthalic acids such as isophthalic acid, terephthalic acid, 2-fluoroisophthalic acid and 2,3,5,6-tetrafluoroterephthalic acid; biphenyldicarboxylic acids such as 4,4'-biphenyldicarboxylic acid, 3,4'-biphenyldicarboxylic acid, 3,3'-biphenyldicarboxylic acid, 4,4'-bis(4-carboxyphenoxy)biphenyl and 4,4'-bis(3-carboxyphenoxy)biphenyl; naphthalenedicarboxylic acids such as 1,4-naphthalenedicarboxylic acid, 2,3-naphthalenedicarboxylic acid and 2,6-naphthalenedicarboxylic acid; bisbenzoic acids such as 4,4'-sulfonyl-bisbenzoic acid, 3,4'-sulfonylbisbenzoic acid, 3,3'-sulfonylbisbenzoic acid, 4,4'-oxybisbenzoic acid, 3,4'-oxybisbenzoic acid and 3,3'-oxybisbenzoic acid; biscarboxyphenylpropane(hexafluoropropane) s such as 2,2-bis(4-carboxy-phenyl)propane, 2,2-bis(3-carboxyphenyl)propane, 2,2-bis(4-carboxy-phenyl) hexafluoropropane and 2,2-bis(3-carboxyphenyl) hexafluoro-propane; dicarboxylic acids having the skeleton structure of fluorene such as 9,9-bis(4-(4-carboxyphenoxy) phenyl)fluorene, 9,9-bis(4-(3-carboxy-phenoxy)phenyl) fluorene, 9,9-bis(2-carboxyphenyl)fluorene and 9,9-bis(3-carboxyphenyl)fluorene; and biscarboxyphenylterphenyls such as 4,4'-bis(4-carboxyphenoxy)-p-terphenyl and 4,4'-bis(4-carboxyphenoxy)-m-terphenyl. The above compound may be used singly or in combination of two or more.

1-5 Process for Preparation of a Benzoxazole Resin Precursor Comprising the First Repeating Unit The benzoxazole resin precursor comprising the first repeating unit can be obtained by the reaction of the bisaminophenol compound having the diamondoid structure and the dicarboxylic acid having no diamondoid structure, the reaction of the bisaminophenol compound having no diamondoid structure and the dicarboxylic acid having the diamondoid structure or the reaction of the bisaminophenol compound having the diamondoid structure and the dicarboxylic acid having the diamondoid structure. Examples of the process for the reaction include the acid chloride process. Specifically, the dicarboxylic acid described above and thionyl chloride in an excess amount are brought into reaction with each other in the presence of a catalyst such as N,N'-dimethylformamide at a temperature of the room temperature to about 130° C. After removing thionyl chloride in the excess amount by distillation under a reduced pressure, the obtained residue is recrystallized in a solvent such as hexane, and a dicarboxylic acid chloride is obtained.

The obtained dicarboxylic acid chloride and the bisaminophenol described above are dissolved into a polar solvent such as N-methylpyrrolidone and N,N'-dimethylacetamide. Then, the reaction is allowed to proceed at a temperature of about −30° C. to the room temperature in the presence of an acid acceptor such as pyridine, and the benzoxazole resin precursor comprising the first repeating unit (the benzoxazole resin precursor comprising a functional group at the side chain) can be obtained. The number of repeating of the first repeating unit is not particularly limited. It is preferable that the number of repeating is 2 to 1,000 and more preferably 5 to 100. When the number of repeating is within the above range, excellent solubility and workability are exhibited.

The active ester process may be used in place of the acid chloride process. In accordance with the active ester process, for example, benzotriazyl ester is prepared by the reaction of the dicarboxylic acid chloride described above and 1-hydroxybenzotriazole, and the prepared ester and the bisaminophenol described above can be brought into reaction with each other at a temperature of the room temperature or higher similarly to the above process.

2. Benzoxazole Resin Precursor Comprising the Second Repeating Unit

The benzoxazole resin precursor comprising the first repeating unit described above may further comprise the second repeating unit described above. The second repeating unit can be obtained by the reaction of a bisaminophenol having no diamondoid structure and a dicarboxylic acid having no diamondoid structure.

The benzoxazole resin precursor comprising the second repeating unit described above forms a polybenzoxazole resin having no diamondoid structure.

The first repeating unit and the second repeating unit may form the benzoxazole resin precursor as a copolymer or as a simple mixture. In the case of a copolymer, the copolymer may comprise the first repeating unit and the second repeating unit as any of a random copolymer, an alternating copolymer and a block copolymer.

As the bisaminophenol compound having no diamondoid structure and the dicarboxylic acid compound having no diamondoid structure used for the benzoxazole resin precursor comprising the second repeating unit, the bisaminophenol compound having no diamondoid structure described above in 1-2 and the dicarboxylic acid compound having no diamondoid structure described above in 1-4, which are used for the benzoxazole resin precursor comprising the first repeating unit, can be used.

2-1 Preparation of the Benzoxazole Resin Precursor Comprising the Second Repeating Unit As the reaction of the bisaminophenol having no diamondoid structure and the dicarboxylic acid having no diamondoid structure, the acid chloride process described above can be used. As the result of the reaction, the benzoxazole resin precursor comprising no diamondoid structure at side chains can be obtained.

The number of repeating of the second repeating unit is not particularly limited. It is preferable that the number of repeating is 2 to 1,000 and more preferably 5 to 100. When the number of repeating is within the above range, excellent solubility and workability are exhibited.

The active ester process may be used in place of the acid chloride process. In accordance with the active ester process, for example, benzotriazyl ester is prepared by the reaction of the dicarboxylic acid chloride described above and 1-hydroxybenzotriazole, and the prepared ester and the bisaminophenol described above can be brought into reaction with each other at a temperature of the room temperature or higher similarly to the above process.

3. Benzoxazole Resin Precursor Comprising the Third Repeating Unit

The embodiment of the benzoxazole resin precursor of the present invention which comprises the third repeating unit represented by formula [1] shown above will be described specifically.

The benzoxazole resin precursor comprising the third repeating unit is a benzoxazole resin precursor comprising the diamondoid structure derived from the bisaminophenol compound. When the third repeating unit is present, modulus of the polybenzoxazole resin prepared by using the precursor is increased. Workability in the process for preparing a semiconductor device can be improved by the increase in the modulus.

The number of repeating (k) of the third repeating unit is not particularly limited. It is preferable that the number of repeating is an integer of 2 to 1,000, more preferably an integer of 5 to 600 and most preferably an integer of 10 to 80. When the number of repeating is within the above range, workability in dissolution of the benzoxazole resin precursor in a solvent is excellent.

3-1 Preparation of the Benzoxazole Resin Precursor Comprising the Third Repeating Unit As for the process for obtaining the benzoxazole resin precursor comprising the third repeating unit, the benzoxazole resin precursor can be synthesized by the reaction of a bisaminophenol compound which is represented by formula [18] shown in the following, in which $X_1$ represents a group selected from the groups represented by formulae [2] and [3] shown above, and a dicarboxylic acid compound represented by formula [19] shown in the following, in which $Y_1$ represents a group selected from the groups represented by formulae [4], the groups expressed by formulae [6-1] and [6-2], the groups represented by formulae [7-1] and [7-2] and the groups expressed by formulate [8] and [9]. For example, a combination of the bisaminophenol compound having the diamondoid structure and the dicarboxylic acid having no functional group, a combination of the bisaminophenol compound having the diamondoid structure and the dicarboxylic acid having a functional group other than the diamondoid structure or a combination of the bisaminophenol compound having the diamondoid structure, the dicarboxylic acid having no functional group and the dicarboxylic acid having a functional group other than the diamondoid structure can be brought into reaction with each other in accordance with the acid chloride process described above. The above combination can be selected as desired so that the object property such as the object permittivity can be obtained. For obtaining the resin film having a smaller permittivity, it is preferable that a resin film having fine pores is formed. For this purpose, the combination of the bisaminophenol having the diamondoid structure and the dicarboxylic acid having the functional group is more preferable.

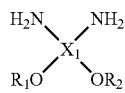
[18]

In formula [18], $R_1$ and $R_2$ each independently represents hydrogen atom or an organic group. Examples of the organic group include alkyl groups having 1 to 20 carbon atoms such as methyl group, ethyl group, n-propyl group, isopropyl group, n-butyl group, t-butyl group, isobutyl group and sec-butyl group, alkyl groups having 1 to 20 carbon atoms bonded via —C(=O)—O— and vinyl groups having 1 to 20 carbon atoms bonded via —(O=)C—.

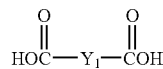
[19]

The active ester process may be used in place of the acid chloride process. In the active ester process, a benzotriazyl ester is prepared by the reaction of the dicarboxylic acid chloride described above and 1-hydroxybenzotriazole, and the obtained ester and the bisaminophenol described above are brought into reaction with each other at a temperature of the room temperature or higher.

4. Benzoxazole Resin Precursor Comprising the Fourth Repeating Unit

The embodiment of the benzoxazole resin precursor of the present invention which comprises the fourth repeating unit represented by formula [10] shown above will be described specifically. It is preferable that the benzoxazole resin precursor comprising the third repeating unit has the fourth repeating unit represented by formula [10] shown above although the benzoxazole resin precursor comprising the third repeating unit is not limited to that having the fourth repeating unit.

The number of repeating (k) of the fourth repeating unit is not particularly limited. It is preferable that the number of repeating is an integer of 2 to 1,000, more preferably an integer of 5 to 600 and most preferably an integer of 10 to 80. When the number of repeating is within the above range, workability in dissolution of the benzoxazole resin precursor in a solvent is excellent.

The third repeating unit and the fourth repeating unit may form the benzoxazole resin precursor as a copolymer or as a simple mixture. In the case of a copolymer, the copolymer may comprise the third repeating unit and the fourth repeating unit as any of a random copolymer, an alternating copolymer and a block copolymer.

4-1 Preparation of the Benzoxazole Resin Precursor Comprising the Fourth Repeating Unit As for the process for obtaining the benzoxazole resin precursor comprising the fourth repeating unit, the benzoxazole resin precursor can be synthesized by the reaction of a bisaminophenol compound which is represented by formula [18] shown above, in which $X_1$ represents a group selected from the groups represented by formulae [2] and [3] shown above, and a dicarboxylic acid compound represented by formula [20] shown, in the following in which $Y_2$ represents a group selected from the groups represented by formulae [11], [12-1] and [12-2]. For example, a combination of the bisaminophenol compound having the diamondoid structure and the dicarboxylic acid having the diamondoid structure can be brought into reaction with each other in accordance with the acid chloride process described above.

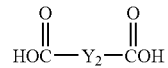
[20]

The active ester process may be used in place of the acid chloride process. In the active ester process, a benzotriazyl ester is prepared by the reaction of the dicarboxylic acid chloride described above and 1-hydroxybenzotriazole, and the obtained ester and the bisaminophenol described above are brought into reaction with each other at a temperature of the room temperature or higher.

5. Benzoxazole Resin Precursor Comprising the Fifth Repeating Unit

The embodiment of the benzoxazole resin precursor of the present invention which comprises the fifth repeating unit represented by formula [13] shown above will be described specifically. It is preferable that the benzoxazole resin precursor comprising the third repeating unit and the fourth repeating unit has the fifth repeating unit represented by formula [13] shown above although the benzoxazole resin precursor comprising the third repeating unit and the fourth repeating unit is not limited to that having the fifth repeating unit.

The number of repeating (m) of the fifth repeating unit is not particularly limited. It is preferable that the number of repeating is an integer of 2 to 1,000, more preferably an integer of 5 to 600 and most preferably an integer of 10 to 80. When the number of repeating is within the above range, workability in dissolution of the benzoxazole resin precursor in a solvent is excellent.

The third repeating unit, the fourth repeating unit and the fifth repeating unit may form the benzoxazole resin precursor as a copolymer or as a simple mixture. In the case of a copolymer, the copolymer may comprise the third repeating unit, the fourth repeating unit and the fifth repeating unit as any of a random copolymer, an alternating copolymer and a block copolymer.

5-1 Preparation of the Benzoxazole Resin Precursor Comprising the Fifth Repeating Unit As for the process for obtaining the benzoxazole resin precursor comprising the fifth repeating unit, the benzoxazole resin precursor can be synthesized by the reaction of a bisaminophenol compound which is represented by formula [21] shown in the following, in which $X_3$ represents a group selected from the groups represented by formulae [14] and [15] shown above, and a dicarboxylic acid compound represented by formula [20] shown in the following, in which $Y_2$ represents a group selected from the groups represented by formulae [11], [12-1] and [12-2]. For example, a combination of the bisaminophenol compound having no diamondoid structure and/or the bisaminophenol compound having a functional group other than the diamondoid structure and the dicarboxylic acid having the diamondoid structure can be brought into reaction with each other in accordance with the acid chloride process described above. The above combination can be selected as desired so that the object property such as the prescribed permittivity can be obtained. For obtaining the resin film having a smaller permittivity, it is preferable that a resin film having fine pores is formed. For this purpose, the combination of the bisaminophenol having a functional group other than the diamondoid structure and the dicarboxylic acid having the diamondoid structure is more preferable.

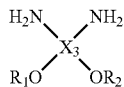

[21]

In formula [21], $R_1$ and $R_2$ each independently represents hydrogen atom or an organic group. Examples of the organic group include alkyl groups having 1 to 20 carbon atoms such as methyl group, ethyl group, n-propyl group, isopropyl group, n-butyl group, t-butyl group, isobutyl group and sec-butyl group, alkyl groups having 1 to 20 carbon atoms bonded via —C(=O)—O— and a vinyl groups having 1 to 20 carbon atoms bonded via —(O=)C—.

The active ester process may be used in place of the acid chloride process. In the active ester process, a benzotriazyl ester is prepared by the reaction of the dicarboxylic acid chloride described above and 1-hydroxybenzotriazole, and the obtained ester and the bisaminophenol described above are brought into reaction with each other at a temperature of the room temperature or higher.

6. Benzoxazole Resin Precursor Comprising the Sixth Repeating Unit

It is preferable that the benzoxazole resin precursor comprising the third repeating unit, the fourth repeating unit and the fifth repeating unit has the sixth repeating unit represented by formula [17] shown above although the benzoxazole resin precursor comprising the third repeating unit, the fourth repeating unit and the fifth repeating unit is not limited to that having the sixth repeating unit.

The number of repeating (n) of the sixth repeating unit is not particularly limited. It is preferable that the number of repeating is an integer of 2 to 1,000, more preferably an integer of 5 to 600 and most preferably an integer of 10 to 80.

When the number of repeating is within the above range, workability in dissolution of the benzoxazole resin precursor in a solvent is excellent.

The third repeating unit, the fourth repeating unit and/or the fifth repeating unit and the sixth repeating unit may form the benzoxazole resin precursor as a copolymer or as a simple mixture. In the case of a copolymer, the copolymer may comprise the third repeating unit, the fourth repeating unit and/or the fifth repeating unit and the sixth repeating unit as any of a random copolymer, an alternating copolymer and a block copolymer.

6-1 Preparation of the Benzoxazole Resin Precursor Comprising the Sixth Repeating Unit As for the process for obtaining the benzoxazole resin precursor comprising the sixth repeating unit, the benzoxazole resin precursor can be synthesized by the reaction of a bisaminophenol compound which is represented by formula [21] shown above, in which $X_3$ represents a group selected from the groups represented by formulae [14] and [15] shown above, and a dicarboxylic acid compound represented by formula [19] shown above, in which $Y_1$ represents a group selected from the groups represented by formulae [4], the groups expressed by formulae [6-1] and [6-2], the groups represented by formulae [7-1] and [7-2] and the groups expressed by formulae [8] and [9]. For example, a combination of the bisaminophenol compound having no functional group and the dicarboxylic acid having no functional group and/or the dicarboxylic acid compound having a functional group other than the diamondoid structure or a combination of the bisaminophenol compound having a functional group other than the diamondoid structure and the dicarboxylic acid having no diamondoid structure and/or the dicarboxylic acid compound having a functional group other than the diamondoid structure can be brought into reaction with each other in accordance with the acid chloride process described above.

The active ester process may be used in place of the acid chloride process. In the active ester process, a benzotriazyl ester is prepared by the reaction of the dicarboxylic acid chloride described above and 1-hydroxybenzotriazole, and the obtained ester and the bisaminophenol described above are brought into reaction with each other at a temperature of the room temperature or higher.

The end of the molecule may be sealed by the reaction with a monofunctional carboxylic acid derivative, an acid anhydride, a monofunctional o-aminophenol or an amine derivative in accordance with the relative amounts by mole of the bisaminophenol and the dicarboxylic acid which are brought into the reaction.

7. Benzoxazole Resin Precursor Composition

In the present invention, when two or more types of the benzoxazole resin precursors selected from the benzoxazole resin precursor having the third repeating unit represented by formula [1], the benzoxazole resin precursor having the fourth repeating unit represented by formula [10], the benzoxazole resin precursor having the fifth repeating unit represented by formula [13] and the benzoxazole resin precursor having a combination of at least one of the third repeating unit represented by formula [1], the fourth repeating unit represented by formula [10] and the fifth repeating unit represented by formula [13] with the sixth repeating unit represented by formula [17] are mixed and used as the benzoxazole resin precursor composition, it is preferable that the composition comprises at least one of the benzoxazole resin precursor having the third repeating unit represented by formula [1], the benzoxazole resin precursor having the fourth repeating unit represented by formula [10] and the benzoxazole resin precursor having at least one of the fifth repeating unit represented by formula [13] as the essential component and, further, at least two precursors selected from the benzoxazole resin precursor having the third repeating unit, the benzoxazole resin precursor having the fourth repeating unit, the benzoxazole resin precursor having the fifth repeating unit and the benzoxazole resin precursor having a combination of at least one of the third repeating unit, the fourth repeating unit and the fifth repeating unit with the sixth repeating unit represented by formula [17] from the standpoint of obtaining the resin exhibiting excellent heat resistance and a small permittivity and obtaining the resin film from the resin as the objects of the present invention. The fourth repeating unit is preferable from the standpoint of providing a great modulus, and the sixth repeating unit is preferable from the standpoint of providing adhesive property. The fourth repeating unit and the sixth repeating unit can be used within the range such that the properties as the object of the present invention are not adversely affected.

8. Polybenzoxazole Resin

The polybenzoxazole resin will be described in the following.

The polybenzoxazole resin of the present invention can be obtained by the ring-closing reaction with dehydration of the benzoxazole resin precursor described above. The above reaction is, for example, the condensation reaction or the crosslinking reaction.

Examples of the process for obtaining the polybenzoxazole resin include a process in which the benzoxazole resin precursor is brought into reaction under a condition of 150 to 425° C.×5 minutes to 24 hours, a process in which the benzoxazole resin precursor is irradiated with ultraviolet light or a process the benzoxazole resin precursor is irradiated with electron beams.

When the polybenzoxazole resin is used as the interlayer insulation film, a product obtained by the reaction with a reactive oligomer which has a substituent reactive with carboxyl group, amino group or hydroxyl group of the benzoxazole resin precursor and can be decomposed by heating can be used. An organic compound which is decomposed or scattered at a high temperature may also be used after the reaction or blending with the precursor. Due to the above procedure, a nano foam can be easily formed from the polybenzoxazole resin when the interlayer insulation film is formed.

Examples of the substituent reactive with carboxyl group include amino group, hydroxyl group and isocyanate group.

Examples of the substituent reactive with amino group include carboxyl group, isocyanate group, glycidyl group, maleic anhydride group, maleimide group, acid anhydride groups and acrylate group.

Examples of the substituent reactive with hydroxyl group include acid anhydride group, carboxyl group and glycidyl group.

Examples of the base resin of the reactive oligomer described above include polyoxyalkylenes, polymethyl methacrylate, poly-α-methylstyrene, polystyrene, polyesters, polyether esters, polycaprolactone, polyurethanes and polycarbonates. Among these resin, polyoxyalkylenes and polycarbonates are preferable. A fine nano-foam can be formed by using the above resin.

The number-average molecular weight of the reactive oligomer is not particularly limited. It is preferable that the number-average molecular weight of the reactive oligomer is 100 to 40,000 and more preferably 200 to 20,000. When the number-average molecular weight is within the above range, aggregation of the nano-foam is suppressed, and fine uniform nano-foam can be formed.

The glass transition temperature of the polybenzoxazole resin is not particularly limited. It is preferable that the glass transition of the polybenzoxazole resin is 420° C. or higher and more preferably 450 to 500° C. When the glass transition temperature is within the above range, the coefficient of linear expansion of the resin film obtained from the polybenzoxazole resin can be decreased.

9. Varnish

When a resin film is prepared from the benzoxazole resin precursor, the polybenzoxazole resin or the benzoxazole resin precursor composition, it is preferable that the precursor, the resin or the composition is dissolved or dispersed into an organic solvent which can dissolve or disperse the precursor, the resin or the composition, and the obtained solution or the dispersion is used for preparation of the resin film. Examples of the organic solvent include N-methyl-2-pyrrolidone, γ-butyrolactone, N,N-dimethylacetamide, dimethyl sulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl 1,3-butylene glycol acetate, 1,3-butylene glycol 3-monomethyl ether, methyl pyruvate, ethyl pyruvate, methyl 3-methoxypropionate, methyl ethyl ketone, methyl isobutyl ketone, cyclopentanone, cyclohexanone, tetrahydrofuran, toluene, xylene and mesitylene. Organic solvents other than the organic solvents described above can be used as long as the precursor, the resin or the composition is dissolved or dispersed. The organic solvent may be used singly or in combination of two or more.

The relative amounts of the benzoxazole resin precursor, the polybenzoxazole resin or the benzoxazole resin precursor composition and the organic solvent is not particularly limited as long as the polybenzoxazole resin precursor, the polybenzoxazole resin or the benzoxazole resin precursor composition can be completely dissolved or dispersed and can be suitably selected in accordance with the application. In general, the content of the solvent in the varnish is about 70 to 95% by weight.

In the varnish of the present invention, where necessary, additives examples of which include surfactants, coupling agents such as silane coupling agents, typically, and catalysts such as radical initiators and disulfides generating oxygen radical or sulfur radical by heating can be used in combination with the above components.

When at least one of the benzoxazole resin precursor and the diaminophenol compound has hydrogen atom as the atom represented by $R_1$ and $R_2$ in the repeating units represented by formulae [1], [10], [13], [17] and [20] in the benzoxazole resin precursor and the diaminophenol compound, the varnish can be used as the photosensitive resin composition of the positive type by using in combination with a naphthoquinone azide compound as the photosensitive agent. When at least one of the benzoxazole resin precursor and the diaminophenol compound has a group having a photocrosslinking group such as methacryloyl group as the group represented by $R_1$ and $R_2$, the varnish can be used as the photosensitive resin composition of the negative type by using in combination with a photoinitiator.

When at least one of the groups represented by $R_1$ and $R_2$ has an alkyl group having 1 to 20 carbon atoms or an alkyl group having 1 to 20 carbon atoms bonded via —C(=O)—O—, the solubility in the preparation of the varnish can be improved.

10. Resin Film

The resin film will be described in the following.

The resin film of the present invention is constituted with the benzoxazole resin, the polybenzoxazole resin, the benzoxazole resin precursor composition or a resin composition comprising these components. Due to the above components, the excellent adhesion and dimensional stability can be exhibited.

Examples of the application of the resin film include interlayer insulation films and surface protective films of semiconductors, interlayer insulation films of multilayer circuits, cover coats of flexible copper-coated plates, solder resist films, oriented films of liquid crystals, protective films for etching (etching stoppers) and adhesives. The resin film can be advantageously used for interlayer insulation films, surface protective films and protective films for etching for semiconductors among these applications.

To the resin composition constituting the resin film, where necessary, surfactants, coupling agents such as silane coupling agents, typically, and catalysts such as radical initiators and disulfides generating oxygen radical or sulfur radical by heating can be added as additives.

The resin film can be used as the surface protective film having photosensitivity by adding a naphthoquinone diazide compound as the photosensitive agent.

When the resin film is used as the interlayer insulation film for a semiconductor, the type of the interlayer insulation film is not particularly limited. For example, it is preferable that the film has fine pores (a nano-foam) when a smaller permittivity is desired.

The average diameter of pores in the nano-foam is not particularly limited. It is preferable that the average diameter is 10 nm or smaller, more preferably 6 nm or smaller and most preferably 3 nm or smaller. When the average diameter is within the above range, adaptability in the process is excellent, and an excellent property of permittivity in the pattern formation is exhibited.

When the resin film is used as the interlayer insulation film for semiconductors forming the nano-foam, it is preferable that the a product obtained by the reaction of the polybenzoxazole resin precursor with the reactive oligomer described above which has a substituent reactive with carboxyl group, amino group or hydroxyl group in the benzoxazole resin precursor is used as the polybenzoxazole resin precursor constituting the above resin composition. When the above product is used, the nano-foam can be formed easily in the interlayer insulation film. A nano-foam can be formed also by reaction or blending of an organic compound which is decomposed or scattered at a high temperature.

A foaming agent (a porogen or a pore generator) forming the nano-foam may be added to the resin composition described above.

Examples of the foaming agent include carbon nano-tubes, Fullerenes, silsesquioxane of the cage type, cyclodextrine, organic compounds having a high melting point, organic compounds having small volatility, surfactants, azobis compounds, organic oxides, dendrimers and hyperbranched polymers. Among these agents, surfactants, hyperbranched polymers, organic compounds having a high melting point and organic compounds having small volatility are preferable. When the above foaming agent is used, the foaming agent can be dispersed uniformly into the benzoxazole resin. A fine nano-foam can be obtained by a further treatment such as heating and extraction when the foaming agent can be dispersed uniformly.

The porosity of the interlayer insulation film is not particularly limited. It is preferable that the porosity is 5 to 70% and more preferably 7 to 50%. When the porosity is smaller than the above smallest value, there is the possibility that the sufficient decrease in the permittivity is not exhibited. When the porosity exceeds the above greatest value, there is the possibility that the mechanical properties of the film decrease, and the modulus and the adhesive property decrease.

The thickness of the interlayer insulation film is not particularly limited. It is preferable that the thickness is 0.01 to 20 μm, more preferably 0.05 to 10 μm and most preferably 0.1 to 0.7 μm. When the thickness is within the above range, the adaptability to the process is excellent.

For obtaining the interlayer insulation, for example, a varnish is prepared by dissolving the resin composition comprising the benzoxazole resin precursor into an organic solvent such as N-methyl-2-pyrrolidone, and a coating film is formed by applying the prepared varnish to a suitable support such as a silicon wafer or a ceramic substrate. Examples of the coating process include the rotation coating process using a spinner, the spray coating process using a spray coater, the dipping process, the printing process and the roll coating process. Then, the formed coating film is dried and treated by heating. After the solvent is removed, the condensation reaction and the crosslinking reaction are conducted to form the polybenzoxazole resin, and the interlayer insulation film constituted with the resin composition comprising the polybenzoxazole resin can be formed. When the resin converted from the benzoxazole resin precursor is soluble in an organic solvent, a varnish containing the benzoxazole resin is prepared in advance, and the interlayer insulation film can be obtained in accordance with similar procedures. In accordance with this process, the step of converting the benzoxazole resin precursor into the resin is not necessary in the heating treatment of the coating film, and the time of heating can be decreased.

When the nano-foam is formed further, an interlayer insulation film having fine pores can be formed by treating the interlayer insulation film obtained above by heating.

When the resin film is the protective film for a semiconductor, similarly to the case of the interlayer insulation film, a varnish is prepared by dissolving the benzoxazole resin precursor described above into an organic solvent such as propylene carbonate, diacetone alcohol and N-methylpyrrolidone, and the prepared varnish is applied to a suitable support such as a silicon wafer and a ceramic substrate. Examples of the coating process include the rotation coating process using a spinner, the spray coating process using a spray coater, the dipping process, the printing process and the roll coating process. Then, the formed coating film is dried and treated by heating. After the solvent is removed, the condensation reaction and the crosslinking reaction are conducted to form the polybenzoxazole resin, and the protective film constituted with the resin composition comprising the polybenzoxazole resin can be formed.

The thickness of the protective film is not particularly limited. It is preferable that the thickness is 0.05 to 70 μm and more preferably 0.1 to 50 μm. When the thickness is within the above range, the property of protecting the semiconductor and workability are both excellent.

11. Semiconductor Device

A preferable embodiment of the semiconductor device will be described in the following.

FIG. 1 shows a diagram schematically exhibiting a sectional view of an embodiment of the semiconductor device of the present invention.

The semiconductor device 100 comprises a semiconductor substrate 1 on which an element is formed, a silicon nitride film 2 disposed on the upper side (the upper side in FIG. 1) of the semiconductor substrate, an interlayer insulation film 3 disposed on the silicon nitride film 2 and a copper wiring layer 4 coated with a barrier layer 6.

In the interlayer insulation film 3, depressions are formed in accordance with the pattern for forming the wiring, and the copper wiring 4 is disposed in the depressions.

In the interlayer insulation film 3, a nano-foam (fine pores) (not shown in the FIGURE) is formed.

Between the interlayer insulation film 3 and the copper wiring layer 4, a layer treated by modification 5 is disposed.

On the upper side (the side opposite to the side having the silicon nitride film 2) of the interlayer insulation film, a hard mask layer 7 is formed.

In the present embodiment, the semiconductor device 100 using the interlayer insulation film 3 is shown. However, the present invention is not limited to the above embodiment.

Since the semiconductor device of the present invention exhibits excellent dimensional accuracy and sufficient insulation due to the use of the interlayer insulation described above, the reliability of connection is excellent.

Since the interlayer insulation film has excellent adhesion with the wiring layer as described above, the reliability of connection of the semiconductor device can be further enhanced.

Since the interlayer insulation film has the excellent property of permittivity as described above, the loss of signals in the semiconductor device can be decreased.

Since the interlayer insulation film has the excellent property of permittivity as described above, the delay in the wiring can be decreased.

EXAMPLES

The present invention will be described more specifically with reference to examples in the following. However, the present invention is not limited to the examples. For the identification of an obtained compound, the following methods were used.

1. Nuclear magnetic resonance analysis ($^1$H-NMR, $^{13}$C($^1$H)—NMR): The measurement was conducted using an apparatus of the type JNM-GSX400 manufactured by NIPPON DENSHI Co., Ltd. The measurement of $^1$H-NMR and $^{13}$C($^1$H)—NMR were conducted at a resonance frequency of 400 MHz and 100 MHz, respectively. As the solvent of the measurement, a deuterated solvent which was deuterated dimethyl sulfoxide DMSO-$d_6$ or CDCl$_3$ was used.

2. Infrared analysis (IR): The measurement was conducted in accordance with the KBr tablet method using an apparatus of the type 1640 manufactured by PERKIN ELMER Company.

3. Mass analysis (MS): The measurement was conducted in accordance with the field desorption (FD) method using an apparatus of the type JMS-700 manufactured by NIPPON DENSHI Co., Ltd.

Example 1

1) Synthesis of a Bisaminophenol Compound Having the Diamondoid Structure

In accordance with the following three steps, 1,3-bis(3-amino-4-hydroxyphenyl)adamantane was obtained.

1-1) Synthesis of 1,3-bis(4-hydroxyphenyl)adamantane (the First Intermediate Compound)

A 500 ml five-necked flask equipped with a thermometer, a stirrer, a reflux condenser, an inlet for nitrogen gas and a discharge pipe connected to a trap containing a 30% by weight aqueous solution of sodium hydroxide was cooled in an ice bath. Into the flask, 6.47 g (0.022 moles) of 1,3-dibromoadamantane, 200 ml of phenol and 2.6 g (0.01 mole) of aluminum tribromide were placed. The resultant mixture was stirred at 0° C. for 6 hours and, then, the reaction was allowed to proceed under heating at 60° C. for 4 hours. The reaction product was poured into 2,000 liters of acidic ice water. After the ice melted, an organic layer was taken out, washed with pure water and a saturated aqueous solution of sodium chloride and poured into methanol to separate the product. The obtained product was dried under a reduced pressure, and 3.5 g of a product was obtained.

When the product was examined, the absorption of hydroxyl group was found at 3,550 to 3,200 cm$^{-1}$ in the IR analysis, and the molecular weight was found to be 320 in the mass analysis. Therefore, it was shown that the product was the first intermediate compound.

1-2) Synthesis of 1,3-bis(3-nitro-4-hydroxyphenyl)adamantane (the Second Intermediate Compound)

Into a 500 ml four-necked flask equipped with a thermometer, a stirrer and a reflux condenser, 200 ml (0.64 moles) of a 20% aqueous solution of nitric acid was placed, and 35 g (0.11 moles) of 1,3-bis(4-hydroxyphenyl)adamantane obtained by repeating the above procedures was added in small portions under vigorous stirring. The temperature at the inside of the flask was kept at 20 to 30° C. during the addition. After the addition was completed and the elevation of the temperature ceased, the reaction was allowed to proceed for further 1 hour. Then, the reaction product was poured into about 500 ml of cold water, and a crude product was separated by filtration, washed with pure water and dried. The obtained crude product was recrystallized from hot ethanol.

The obtained product of recrystallization was dried under a reduced pressure, and 30 g of a product was obtained.

When the product was examined, the absorption of nitro group was found at about 1,500 cm$^{-1}$ and 1,370 cm$^{-1}$ in the IR analysis and the molecular weight was found to be 410 in the mass analysis. Therefore, it was shown that the product was the second intermediate compound.

1-3) Synthesis of 1,3-bis(3-amino-4-hydroxyphenyl)adamantane

Into a 200 ml four-necked flask equipped with a thermometer, a Dimroth condenser and an inlet for nitrogen gas, 20 ml of a concentrated hydrochloric acid and 30 ml of ethanol were placed and, then, 8.6 g (0.021 moles) of the second intermediate compound obtained above was added under stirring so that the added compound floated on the fluid. To the resultant mixture, a solution obtained by dissolving 15 g of tin(II) chloride dihydrate into 20 ml of ethanol was added at a temperature of 30° C. or lower over 1 hour. After 12 hours, formed crystals were separated by filtration and recrystallized from a mixed solution of ethanol and hydrochloric acid. The obtained hydrochloride salt was hydrolyzed with water, recrystallized from ethanol and dried under a reduced pressure, and 6.7 g of a product was obtained.

When the product was examined, the absorption of proton of OH group was found at 8.8 to 9.5 ppm and the absorption of proton of NH$_2$ group was found at 4 to 4.5 ppm in the NMR analysis, and the molecular weight was found to be 350 in the mass analysis. Therefore, it was shown that the product was 1,3-bis(3-amino-4-hydroxyphenyl)-adamantane (a bisaminophenol compound having the diamondoid structure).

2) Dicarboxylic Acid

Having No Substituents

As the dicarboxylic acid, isophthalic acid chloride [manufactured by TOKYO KASEI KOGYO Co., Ltd.] was used.

3) Preparation of a Benzoxazole Resin Precursor

Under the stream of nitrogen gas, 31.5 g (0.09 moles) of 1,3-bis(3-amino-4-hydroxyphenyl)adamantane was dissolved into 200 g of dried N-methyl-2-pyrrolidone. After 17.4 g (0.22 moles) of pyridine was added, the resultant solution was cooled at −15° C., and 20.3 g (0.10 mole) of isophthalic acid dichloride was added in small portions. When the addition was completed, the resultant mixture was stirred at −15° C. for 1 hour. Then, the temperature was adjusted at the room temperature, and the mixture was stirred at the room temperature for 5 hours. The reaction fluid was added dropwise as small droplets into 4 liters of distilled water. The formed precipitates were collected and dried, and a benzoxazole resin precursor having the diamondoid structure was obtained.

The number-average molecular weight (Mn) of the obtained benzoxazole resin precursor was obtained using GPC manufactured by TOSO Co., Ltd. and was found to be 20,000 expressed as the value of corresponding polystyrene.

4) Preparation of a Resin Film

The benzoxazole resin precursor obtained above was dissolved into N-methyl-2-pyrrolidone and filtered through a TEFLON (a registered trade name) filter, and a varnish for coating was obtained. The obtained varnish for coating was applied to a silicon wafer using a spin coater, dried in an oven under the atmosphere of nitrogen under the conditions of 90° C./1 minute, 250° C./1 hour and 330° C./1 hour, successively, and a resin film was obtained.

Example 2

1) Synthesis of a Bisaminophenol Compound Having the Diamondoid structure 1-1) Synthesis of Tetramantane Tetramantane was synthesized in accordance with the process of W. Burns et al. [Journal of Chemical Society, Chemical Communication, 1976, 893 (1976)].

1-2) Synthesis of 1,9-dibromotetramantane

Into a 500 ml four-necked flask equipped with a thermometer, a stirrer and a reflux condenser, 200 ml of carbon tetrachloride and 10 g (0.063 moles) of bromine were placed, and 16.6 g (0.057 moles) of tetramantane obtained above was added in small portions under stirring. The temperature at the inside of the flask was kept at 20 to 30° C. during the addition. After the addition was completed and the elevation of the temperature ceased, the reaction was allowed to proceed for further 1 hour. Then, the reaction product was poured into about 500 ml of cold water, and a crude product was separated by filtration, washed with pure water and dried. The obtained crude product was recrystallized from hot ethanol. The obtained product of recrystallization was dried under a reduced pressure, and 29.0 g of a product was obtained. When the product was examined, the absorption of bromo group was found at about 690 to 515 $cm^{-1}$ in the IR analysis, and the molecular weight was found to be 450 in the mass analysis. Therefore, it was shown that the product was 1,9-dibromotetramantane.

1-3) Synthesis of 1,9-bis(3-amino-4-hydroxyphenyl)tetramantane

In accordance with the same procedures as those conducted in the synthesis of the bisaminophenol compound in Example 1 except that 1,9-dibromotetramantane (0.02 moles) was used in place of 1,3-dibromo-adamantane (0.022 moles) used in Example 1, 1,9-bis(3-amino-4-hydroxy-phenyl)tetramantane was synthesized.

2) Dicarboxylic Acid (No Substituents)

As the dicarboxylic acid, terephthalic acid chloride [manufactured by TOKYO KASEI KOGYO Co., Ltd.] was used.

3) Dicarboxylic Acid Having a Functional Group

A dicarboxylic acid having a functional group (5-phenylethynyl-isophthalic acid dichloride) was obtained in accordance with the following steps.

3-1) Synthesis of 5-bromoisophthalic acid (the First Intermediate Compound)

Into a 1 liter four-necked flask equipped with a thermometer, a stirrer and a dropping funnel, 99.18 g (0.55 moles) of 5-aminoisophthalic acid, 165 ml of a 48% by weight hydrobromic acid and 150 ml of distilled water were placed and stirred. The flask was cooled at 5° C. or lower. A solution prepared by dissolving 39.4 g (0.57 moles) of sodium nitrite into 525 ml of distilled water was added dropwise to the cooled solution over 1 hour, and an aqueous solution of a diazonium salt was obtained. Into a four-necked 3 liter flask equipped with a thermometer, a Dimroth condenser, a dropping funnel and a stirrer, 94.25 g (0.66 moles) of cuprous bromide and 45 ml of a 48% by weight hydrobromic acid were placed and stirred.

The flask was cooled at 0° C. or lower, and the aqueous solution of a diazonium salt obtained above was added dropwise to the cooled solution over 2 hours. After the addition was completed, the resultant mixture was stirred at the room temperature for 30 minutes and then heated under the refluxing condition for 30 minutes. After the reaction mixture was cooled by leaving standing, the formed precipitates were separated by filtration and washed twice with 2 liters of distilled water. The obtained white solid substance was dried at 50° C. for 2 days under a reduced pressure, and 117 g of a crude product was obtained. The obtained crude product was used in the following step without purification.

3-2) Synthesis of dimethyl 5-bromoisophthalate (the Second Intermediate Compound)

Into a 500 ml flask equipped with a stirrer and a Dimroth condenser, 110 g of the first intermediate compound (5-bromoisophthalic acid) obtained above, 500 ml of methanol and 10 g of a concentrated sulfuric acid were placed, and the resultant mixture was heated under the refluxing condition for 6 hours. After the resultant mixture was cooled by leaving standing, the cooled mixture was added dropwise to 1 liter of distilled water, and the obtained mixture was neutralized with a 5% by weight aqueous solution of sodium hydrogencarbonate. The formed precipitates were separated by filtration and washed twice with 2 liters of distilled water. The obtained white solid substance was dried at 50° C. for 2 days under a reduced pressure, and 109 g (0.4 moles) of dimethyl 5-bromoisophthalate was obtained (the yield: 89%).

3-3) Synthesis of dimethyl 5-phenylethynylisophthalate (the Third Intermediate Compound)

Into a 1 liter four-necked flask equipped with a thermometer, a Dimroth condenser, an inlet for nitrogen gas and a stirrer, 99.7 g (0.365 moles) of the second intermediate compound (dimethyl 5-bromo-isophthalate) obtained above, 1.1 g (0.00419 moles) of triphenylphosphine, 0.275 g (0.00144 moles) of copper iodide and 41.0 g (0.401 moles) of phenylacetylene were placed, and a stream of nitrogen gas was introduced. To the resultant mixture, 375 ml of dehydrated triethylamine and 300 ml of dehydrated pyridine were added and dissolved under stirring. After the flow of nitrogen gas was continued for 1 hour, 0.3 g (0.000427 moles) of dichlorobis(triphenylphosphine)palladium was rapidly added, and the resultant mixture was heated under the refluxing condition in an oil bath for 1 hour. Then, triethylamine and pyridine were removed by distillation under a reduced pressure, and a viscous brown solution was obtained. The obtained viscous brown solution was poured into 500 ml of water, and the formed solid substance was separated by filtration and washed twice with 500 ml of water, twice with 500 ml of hydrochloric acid having a concentration of 5 mole/liter and twice with 500 ml of water. The obtained solid substance was dried at 50° C. under a reduced pressure, and 80.6 g of dimethyl 5-phenylethynylisophthalate was obtained (the yield: 75%).

3-4) Synthesis of dipotassium 5-phenylethynylisophthalate (the Fourth Intermediate Compound)

Into a 5 liter four-necked flask equipped with a thermometer, a Dimroth condenser and a stirrer, 3 liters of butanol and 180 g (2.72 moles) of potassium hydroxide (85%) were placed, and potassium hydroxide was dissolved by heating under the refluxing condition. To the obtained solution, 80 g (0.272 moles) of the third intermediate compound (dimethyl 5-phenylethynylisophthalate) obtained above was added, and the resultant mixture was heated under the refluxing condition for 30 minutes. The resultant mixture was cooled in an ice bath, and the formed crystals were separated by filtration. The obtained crystals were washed twice with 1 liter of ethanol and dried at 60° C. under a reduced pressure, and 90.35 g of dipotassium 5-phenylethynylisophthalate was obtained.

3-5) Synthesis of 5-phenylethynylisophthalic acid dichloride

Into a 2 liter four-necked flask equipped with a thermometer, a Dimroth condenser and a stirrer, 82.1 g (0.24 moles) of dipotassium 5-phenylethynylisophthalate and 400 ml of 1,2-dichloroethane were placed, and the resultant mixture was cooled at 0° C. To the cooled mixture, 391 g (4.5 moles) of thionyl chloride was added dropwise at 5° C. or lower over 1 hour. Then, 4 ml of dimethylformamide and 4 g of hydroquinone were added, and the obtained mixture was stirred at 45 to 50° C. for 3 hours. After the reaction mixture was cooled, formed crystals were separated by filtration and washed with 150 ml of chloroform. The filtrate and the washing fluid were combined and concentrated at 40° C. or lower under a reduced pressure. The obtained residue was treated twice by extraction with 200 ml of diethyl ether and filtration. Diethyl ether was removed from the extract by distillation under a reduced pressure, and a crude product of a semisolid substance was obtained. The crude product was washed with dried n-hexane and recrystallized from diethyl ether, and 13.8 g of 5-phenylethynylisophthalic acid dichloride (a dicarboxylic acid having a functional group) was obtained (the yield: 19%).

4) Preparation of a Benzoxazole Resin Precursor

The reaction was conducted in accordance with the same procedures as those conducted in 3) of Example 1 except that, in the preparation of a benzoxazole resin precursor, 45.5 g (0.09 moles) of 1,9-bis(3-amino-4-hydroxyphenyl)tetramantane obtained by repeating the above procedures was used in place of 31.5 g (0.09 moles) of 1,3-bis(3-amino-4-hydroxyphenyl)adamantane used in Example 1 and 10.1 g (0.05 moles) of terephthalic acid chloride and 15.2 g (0.05 moles) of 5-phenylethynylisophthalic acid dichloride obtained by repeating the above procedures were used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 23,000 expressed as the value of corresponding polystyrene.

Example 3

1) Synthesis of 9,9-bis(3-amino-4-hydroxyphenyl)-2,7-bisadamantyl-ethynylfluorene

1-1) Synthesis of 1-ethynyladamantane

1-Ethynyladamantane was synthesized from 1-adamantyl methyl ketone [manufactured by ALDRICH CHEMICAL Company, Inc.] in accordance with the process of Foroozesh et al. [Chem. Res. Toxicol., 10, 91 (1997)].

1-2) Synthesis of 9,9-bis(4-hydroxyphenyl)-2,7-dibromofluorene 9,9-bis(4-Hydroxyphenyl)-2,7-dibromofluorene was synthesized using 2,7-dibromofluoren-9-one in accordance with the process described in Macromolecules, Vol. 35, No. 26, p 9673 to 9677 (2002).

1-3) Synthesis of [9,9-bis(3-nitro-4-hydroxyphenyl)-2,7-dibromo]fluorene

Into a 500 ml four-necked flask equipped with a thermometer, a stirrer and a reflux condenser, 200 ml (0.64 moles) of a 20% aqueous solution of nitric acid was placed, and 147.4 g (0.29 moles) of 9,9-bis(4-hydroxyphenyl)-2,7-dibromofluorene obtained above was added in small portions under vigorous stirring. The temperature at the inside of the flask was kept at 20 to 30° C. during the addition. After the addition was completed and the elevation of the temperature ceased, the reaction was allowed to proceed for further 1 hour. Then, the reaction product was poured into about 500 ml of cold water, and the obtained crude product was separated by filtration, washed with pure water and dried. The crude product was recrystallized from hot ethanol, and a solid substance was obtained. The obtained solid substance was dried under a reduced pressure, and 156 g of a product was obtained. When the obtained product was examined, the absorption of nitro group was found at about 1,500 cm$^{-1}$ and 1,370 cm$^{-1}$ and the absorption of the bromo group was found at 690 to 515 cm$^{-1}$ in the IR analysis; and the molecular weight was found to be 440 in the mass analysis. Therefore, it was shown that the product was the object compound.

1-4) Synthesis of [9,9-bis(4-hydroxy-3-nitrophenyl)-2,7-bisadamantyl-ethynyl]fluorene Into a 500 ml four-necked flask equipped with a thermometer, a Dimroth condenser, an inlet for nitrogen gas and a stirrer, 35.9 g (0.06 moles) of [9,9-bis(3-nitro-4-hydroxyphenyl)-2,7-dibromo]fluorene obtained above, 0.79 g (0.003 moles) of triphenylphosphine, 0.23 g (0.0012 moles) of copper iodide, 10.6 g (0.066 moles) of 1-ethynyladamantane obtained above in 1-1), 72 ml of dehydrated triethylamine, 38 ml of dehydrated pyridine and 0.25 g (0.00036 moles) of dicholorobis(triphenylphosphine)-palladium were placed, and the obtained mixture was heated under the refluxing condition at 105° C. for 1 hours under the stream of nitrogen gas. Then, triethylamine and pyridine were removed by distillation under a reduced pressure, and a viscous brown solution was obtained. To the obtained viscous brown solution, 200 ml of water and 5 ml of hydrochloric acid were poured, and the formed solid substance was separated by filtration and washed with 500 ml of water. The obtained solid substance was dried at 50° C. under a reduced pressure for 1 day, and 27.2 g of a product was obtained. When the obtained product was examined, the absorption of the ethynyl group was found at about 2260 to 2190 cm$^{-1}$ in the IR analysis, and the molecular weight was found to be 757 in the mass analysis. Therefore, it was shown that the product was the object compound.

1-5) Synthesis of [9,9-bis(3-amino-4-hydroxyphenyl)-2,7-bisadamantyl-ethynyl]fluorene Into a 200 ml four-necked flask equipped with a thermometer, a Dimroth condenser and an inlet for nitrogen gas, 20 ml of a concentrated hydrochloric acid and 30 ml of ethanol were placed and, then, 15.9 g (0.021 moles) of [9,9-bis(3-nitro-4-hydroxyphenyl)-2,7-bisadamantyl-ethynyl]fluorene obtained above was added under stirring so that the added compound floated on the fluid. To the resultant mixture, a solution obtained by dissolving 15 g of tin(II) chloride dihydrate into 20 ml of ethanol was added at a temperature of 30° C. or lower over 1 hour. After 12 hours, formed crystals were separated by filtration and recrystallized from a mixed solution of ethanol and hydrochloric acid. The obtained hydrochloride salt was hydrolyzed with water, recrystallized from ethanol and dried under a reduced pressure, and 11.7 g of a product was obtained. When the obtained product was examined, the absorption of the ethynyl group was found at about 2,260 to 2,190 cm$^{-1}$ in the IR analysis, the absorption of proton of OH group was found at 8.8 to 9.5 ppm and the absorption of proton of NH$_2$ group was found at 4 to 4.5 ppm in the NMR analysis, and the molecular weight was found to be 697 in the mass analysis. Therefore, it was shown that the obtained compound was the object compound.

2) Dicarboxylic Acid Having the Diamondoid Structure 1,3-Adamantanedicarboxylic acid dichloride was synthesized from 1,3-adamantanedicarboxylic acid [manufactured by ALDRICH CHEMICAL Company, Inc.] in accordance with the following process.

Into a 500 ml four-necked flask equipped with a thermometer and a Dimroth condenser, 7.85 g (0.035 moles) of 1,3-adamantanedicarboxylic acid, 100 ml of 1,2-dichloroethane, 9.16 g (0.077 moles) of thionyl chloride and 8.0 mg (0.00035 moles) of triethylammonium benzyl chloride were placed, and the resultant mixture was heated under the refluxing condition for 3 hours. The obtained solution was filtered in the hot condition. After the solution was concentrated by removing the solvent under a reduced pressure, the recrystallization was conducted by adding hexane. The obtained solid substance was dried under a reduced pressure, and 5.48 g of a product was obtained as light yellow crystals having a melting point of 68 to 69° C.

When the obtained product was examined, the absorption of the acid chloride group was found at about 1815 to 1785 cm$^{-1}$ in the IR analysis, and the molecular weight was found to be 261 in the mass analysis. Therefore, it was shown that the obtained compound was the object compound.

3) Preparation of a Benzoxazole Resin Precursor

The reaction was conducted in accordance with the same procedures as those conducted in 3) of Example 1 except that, in the preparation of a benzoxazole resin precursor, 62.7 g (0.09 moles) of [9,9-bis(3-amino-4-hydroxyphenyl)-2,7-bisadamantylethynyl]fluorene obtained by repeating the above procedures was used in place of 31.5 g (0.09 moles) of 1,3-bis(3-amino-4-hydroxyphenyl)adamantane used in Example 1 and 26.1 g (0.10 mole) of 1,3-adamantanedicarboxylic acid dichloride obtained by repeating the above procedures was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 20,000 expressed as the value of corresponding polystyrene.

Example 4

1) Synthesis of 3,3'-bis(3-amino-4-hydroxyphenyl)-1,1'-biadamantane 1-1) 3,3'-bis(4-Hydroxyphenyl)-1,1'-biadamantane Into a 10 liter four-necked separable flask equipped with a thermometer, a stirrer, an inlet for nitrogen gas and a reflux condenser, 64.5 g (0.15 moles) of 3,3'-dibromo-1,1'-biadamantane and 1032 g (10.95 moles) of phenol were placed, and the resultant mixture was heated under the refluxing condition at 155° C. for 30 minutes. After the mixture was cooled at the room temperature, 4.3 liters of methanol was added, and the obtained mixture was heated under the refluxing condition at 55° C. for 10 minutes. The formed precipitates were separated by filtration, washed with a flow of methanol and dried at 60° C. under a reduced pressure for 24 hours, and 64.2 g of the product was obtained (the yield: 93.7%).

When the obtained product was examined, peaks of proton were found at 8.79 ppm (2H), 7.12 ppm (4H), 6.67 ppm (4H), 2.12 ppm (4H), 1.72 ppm (8H) and 1.59 ppm (16H) in the NMR analysis in a DMSO-d$_6$ solution, and it was shown that the obtained product was the object compound.

1-2) Synthesis of 3,3'-bis(3-nitro-4-hydroxyphenyl)-1,1'-biadamantane

Into a 1 liter four-necked flask equipped with a thermometer, an inlet for nitrogen gas and a stirrer, 45.46 g (0.100 mole) of 3,3'-bis(4-hydroxyphenyl)-1,1'-biadamantane obtained in accordance with the process described above and 600 ml of dichloroethane were placed, and a stream of nitrogen gas was introduced into the flask. While the flask was cooled in a methanol/ice bath under stirring, 27.30 g (0.260 moles) of a 60% by weight aqueous solution of nitric acid was added dropwise. The resultant mixture was stirred at a temperature of the inside of the flask of 0° C. or lower for 30 minutes, at a temperature of 0 to 5° C. in a water/ice bath for 2 hours and at the room temperature without using the water/ice bath for 2 hours and, then, the reaction fluid was filtered. A yellow solid substance obtained by filtration was washed three times with 1000 ml of ion-exchanged water and dried at 60° C. under a reduced pressure for 1 day, and 31.04 g of 3,3'-bis(3-nitro-4-hydroxyphenyl)-1,1'-biadamantane was obtained (the yield: 57%).

When the obtained product was examined, peaks of proton were found at 1.43 ppm (s, 16H), 1.70-1.80 ppm (m, 8H), 2.14 ppm (s, 4H), 7.07 ppm (d, 2H), 7.60 ppm (d, 2H), 7.75 ppm (s, 2H) and 10.72 ppm (OH) in the NMR analysis in a DMSO-$d_6$ solution. Therefore, it was shown that the obtained product was the object compound.

1-3) Synthesis of 3,3'-bis(3-amino-4-hydroxyphenyl)-1,1'-biadamantane

Under the atmosphere of hydrogen, 31.04 g (0.057 moles) of 3,3'-bis(3-nitro-4-hydroxyphenyl)-1,1'-biadamantane obtained above, 2.42 g (0.00114 moles) of a 10% palladium active charcoal, 310 ml of tetrahydrofuran and 62 ml of N-methylpyrrolidone were stirred at the room temperature for 30 hours. Then, 31 ml of N-methylpyrrolidone was added and, after the resultant mixture was stirred for 15 minutes, the resultant reaction fluid was filtered. The filtrate was added dropwise to 1200 ml of ion-exchanged water. The formed solid substance was washed 3 times with a mixed solvent of 620 ml of methanol and 620 ml of ion-exchanged water and dried at 60° C. under a reduced pressure for 2 days, and 23.21 g of 3,3'-bis(3-amino-4-hydroxyphenyl)-1,1'-biadamantane of the object compound was obtained as gray powder (the yield: 84%).

When the obtained product was examined, peaks of proton were found at 1.53-1.69 ppm (m, 24H), 2.10 ppm (s, 4H), 4.30 ppm (NH$_2$), 6.35 ppm (d, 2H), 6.53 ppm (d, 2H), 6.61 ppm (s, 2H) and 8.70 ppm (OH) in the NMR analysis in a DMSO-$d_6$ solution; and the molecular weight was found to be 483 in the mass analysis. Therefore, it was shown that the obtained product was the object compound.

2) Synthesis of 5-adamantylethynylisophthalic acid

The above compound was synthesized in accordance with the same procedures as those conducted in 3-3) to 3-5) of Example 2 except that 1-ethynyladamantane synthesized in Example 3 was used in place of phenylacetylene in the synthesis of the dicarboxylic acid having a functional group in Example 2.

3) Preparation of a Benzoxazole Resin Precursor

The reaction was conducted in accordance with the same procedures as those conducted in 3) of Example 1 except that, in the preparation of a benzoxazole resin precursor, 43.6 g (0.09 moles) of 3,3'-bis(3-amino-4-hydroxyphenyl)-1,1'-biadamantane obtained above was used in place of 31.5 g (0.09 moles) of 1,3-bis(3-amino-4-hydroxyphenyl)-adamantane used in Example 1 and 36.1 g (0.10 mole) of 5-adamantylethynylisophthalic acid dichloride obtained above was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 22,000 expressed as the value of corresponding polystyrene.

Example 5

1) Bisaminophenol Having the Diamondoid Structure 1,3-bis(3-Amino-4-hydroxyphenyl)adamantane synthesized in accordance with the same procedures as those conducted in Example 1 was used.

2) Substituted Dicarboxylic Acid

Similarly to Example 1, isophthalic acid chloride [manufactured by TOKYO KASEI KOGYO Co., Ltd.] was used as the dicarboxylic acid.

3) Bisaminophenol Having the Diamondoid Structure 9,9-bis(3-Amino-4-hydroxyphenyl)-2,7-bisadamantylethynylfluorene synthesized in accordance with the same procedures as those conducted in Example 3 was used.

4) Dicarboxylic Acid Having the Diamondoid Structure 1,3-Adamantanedicarboxylic acid dichloride synthesized in accordance with the same procedures as those conducted in Example 3 was used.

5) Preparation of a Benzoxazole Resin Precursor

The reaction was conducted in accordance with the same procedures as those conducted in 3) of Example 1 except that, in the preparation of a benzoxazole resin precursor, 22.8 g (0.045 moles) of 1,3-bis(3-amino-4-hydroxyphenyl)adamantane and 34.8 g (0.045 moles) of 9,9-bis(3-amino-4-hydroxyphenyl)-2,7-bisadamantylethynylfluorene were used in place of 31.5 g (0.09 moles) of 1,3-bis(3-amino-4-hydroxyphenyl)-adamantane used in Example 1 and 10.1 g (0.05 moles) of isophthalic acid chloride and 13.1 g (0.05 moles) of 1,3-adamantanedicarboxylic acid dichloride were used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 22,000 expressed as the value of corresponding polystyrene.

Example 6

1) Bisaminophenol Having the Diamondoid Structure 1,9-bis(3-Amino-4-hydroxyphenyl)tetramantane synthesized in accordance with the same procedures as those conducted in Example 2 was used.

2) Dicarboxylic Acid Having a Functional Group

5-Phenylethynylisophthalic acid chloride synthesized in accordance with the same procedures as those conducted in Example 2 was used.

3) Dicarboxylic Acid Having No Substituent

Terephthalic acid chloride was used similarly to Example 2.

4) Bisaminophenol Having the Diamondoid Structure 3,3'-bis(3-Amino-4-hydroxyphenyl)-1,1'-biadamantane synthesized in accordance with the same procedures as those conducted in Example 4 was used.

5) Dicarboxylic Acid Having the Diamondoid Structure

5-Adamantylethynylisophthalic acid synthesized in accordance with the same procedures as those conducted in Example 4 was used.

6) Preparation of Benzoxazole Resin Precursors

The same benzoxazole resin precursors as those prepared in Examples 2 and 4 were prepared.

7) Blending of Benzoxazole Resins

A benzoxazole resin precursor formed with the bisaminophenol having the diamondoid structure, the dicarboxylic acid having a functional group and the dicarboxylic acid having no functional group which were obtained above in an amount of 50% by weight and 50% by weight of a benzoxazole resin precursor formed with the bisaminophenol having the diamondoid structure and the dicarboxylic acid having the diamondoid-ethynyl structure which were obtained above were dissolved in N-methylpyrrolidone as the solvent, and a varnish having a content of the solid resin components of 20% by weight was prepared.

Example 7

1) Bisaminophenol Having the Diamondoid Structure 1,3-bis(3-Amino-4-hydroxyphenyl)adamantane synthesized in accordance with the same procedures as those conducted in Example 1 was used.

2) Dicarboxylic Acid Having no Substituent

Isophthalic acid chloride [manufactured by TOKYO KASEI KOGYO Co., Ltd.] was used as the dicarboxylic acid similarly to Example 2.

3) Bisaminophenol Having the Diamondoid Structure 3,3'-bis(3-Amino-4-hydroxyphenyl)-1,1'-biadamantane synthesized in accordance with the same procedures as those conducted in Example 4 was used.

4) Dicarboxylic Acid Having the Diamondoid-Ethynyl Structure

5-Adamantylethynylisophthalic acid dichloride synthesized in accordance with the same procedures as those conducted in Example 4 was used.

5) Preparation of a Benzoxazole Resin Precursor

Under the stream of nitrogen gas, 15.8 g (0.045 moles) of 1,3-bis(3-amino-4-hydroxyphenyl)adamantane was dissolved into 200 g of dried N-methyl-2-pyrrolidone. After 17.4 g (0.22 moles) of pyridine was added, the resultant mixture was cooled at −15° C., and 10.2 g (0.05 moles) of isophthalic acid chloride was added in small portions. After the addition was completed, the obtained mixture was stirred at −15° C. for 1 hour. Then, the temperature was adjusted at the room temperature, and the mixture was stirred at the room temperature for 5 hours. After the mixture was cooled at −15° C., 21.8 g (0.045 moles) of 3,3'-bis(3-amino-4-hydroxyphenyl)-1,1'-biadamantane was added dropwise and dissolved homogeneously. Then, 18.1 g (0.05 moles) of 5-adamantylethynylisophthalic acid dichloride was added in small portions. After the addition was completed, the obtained mixture was stirred at −15° C. for 1 hour. Then, the temperature was adjusted at the room temperature, and the mixture was stirred at the room temperature for 5 hours. Then, the reaction fluid was added dropwise as small droplets to 4 liters of distilled water. The formed precipitates were collected and dried, and a benzoxazole resin precursor having a repeating unit constituted with the bisaminophenol having the diamondoid structure and the dicarboxylic acid having no substituent was obtained.

The number-average molecular weight (Mn) of the obtained benzoxazole resin precursor was obtained using GPC manufactured by TOSO Co., Ltd. and was found to be 19,500 expressed as the value of corresponding polystyrene.

Example 8

1) Bisaminophenol and Dicarboxylic Acid Used for the Third Repeating Unit 1-1) Bisaminophenol Having the Diamondoid Structure 1,3-bis(3-Amino-4-hydroxyphenyl)adamantane synthesized in accordance with the same procedures as those conducted in Example 1 was used.

1-2) Dicarboxylic Acid Having No Substituent

Isophthalic acid chloride [manufactured by TOKYO KASEI KOGYO Co., Ltd.] was used as the dicarboxylic acid similarly to Example 1.

2) Bisaminophenol and Dicarboxylic Acid Used for the Fourth Repeating Unit 2-1) Bisaminophenol Having the Diamondoid-Ethynyl Structure 9,9-bis(3-Amino-4-hydroxyphenyl)-2,7-bisadamantyl-ethynylfluorene synthesized in accordance with the same procedures as those conducted in Example 3 was used.

2-2) Dicarboxylic Acid Having the Diamondoid Structure 1,3-Adamantanedicarboxylic acid dichloride synthesized in accordance with the same procedures as those conducted in Example 3 was used.

3) Bisaminophenol and Dicarboxylic Acid Used for the Fifth Repeating Unit

3-1) Bisaminophenol Having a Functional Group 9,9-bis(3-Amino-4-hydroxyphenyl)-2,7-diphenylethynylfluorene was obtained in accordance with the following 4 steps.

3-1-1) Synthesis of 9,9-bis(3-nitro-4-hydroxyphenyl) fluorene (the First Intermediate Compound)

Into a 500 ml four-necked flask equipped with a thermometer, a stirrer and a reflux condenser, 200 ml (0.64 moles) of a 20% aqueous solution of nitric acid was placed, and 102 g (0.29 moles) of 9,9-bis(4-hydroxyphenyl)fluorene was added in small portions under vigorous stirring. The temperature at the inside of the flask was kept at 20 to 30° C. during the addition. After the addition was completed and the elevation of the temperature ceased, the reaction was allowed to proceed for further 1 hour. Then, the reaction product was poured into about 500 ml of cold water, and a crude product was separated by filtration, washed with pure water and dried. The obtained crude product was recrystallized from hot ethanol. The obtained product of recrystallization was dried under a reduced pressure, and 70 g of a product was obtained.

When the obtained product was examined, the absorption of nitro group was found at about 1,500 $cm^{-1}$ and 1,370 $cm^{-1}$ in the IR analysis and the molecular weight was found to be 410 in the mass analysis. Therefore, it was shown that the product was the first intermediate compound.

3-1-2) Synthesis of 9,9-bis(3-nitro-4-hydroxyphenyl)-2,7-dibromofluorene (the Second Intermediate Compound)

Into a 500 ml four-necked flask equipped with a thermometer, a stirrer and a reflux condenser, 200 ml of carbon tetrachloride and 10 g (0.063 moles) of bromine were placed, and 25 g (0.057 moles) of the first intermediate compound obtained above was added in small portions under stirring. The temperature at the inside of the flask was kept at 20 to 30° C. during the addition. After the addition was completed and the elevation of the temperature ceased, the reaction was allowed to proceed for further 1 hour. Then, the reaction product was poured into about 500 ml of cold water, and a crude product was separated by filtration, washed with pure water and dried. The obtained crude product was recrystallized from hot ethanol. The obtained product of recrystallization was dried under a reduced pressure, and 29.0 g of a product was obtained. When the obtained product was examined, the absorption of bromo group was found at about 690 to 515 $cm^{-1}$ in the IR analysis, and the molecular weight was found to be 598 in the mass analysis. Therefore, it was shown that the product was the second intermediate compound.

3-1-3) Synthesis of 9,9-bis(3-nitro-4-hydroxyphenyl)-2,7-diphenylethynylfluorene (the Third Intermediate Compound)

Into a 500 ml four-necked flask equipped with a thermometer, a Dimroth condenser and an inlet for nitrogen gas, 35.9 g (0.06 moles) of the second intermediate compound obtained above, 0.79 g (0.003 moles) of triphenylphosphine, 0.23 g (0.0012 moles) of copper iodide, 6.74 g (0.0066 moles) of ethynylbenzene, 72 ml of dehydrated triethylamine, 38 ml of dehydrated pyridine and 0.25 g (0.00036 moles) of dichlorobis(triphenyl-phosphine)palladium were placed. Under the stream of nitrogen gas, the resultant mixture was heated under the refluxing condition at 105° C. for 1 hour. Then, triethylamine and pyridine were removed by distillation under a reduced pressure, and a viscous brown solution was obtained. To the obtained viscous brown solution, 200 ml of water and 5 ml of hydrochloric acid were added, and the formed solid substance was separated by filtration and washed with 500 ml of water. The obtained solid substance was dried at 50° C. under a reduced pressure for 1 day, and 28.8 g of a product was obtained.

When the product was examined, the absorption of ethynyl group was found at about 2,260 to 2,190 $cm^{-1}$ in the IR analysis, and the molecular weight was found to be 641 in the mass analysis. Therefore, it was shown that the product was the third intermediate compound.

3-1-4) Synthesis of 9,9-bis(3-amino-4-hydroxyphenyl)-2,7-diphenyl-ethynylfluorene (the Bisaminophenol Having a Functional Group)

Into a 200 ml four-necked flask equipped with a thermometer, a Dimroth condenser and an inlet for nitrogen gas, 20 ml of a concentrated hydrochloric acid and 30 ml of ethanol were placed and, then, 13.7 g (0.021 moles) of the third intermediate compound obtained above was added under stirring so that the added compound floated on the fluid. To the resultant mixture, a solution obtained by dissolving 15 g of tin(II) chloride dihydrate into 20 ml of ethanol was added at a temperature of 30° C. or lower over 1 hour. After 12 hours, formed crystals were separated by filtration and recrystallized from a mixed solution of ethanol and hydrochloric acid. The obtained hydrochloride salt was hydrolyzed with water, recrystallized from ethanol and dried under a reduced pressure, and 10.4 g of a product was obtained.

When the obtained product was examined, the absorption of the ethynyl group was found at about 2,260 to 2,190 $cm^{-1}$ in the IR analysis, the absorption of proton of OH group was found at 8.8 to 9.5 ppm and the absorption of proton of $NH_2$ group was found at 4 to 4.5 ppm in the NMR analysis, and the molecular weight was found to be 581 in the mass analysis. Therefore, it was shown that the obtained compound was 9,9-bis(3-amino-4-hydroxyphenyl)-2,7-diphenylethynylfluorene (the bis-aminophenol having a functional group).

3-2) Dicarboxylic Acid Having No Substituent 2,6-Naphthalenedicarboxylic acid dichloride was synthesized from 2,6-naphthalenedicarboxylic acid as the raw material in accordance with the acid chloride reaction with thionyl chloride.

4) Preparation of a Benzoxazole Resin Precursor

Under the stream of nitrogen gas, 10.5 g (0.03 moles) of 1,3-bis(3-amino-4-hydroxyphenyl)adamantane was dissolved into 200 g of dried N-methyl-2-pyrrolidone. After 17.4 g (0.22 moles) of pyridine was added, the resultant mixture was cooled at −15° C., and 6.70 g (0.033 moles) of isophthalic acid chloride was added in small portions. After the addition was completed, the obtained mixture was stirred at −15° C. for 1 hour. Then, the temperature was adjusted at the room temperature, and the mixture was stirred at the room temperature for 5 hours. After the mixture was cooled at −15° C., 20.9 g (0.03 moles) of 9,9-bis(3-amino-4-hydroxyphenyl)-2,7-biadamantylethynylfluorene was added dropwise and dissolved homogeneously. Then, 8.62 g (0.033 moles) of 1,3-adamantane-dicarboxylic acid dichloride was added in small portions. After the addition was completed, the obtained mixture was stirred at −15° C. for 1 hour. Then, the temperature was adjusted at the room temperature, and the mixture was stirred at the room temperature for 5 hours. After the reaction mixture was cooled at −15° C., 17.4 g (0.03 moles) of 9,9-bis(3-amino-4-hydroxyphenyl)-2,7-diphenylethynylfluorene was added in small portions. After the addition was completed, the obtained mixture was stirred at −15° C. for 1 hour. Then, the temperature was adjusted at the room temperature, and the mixture was stirred at the room temperature for 5 hours. The reaction fluid was added dropwise as small droplets to 4 liters of distilled water. The formed precipitates were collected and dried, and a benzoxazole resin precursor in which the third repeating unit, the fourth repeating unit and the fifth repeating unit were bonded in blocks was obtained.

The number-average molecular weight (Mn) of the obtained benzoxazole resin precursor was obtained using GPC manufactured by TOSO Co., Ltd. and was found to be 22,500 expressed as the value of corresponding polystyrene.

Example 9

1) Bisaminophenol and Dicarboxylic Acid for the Third Repeating Unit 1-1) Bisaminophenol Having the Diamondoid Structure 1,9-bis(3-Amino-4-hydroxyphenyl)tetramantane synthesized in accordance with the same procedures as those conducted in Example 2 was used.

1-2) Dicarboxylic Acid Having a Functional Group

5-Phenylethynylisophthalic acid dichloride synthesized in accordance with the same procedures as those conducted in Example 2 was used.

2) Bisaminophenol and Dicarboxylic Acid for the Fourth Repeating Unit 2-1) Bisaminophenol Having the Diamondoid-Ethynyl Structure 9,9-bis(3-Amino-4-hydroxyphenyl)-2,7-bisadamantylethynylfluorene synthesized in accordance with the same procedures as those conducted in Example 3 was used.

2-2) Dicarboxylic Acid Having the Diamondoid Structure 1,3-Admantanedicarboxylic acid dichloride synthesized in accordance with the same procedures as those conducted in Example 3 was used.

3) Bisaminophenol and Dicarboxylic Acid for the Fifth Repeating Unit 3-1) Bisaminophenol Having No Substituent 9,9-bis(3-Amino-4-hydroxyphenyl)fluorene was synthesized by introducing nitro group at the ortho-position of hydroxyl group of 9,9-bis(4-hydroxyphenyl)fluorene used as the raw material by nitration with nitric acid, followed by conversion of the nitro group into amino group by reduction in the presence of a palladium carbon catalyst.

3-2) Dicarboxylic Acid Having a Functional Group 5-(4-Ethynylphenoxy)isophthalic acid dichloride was synthesized in accordance with the following reaction route.

3-2-1) Synthesis of dimethyl 5-(4-nitrophenoxy)isophthalate (the First Intermediate Compound)

Into a 2 liter four-necked flask equipped with a thermometer, a stirrer and a Dean-Stark distillation apparatus, 133.24 g (0.63 moles) of dimethyl 5-hydroxyisophthalate, 107.33 g (0.76 moles) of 4-fluoronitrobenzene, 760 ml of N,N-dimethylformamide and 190 ml of toluene were placed, and the resultant mixture was stirred at 165° C. for 4 hours while water formed by the reaction was removed as an azeotrope with toluene. After the reaction fluid was cooled, the reaction fluid was added into 3 liters of ion-exchanged water, and the product was precipitated. The precipitated product was separated by filtration and washed with ion-exchanged water and ethanol. The obtained light yellow solid substance was dried at 50° C. for 1 day under a reduced pressure, and 142.01 g of the first intermediate compound was obtained (the yield: 68%).

3-2-2) Synthesis of dimethyl 5-(4-aminophenoxy)isophthalate (the Second Intermediate Compound)

Into a 1 liter egg plant-shaped flask, 66.24 g (0.2 moles) of dimethyl 5-(4-nitrophenoxy)isophthalate of the first intermediate compound, 6.39 g of a 10% palladium-active charcoal, 440 ml of tetrahydrofuran and 220 ml of ethanol were placed, and the resultant mixture was stirred for 24 hours under the atmosphere of hydrogen. The reaction fluid was filtered with Celite, and the filtrate was concentrated under a reduced pressure. Hexane was added to the concentrated fluid, and formed precipitates were separated by filtration. The obtained white solid substance was dried at 50° C. for 1 day under a reduced pressure, and 55.96 g of the second intermediate compound was obtained (the yield: 93%).

3-2-3) Synthesis of dimethyl 5-(4-iodophenoxy)isophthalate (the Third Intermediate Compound)

Into a 1 liter four-necked flask equipped with a thermometer, a stirrer and a dropping funnel, 450 ml of ion-exchanged water, 75 ml of a concentrated sulfuric acid and 45.20 g (0.15 moles) of dimethyl 5-(4-aminophenoxy)isophthalate obtained above as the second intermediate compound were placed, and the resultant mixture was stirred. The flask was cooled at 5° C. or lower, and a solution prepared by dissolving 12.42 g (0.18 moles) of sodium nitrite into 25 ml of ion-exchanged water was added dropwise over 20 minutes. The resultant mixture was stirred at 5° C. or lower for 40 minutes, and an aqueous solution of a diazonium salt was obtained. To the obtained solution, a solution prepared by dissolving 27.39 g (0.165 moles) of potassium iodide into 33 ml of ion-exchanged water was added. The obtained mixture was stirred at 5° C. or lower for 1 hour and at the room temperature for 1 hour. The formed precipitates were separated by filtration, dissolved into 300 ml of ethyl acetate and washed twice with 200 ml of a 10% aqueous solution of sodium hydrogensulfite and twice with 200 ml of ion-exchanged water. After the organic layer was dried with anhydrous magnesium sulfate, the solvent was removed by distillation under a reduced pressure. A small amount of hexane was added, and a brown crude product was separated. The crude product was treated by extraction with hexane using a Soxhlet extractor. After the solvent was removed by distillation, recrystallization was conducted using methanol, and a light yellow solid substance was obtained. The solid substance separated by filtration was dried at 50° C. under a reduced pressure for 1 day, and 25.40 g of the third intermediate compound was obtained (the yield: 41%).

3-2-4) Synthesis of dimethyl 5-[4-(3-hydroxy-3-methyl-1-butyn)]phenoxy-isophthalate (the Fourth Intermediate Compound)

Into a 500 ml four-necked flask equipped with a thermometer, a Dimroth condenser and an inlet for nitrogen gas, 24.73 g (0.06 moles) of dimethyl 5-(4-iodophenoxy)isophthalate obtained above as the third intermediate compound, 0.79 g (0.003 moles) of triphenylphosphine, 0.23 g (0.0012 moles) of copper iodide, 5.55 g (0.0066 moles) of 3-methyl-1-butyn-3-ol, 72 ml of dehydrated triethylamine, 38 ml of dehydrated pyridine and 0.25 g (0.00036 moles) of dichlorobis(triphenylphosphine)palladium were placed. Under the stream of nitrogen gas, the resultant mixture was heated under the refluxing condition at 105° C. for 1 hour. Then, triethylamine and pyridine were removed by distillation under a reduced pressure, and a viscous brown solution was obtained. To the obtained viscous brown solution, 200 ml of water and 5 ml of hydrochloric acid were added, and the formed solid substance was separated by filtration and washed with 500 ml of water. The obtained solid substance was dried at 50° C. under a reduced pressure for 1 day, and 15.14 g of the fourth intermediate compound was obtained (the yield: 75%).

3-2-5) Synthesis of dipotassium 5-(4-ethynyl)phenoxyisophtalate (the Fifth Intermediate Compound)

Into a 1 liter egg plant-shaped flask, 450 ml of butanol and 47.53 g (0.32 moles) of potassium hydroxide (85%) were placed, and potassium hydroxide was dissolved by heating under the refluxing condition. To the obtained solution, 13.46 g (0.04 moles) of dimethyl 5-[4-(3-hydroxy-3-methyl-1-butyn)]phenoxyisophthalate obtained above as the fourth intermediate compound was added, and the resultant mixture was heated under the refluxing condition for 30 minutes. The resultant mixture was cooled in an ice bath, and the formed crystals were separated by filtration. The obtained crystals were washed twice with 200 ml of isopropanol, separated by filtration and dried at 50° C. under a reduced pressure, and 13.91 g of the fifth intermediate compound was obtained (the yield: 97%).

3-2-6) Synthesis of 5-(4-ethynyl)phenoxyisophthalic acid (the Sixth Intermediate Compound) from dipotassium 5-(4-ethynyl)phenoxy-isophthalate Dipotassium 5-(4-ethynyl)phenoxyisophtalate obtained above as the fifth intermediate compound in an amount of 7.17 g (0.02 moles) was dissolved into 40 ml of ion-exchanged water, and insoluble components were removed by passing through a 5° C. filter paper. Hydrochloric acid was added to the obtained filtrate under stirring until pH became 1. The formed solid substance was separated by filtration, washed twice with ion-exchanged water and filtered twice. The obtained solid substance was dried at 50° C. under a reduced pressure, and 5.42 g of the sixth intermediate compound was obtained (the yield: 96%).

3-2-7) Synthesis of 5-(4-ethynyl)phenoxyisophthalic acid dichloride from 5-(4-ethynyl)phenoxyisophthalic acid Into a 500 ml four-necked flask equipped with a thermometer and a Dimroth condenser, 9.88 g (0.035 moles) of 5-(4-ethynyl)phenoxy-isophthalic acid as the sixth intermediate compound, 100 ml of 1,2-dichloroethane, 9.16 g (0.077 moles) of thionyl chloride and 8.0 mg (0.00035 moles) of triethylammonium benzyl chloride were placed, and the resultant mixture was heated under the refluxing condition for 3 hours. The obtained solution was filtered in the hot condition. After the solution was concentrated by removing the solvent under a reduced pressure, recrystallization was conducted by adding hexane. The obtained solid substance was dried under a reduced pressure, and 5.14 g of a product was obtained as light yellow crystals having a melting point of 68 to 69° C. (the yield: 46%).

4) Preparation of a benzoxazole Resin Precursor

Under the stream of nitrogen gas, 15.2 g (0.03 moles) of 1,9-bis(3-amino-4-hydroxyphenyl)tetramantane, 20.9 g (0.03 moles) of 9,9-bis(3-amino-4-hydroxyphenyl)-2,7-adamantylethynylfluorene and 11.4 g (0.03 moles) of 9,9-bis(3-amino-4-hydroxyphenyl)fluorene were dissolved into 200 g of dried N-methyl-2-pyrrolidone. After 17.4 g (0.22 moles) of pyridine was added, the resultant mixture was cooled at −15° C., and 10.0 g (0.033 moles) of 5-phenylethynylisophthalic acid dichloride, 8.62 g (0.033 moles) of 1,3-adamantanedicarboxylic acid dichloride and 10.5 g (0.033 moles) of 5-(4-ethynylphenoxy)isophthalic acid dichloride were added in small portions. After the addition was completed, the obtained mixture was stirred at −15° C. for 1 hour. Then, the temperature was adjusted at the room temperature, and the mixture was stirred at the room temperature for 5 hours. Then, the reaction fluid was added dropwise as small droplets to 4 liters of distilled water. The formed precipitates were collected and dried, and a benzoxazole resin precursor comprising the third repeating unit, the fourth repeating unit and the fifth repeating unit which are randomly bonded was obtained.

The number-average molecular weight (Mn) of the obtained benzoxazole resin precursor was obtained using GPC manufactured by TOSO Co., Ltd. and was found to be 20,500 expressed as the value of corresponding polystyrene.

Example 10

1) Bisaminophenol Having a Functional Group 9,9-bis(3-Amino-4-hydroxyphenyl)-2,7-diphenylethynylfluorene was obtained in accordance with the same procedures as those conducted in 3-1) of Example 8.

2) Dicarboxylic Acid Compound Having the Diamondoid Structure and a Functional Group 5-[3-(1,1'-Biadamantane)]ethynylisophthalic acid dichloride was synthesized in accordance with the following process.

2-1) Synthesis of 3-ethynyl(1,1'-biadamantane)

A 500 ml four-necked flask equipped with a thermometer, a stirrer and a dropping funnel was cooled at −30° C. in advance. Into the cooled flask, 250 ml of vinyl bromide and 20.3 g (0.058 moles) of 3-bromo(1,1'-biadamantane) were placed and, then, 6.0 g (0.022 moles) of aluminum bromide was added in small portions under stirring. The reaction was allowed to proceed −30° C. at for 1 hour. The obtained reaction mixture was diluted with 250 ml of methylene chloride and slowly added dropwise into 2 liters of a 2% aqueous solution of hydrochloric acid. The organic layer was separated, and the aqueous layer was treated by extraction three times with methylene chloride. The organic layer and the extracts were combined and washed twice with 200 ml of a 2% aqueous solution of hydrochloric acid, twice with 200 ml of ion-exchanged water and twice with 200 ml of an aqueous solution of sodium chloride. The organic layer was dried with anhydrous magnesium sulfate. The solvent was removed by distillation under a reduced pressure, and a crude product was obtained.

In a 500 ml four-necked flask equipped with a thermometer, a stirrer and a dropping funnel, the crude product was dissolved into 250 ml of dimethyl sulfoxide, and 31.4 g (0.28 moles) of potassium tert-butoxide was added at the room temperature. The obtained solution was stirred at the room temperature for 3 days. The obtained solution was then diluted with 250 ml of methylene chloride and slowly added dropwise into 2 liters of ice water. The organic layer was separated, and the aqueous layer was treated by extraction with methylene chloride. The organic layer and the extracts were combined and washed 5 times with 200 ml of ion-exchanged water and once with 200 ml of an aqueous solution of sodium chloride. The organic layer was dried with anhydrous magnesium sulfate. The solvent was removed by distillation under a reduced pressure, and a crude product was obtained. The crude product was purified with silica gel (90% hexane/methylene chloride), and 3-ethynyl(1,1'-biadamantane) was obtained (the yield: 61%).

2-2) Synthesis of 5-[3-(1,1'-biadamantane)]ethynylisophthalic acid dichloride The synthesis was conducted in accordance with the same procedures as those conducted in the synthesis of the dicarboxylic acid having a functional group in 3-3) to 3-5) of Example 2 except that 3-ethynyl(1,1'-biadamantane) synthesized in 2-1) was used in place of phenylacetylene used in Example 2.

3) Preparation of a Benzoxazole Resin Precursor

The reaction was conducted in accordance with the same procedures as those conducted in 3) of Example 1 except that, in the preparation of a benzoxazole resin precursor, 52.3 g (0.09 moles) of 9,9-bis(3-amino-4-hydroxyphenyl)-2,7-diphenylethynylfluorene obtained above was used in place of 31.5 g (0.09 moles) of 1,3-bis(3-amino-4-hydroxyphenyl) adamantane used in Example 1 and 49.5 g (0.1 mole) of 5-[3-(1,1'-biadamantane)]isophthalic acid dichloride was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 21,000 expressed as the value of corresponding polystyrene.

Example 11

1) Synthesis of a Bisaminophenol Having the Diamondoid Structure 3,3'''-bis-4-(4-Amino-3-hydroxyphenoxy)phenyl]-1,1',1'', 1'''-tetraadamantane was obtained in accordance with the following 5 steps.

1-1) Synthesis of 1,1',1'',1'''-tetraadamantane 1,1',1'',1'''-Tetraadamantane was synthesized in accordance with the process of Matsuoka et al. [Polymer Preprints, Japan, Vol. 50, No. 2, p 277 (2001)].

1-2) Synthesis of 3,3'''-dibromotetraadamantane

Into a 500 ml four-necked flask equipped with a thermometer, a stirrer and a reflux condenser, 200 ml of carbon tetrachloride and 10 g (0.063 moles) of bromine were placed, and 30.7 g (0.057 moles) of 1,1',1'',1'''-tetraadamantane obtained above was added in small portions under stirring. The temperature at the inside of the flask was kept at 20 to 30° C. during the addition. After the addition was completed and the elevation of the temperature ceased, the reaction was allowed to proceed for further 1 hour. Then, the reaction product was added into about 500 ml of cold water, and a crude product was separated by filtration, washed with pure water and dried. The obtained crude product was recrystallized from hot ethanol. The obtained product of recrystallization was dried under a reduced pressure, and 31.8 g of a product was obtained. When the obtained product was examined, the absorption of bromo group was found at about 690 to 515 $cm^{-1}$ in the IR analysis, and the molecular weight was found to be 697 in the mass analysis. Therefore, it was shown that the product was 3,3'''-dibromo-1,1',1'',1'''-tetraadamantane.

1-3) Synthesis of 3,3'''-bis(4-hydroxyphenyl)-1,1',1'', 1'''-tetraadamantane A 500 ml five-necked flask equipped with a thermometer, a stirrer, a reflux condenser, an inlet for nitrogen gas and a discharge pipe connected to a trap containing a 30% by weight aqueous solution of sodium hydroxide was cooled in an ice bath. Into the cooled flask, 15.3 g (0.022 moles) of 3,3'''-dibromo-1,1',1'',1'''-tetraadamantane obtained above, 200 ml of phenol and 2.6 g (0.01 mole) of aluminum tribromide were placed and, then, the resultant mixture was stirred at 0° C. for 6 hours and, then, the reaction was allowed to proceed under heating at 60° C. for 4 hours. The reaction product was poured into 2,000 liters of acidic ice water. After the ice melted, an organic layer was taken out, washed with pure water and a saturated aqueous solution of sodium chloride and poured into methanol to separate a product. The obtained product was dried under a reduced pressure, and 12.7 g of a product was obtained.

When the obtained product was examined, the absorption of hydroxyl group was found at 3,550 to 3,200 $cm^{-1}$ in the IR analysis, and the molecular weight was found to be 723 in the mass analysis. Therefore, it was shown that the product was 3,3'''-bis(4-hydroxyphenyl)-1,1',1'',1'''-tetraadamantane.

1-4) Synthesis of 3,3'''-bis[(3-benzyloxy-4-nitrophenoxy)phenyl]tetra-adamantane To a solution containing 88.2 g (0.122 moles) of 3,3'''-bis (4-hydroxy-phenyl)-1,1',1'',1'''-tetraadamantane obtained by the repeated operations of the above procedures, 36.2 g (0.146 moles) of 3-fluoro-6-nitrophenyl benzyl ether and 300 ml of N,N-dimethylformamide, 42.1 g (0.304 moles) of potassium carbonate was added. After the resultant mixture was stirred at 135° C. for 12 hours, the reaction fluid was filtered. The filtrate was added dropwise to 2,000 ml of ion-exchanged water. The separated solid substance was washed twice with 2000 ml of methanol and dried at 50° C. under a reduced pressure for 2 days, and 129.3 g of 3,3'''-bis[(3-benzyloxy-4-nitrophenoxy)phenyl]tetraadamantane was obtained.

When the obtained product was examined, the absorption of nitro group was found at about 1,500 cm$^{-1}$ and 1,370 cm$^{-1}$ in the IR analysis, and the molecular weight was found to be 1,178 in the mass analysis. Therefore, it was shown that the product was the object compound.

1-5) Synthesis of 3,3'''-bis[4-(4-amino-3-hydroxyphenoxy)phenyl]-1,1',1'',1'''-tetraadamantane Under the atmosphere of hydrogen, 104.6 g (0.0888 moles) of 3,3'''-bis[(3-benzyloxy-4-nitrophenoxy)phenyl]-1,1',1'', 1'''-tetraadamantane obtained above, 4.96 g (4.66 mmole) of a 10% palladium active charcoal and 300 ml of N,N-dimethylformamide were stirred at the room temperature for 36 hours. After the reaction fluid was filtered, the filtrate was added dropwise to a mixture of 200 ml of methanol and 2,000 ml of ion-exchanged water. The formed solid substance was washed three times with a mixed solvent of 200 ml of methanol and 2,000 ml of ion-exchanged water and dried at 50° C. under a reduced pressure for 2 days, and 66.6 g of a product was obtained.

When the obtained product was examined, the absorption of proton of OH group was found at 8.8 to 9.5 ppm and the absorption of proton of NH$_2$ group was found at 4 to 4.5 ppm in the NMR analysis, and the molecular weight was found to be 937 in the mass analysis. Therefore, it was shown that the product was 3,3'''-bis-[4-(4-amino-3-hydroxyphenoxy)-phenyl]-1,1',1'',1'''-tetraadamantane.

2) Synthesis of a Dicarboxylic Acid Having the Diamondoid Structure 3,3'''-bis(4-Carboxyphenyl)-1,1',1'',1'''-tetraadamantane was obtained in accordance with the following 5 steps.

2-1) Synthesis of 3,3'''-bis(4-bromophenyl)-1,1',1'', 1'''-tetraadamantane

A 500 ml five-necked flask equipped with a thermometer, a stirrer, a reflux condenser, an inlet for nitrogen gas and a discharge pipe connected to a trap containing a 30% by weight aqueous solution of sodium hydroxide was cooled in an ice bath. Into the cooled flask, 15.3 g (0.022 moles) of 3,3'''-dibromo-1,1',1'',1'''-tetraadamantane obtained in accordance with the same procedures as those conducted in 1-1) and 1-2) of Example 11, 200 ml of bromobenzene and 2.6 g (0.01 mole) of aluminum tribromide were placed. The resultant mixture was stirred at 0° C. for 6 hours and, then, the reaction was allowed to proceed under heating at 60° C. for 4 hours. The reaction product was poured into 2,000 liters of acidic ice water. After the ice melted, an organic layer was taken out, washed with pure water and a saturated aqueous solution of sodium chloride and poured into methanol to separate a product. The obtained product was dried under a reduced pressure, and 13.1 g of a product was obtained.

When the obtained product was examined, the absorption of bromo group was found at about 690 to 515 cm$^{-1}$ in the IR analysis, the content of Br was 18.8% in the elemental analysis, and the molecular weight was found to be 849 in the mass analysis. Therefore, it was shown that the product was 3,3'''-bis(4-bromophenyl)-1,1',1'',1'''-tetraadamantane.

2-2) Synthesis of 3,3'''-bis(4-carboxyphenyl)-1,1',1'', 1'''-tetraadamantane

Into a 1 liter four-necked flask equipped with a thermometer, a stirrer and a reflux condenser, 260 ml of dry ether and 68.8 g (0.081 moles) of 3,3'''-bis(4-bromophenyl)-1,1',1'',1'''-tetraadamantane obtained by repeating the operations of the above procedures were placed, and a solution prepared by dissolving 15.1 g (0.235 moles) of butyllithium in 65 ml of dry ether was added in small portions under stirring. The temperature at the inside of the flask was kept at 10° C. or lower during the addition. After the addition was completed and the elevation of the temperature ceased, the reaction was allowed to proceed for further 1 hour by heating under the refluxing condition. Then, the reaction fluid was poured to 325 g (7.38 moles) of crushed dry ice, and the extraction with a 5% solution of potassium hydroxide was conducted after 30 minutes. By adjusting the filtrate to an acidic condition with hydrochloric acid, 3,3'''-bis(4-carboxyphenyl)-1,1',1'',1'''-tetraadamantane was precipitated, then, separated by filtration, washed with pure water and dried. The obtained crude product was purified by recrystallization from hot ethanol. The obtained solid substance was dried under a reduced pressure, and 36.6 g of a product was obtained (the yield: 58%). When the obtained product was examined, the absorption of carboxylic acid group was found at about 1,710 cm$^{-1}$ to 1,680 cm$^{-1}$ in the IR analysis, and the molecular weight was fount to be 779 in the mass analysis. Therefore, it was shown that the product was the object compound.

2-3) Synthesis of 3,3'''-(1,1',1'',1'''-tetraadamantane)-bis(4-benzoic acid dichloride)

Into a 500 ml four-necked flask equipped with a thermometer and a Dimroth condenser, 27.3 g (0.035 moles) of 3,3'''-bis(4-carboxyphenyl)-1,1',1'',1'''-tetraadamantane synthesized above, 100 ml of 1,2-dichloro-ethane, 9.16 g (0.077 moles) of thionyl chloride and 8.0 mg (0.00035 moles) of triethylammonium benzyl chloride were placed, and the resultant mixture was heated under the refluxing condition for 3 hours. The solution was filtered in the hot condition. After the solution was concentrated under a reduced pressure, recrystallization was conducted by adding hexane. The obtained solid substance was dried under a reduced pressure, and 19.4 g of a product was obtained.

When the obtained product was examined, the absorption of the acid chloride group was found at about 1815 to 1785 cm$^{-1}$ in the IR analysis, and the molecular weight was found to be 816 in the mass analysis. Therefore, it was shown that the obtained compound was the object compound.

3) Preparation of a Benzoxazole Resin Precursor

The reaction was conducted in accordance with the same procedures as those conducted in 3) of Example 1 except that, in the preparation of a benzoxazole resin precursor, 84.4 g (0.09 moles) of 3,3'''-bis[4-(4-amino-3-hydroxyphenoxy)phenyl]-1,1',1'',1'''-tetraadamantane obtained by repeating the above procedures was used in place of 31.5 g (0.09 moles) of 1,3-bis(3-amino-4-hydroxyphenyl)adamantane used in Example 1 and 81.6 g (0.1 mole) of 3,3'''-(1,1',1'',1'''-tetraadamantane)-bis(4-benzoic acid dichloride) obtained by repeating the above procedures was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 25,000 expressed as the value of corresponding polystyrene.

Example 12

1) Synthesis of a Bisaminophenol Compound Having the Diamondoid Structure 3,3'''-bis(3-Amino-4-hydroxyphenyl)-1,1',1'',1'''-tetraadamantane was obtained in accordance with the following two steps.

1-1) Synthesis of 3,3'''-bis(3-nitro-4-hydroxyphenyl)-1,1',1'',1'''-tetra-adamantane Into a 500 ml four-necked flask equipped with a thermometer, a stirrer and a reflux condenser, 200 ml (0.64 moles) of a 20% aqueous solution of nitric acid was placed, and 79.5 g (0.11 moles) of 1,3-bis(4-hydroxyphenyl)-1,1',1'',1'''-tetraadamantane obtained in accordance with the same procedures as those conducted in Example 11 was added in small portions under vigorous stirring. The temperature at the inside of the flask was kept at 20 to 30° C. during the addition. After the addition was completed and the elevation of the temperature ceased, the reaction was allowed to proceed for further 1 hour. Then, the reaction product was poured into about 500 ml of cold water, and a crude product was separated by filtration, washed with pure water and dried. The obtained crude product was recrystallized from hot ethanol.

The obtained product of recrystallization was dried under a reduced pressure, and 71.5 g of a product was obtained.

When the obtained product was examined, the absorption of nitro group was found at about 1,500 cm$^{-1}$ and 1,370 cm$^{-1}$ in the IR analysis, and the molecular weight was found to be 813 in the mass analysis. Therefore, it was shown that the product was 3,3'''-bis(3-nitro-4-hydroxy-phenyl)-1,1',1'',1'''-tetraadamantane.

1-2) Synthesis of 3,3'''-bis(3-amino-4-hydroxyphenyl)-1,1',1'',1'''-tetra-adamantane Into a 200 ml four-necked flask equipped with a thermometer, a Dimroth condenser and an inlet for nitrogen gas, 20 ml of a concentrated hydrochloric acid and 30 ml of ethanol were placed and, then, 17.1 g (0.021 moles) of 3,3'''-bis(3-nitro-4-hydroxyphenyl)-1,1',1'',1'''-tetra-adamantane obtained above was added under stirring so that the added compound floated on the fluid. To the resultant mixture, a solution obtained by dissolving 15 g of tin(II) chloride dihydrate into 20 ml of ethanol was added at a temperature of 30° C. or lower over 1 hour. After 12 hours, the formed crystals were separated by filtration and recrystallized from a mixed solution of ethanol and hydrochloric acid. The obtained hydrochloride salt was hydrolyzed with water, recrystallized from ethanol and dried under a reduced pressure, and 12.7 g of a product was obtained.

When the obtained product was examined, the absorption of proton of OH group was found at 8.8 to 9.5 ppm and the absorption of proton of NH$_2$ group was found at 4 to 4.5 ppm in the NMR analysis, and the molecular weight was found to be 753 in the mass analysis. Therefore, it was shown that the product was 3,3'''-bis(3-amino-4-hydroxyphenyl)-1,1',1'',1'''-tetraadamantane.

2) Synthesis of a Dicarboxylic Acid Having the Diamondoid Structure 3,3'''-bis[4-(4-Carboxyphenoxy)phenyl]-1,1',1'',1'''-tetraadamantane was synthesized in accordance with the following 3 steps.

2-1) Synthesis of 3,3'''-bis[(4-carboxymethylphenoxy)phenyl]-1,1',1'',1'''-tetraadamantane To a solution containing 88.2 g (0.122 moles) of 3,3'''-bis(4-hydroxy-phenyl)-1,1',1'',1'''-tetraadamantane synthesized in accordance with the same procedures as those conducted in Example 11, 65.4 g (0.146 moles) of methyl 4-bromobenzoate and 300 ml of N,N-dimethylformamide, 42.1 g (0.304 moles) of potassium carbonate was added. After the obtained mixture was stirred at 135° C. for 12 hours, the reaction fluid was filtered. The filtrate was added dropwise to 2,000 ml of ion-exchanged water. The formed solid substance was washed twice with 2,000 ml of methanol and dried at 50° C. under a reduced pressure for 2 days, and 96.9 g of 3,3'''-bis[(4-carboxymethylphenoxy)phenyl]-1,1',1'',1'''-tetraadamantane was obtained.

When the obtained product was examined, the absorption of the ester group was found at about 1,730 to 1,715 cm$^{-1}$ in the IR analysis, and the molecular weight was found to be 991 in the mass analysis. Therefore, it was shown that the obtained compound was the object compound.

2-2) Synthesis of 3,3'''-(1,1',1'',1'''-tetraadamantane)bis(4-phenoxy-4-benzoic acid dipotassium salt)

Into a 5 liter four-necked flask equipped with a thermometer, a Dimroth condenser and a stirrer, 3 liters of n-butanol and 180 g (2.72 moles) of potassium hydroxide (85%) were placed, and potassium hydroxide was dissolved by heating under the refluxing condition. To the obtained solution, 269.6 g (0.272 moles) of 3,3'''-bis[(4-carboxymethyl-phenoxy)phenyl]-1,1',1'',1'''-tetraadamantane obtained by repeating the above procedures was added, and the resultant mixture was heated under the refluxing condition for 30 minutes. The resultant mixture was cooled in an ice bath, and the formed crystals were separated by filtration. The obtained crystals were washed twice with 1 liter of ethanol and dried at 60° C. under a reduced pressure, and 269.5 g of a product was obtained.

When the obtained product was examined, the absorption of the potassium salt of the carboxylic acid was found at about 690 to 515 cm$^{-1}$ in the IR analysis, the content of K was found to be 7.5% in the elemental analysis; and the molecular weight was found to be 1,039 in the mass analysis. Therefore, it was shown that the product was 3,3'''-(1,1',1'',1'''-tetraadamantane)bis(4-phenoxy-4-benzoic acid dipotassium salt).

2-3) Synthesis of 3,3'''-(1,1',1'',1'''-tetraadamantane)bis(4-phenoxy-4-benzoic acid dichloride)

Into a 2 liter four-necked flask equipped with a thermometer, a Dimroth condenser and a stirrer, 249.5 g (0.24 moles) of 3,3'''-(1,1',1'',1'''-tetraadamantane)bis(4-phenoxy-4-benzoic acid dipotassium salt) obtained above and 600 ml of 1,2-dichloroethane were placed, and the resultant mixture was cooled at 0° C. To the cooled mixture, 391 g (4.5 moles)

of thionyl chloride was added dropwise at 5° C. or lower over 1 hour. Then, 4 ml of dimethylformamide and 4 g of hydroquinone were added, and the obtained mixture was stirred at 45 to 50° C. for 3 hours. After the reaction mixture was cooled, formed crystals were separated by filtration and washed with 150 ml of chloroform. The filtrate and the washing fluid were combined and concentrated at 40° C. or lower under a reduced pressure. The obtained residue was treated twice by extraction with 200 ml of diethyl ether. Diethyl ether was removed from the extract by distillation under a reduced pressure, and a crude product of a semisolid substance was obtained. The crude product was washed with dried n-hexane and recrystallized from diethyl ether, and 118.5 g of 3,3'''-(1,1',1'',1'''-tetraadamantane)bis(4-phenoxy-4-benzoic acid dichloride) was obtained.

When the obtained product was examined, the absorption of the acid chloride group was found at about 1815 to 1,785 $cm^{-1}$ in the IR analysis, and the molecular weight was found to be 1,000 in the mass analysis. Therefore, it was shown that the obtained product was the object compound.

3) Preparation of a Benzoxazole Resin Precursor

The reaction was conducted in accordance with the same procedures as those conducted in 3) of Example 1 except that, in the preparation of a benzoxazole resin precursor, 73.2 g (0.09 moles) of 3,3'''-bis(3-amino-4-hydroxyphenyl)-1,1',1'',1'''-tetraadamantane obtained by repeating the above procedures was used in place of 31.5 g (0.09 moles) of 1,3-bis(3-amino-4-hydroxyphenyl)adamantane used in Example 1 and 100.0 g (0.1 mole) of 3,3'''-(1,1',1'',1'''-tetraadamantane)bis(4-phenoxy-4-benzoic acid dichloride) obtained above was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 24,000 expressed as the value of corresponding polystyrene.

Example 13

1) Synthesis of 1,1'-bi(diamantane)

Into a 500 ml four-necked flask equipped with a thermometer, a stirrer and a reflux condenser, 4.6 g (0.2 moles) of sodium metal and 200 ml of n-octane were placed, and the temperature at the inside of the flask was cooled at 0° C. Into the cooled flask, 26.7 g (0.1 mole) of 1-diamantane dissolved in 100 ml of n-octane in advance was slowly added dropwise under vigorous stirring. The temperature at the inside of the flask was kept at 0 to 5° C. during the addition. After the addition was completed and the elevation of the temperature ceased, the reaction was allowed to proceed for further 1 hour. Then, the reaction mixture was poured into about 500 ml of cold water, and a crude product was separated by filtration, washed with pure water and dried. The obtained crude product was recrystallized from hot hexane. The obtained product of recrystallization was dried under a reduced pressure, and 26.2 g of a product was obtained.

When the obtained product was examined, the absorption of Br group (at about 690 to 515 $cm^{-1}$) disappeared in the IR analysis, and the molecular weight was found to be 375 in the mass analysis. Therefore, it was shown that the product was 1,1'-bi(diamantane).

2) Synthesis of 6,6'-dibromo-1,1'-bi(diamantane)

The reaction was conducted in accordance with the same procedures as those conducted in 1-2) of Example 2 except that 21.4 g (0.057 moles) of 1,1'-bi(diamantane) synthesized above was used in place of tetramantane used in 1-2) of Example 2, and the object compound was obtained. When the obtained product was examined, the absorption of the bromo group was found at 690 to 515 $cm^{-1}$ in the IR analysis, and the molecular weight was 532 in the mass analysis. Therefore, it was shown that the product was 6,6'-dibromo-1,1'-bi(diamantane).

3) Synthesis of 6,6'-bis(3-amino-4-hydroxyphenyl)-1,1'-bi(diamantane)

The reaction was conducted in accordance with the same procedures as those conducted in 1) of Example 1 except that 11.7 g (0.057 moles) of 6,6'-dibromo-1,1'-bi(diamantane) was used in place of 6.47 g (0.022 moles) of 1,3-dibromoadamantane used in 1) of Example 1, and 6,6'-bis(3-amino-4-hydroxyphenyl)-1,1'-bi(diamantane) was obtained in 3 steps.

4) Synthesis of 1,1'-bi(diamantane)-6,6'-dicarboxylic acid dichloride 4-1) Synthesis of 1,1'-bi(diamantane)-6,6'-dicarboxylic acid Into a 500 ml four-necked flask equipped with a thermometer, a stirrer and a reflux condenser, 100 ml of a 96% aqueous solution of sulfuric acid was placed and cooled at 0° C. Under vigorous stirring, several drops of formic acid and 1.74 g (0.327 mmol) of 6,6'-dibromo-1,1'-bi(diamantane) dissolved into 50 ml of carbon tetrachloride in advance were added. Then, 25 ml of a 98% formic acid was slowly added dropwise over 4 hours.

The reaction mixture was poured into about 500 ml of cold water, and a product was obtained by extraction with 100 ml of ether. Ether was removed by vaporization, and an extract was obtained. The obtained extract was dissolved into a 5% aqueous ammonium solution. After the solution was adjusted at an acidic condition with hydrochloric acid, the solution was treated by extraction with ether. The extract was washed with water and dried with anhydrous sodium sulfate. Ether was removed by vaporization, and 1.1 g of a product was obtained.

When the obtained product was examined, the absorption of Br group (at about 690 to 515 $cm^{-1}$) disappeared and the absorption of carboxylic acid was found at 1720 to 1706 $cm^{-1}$ in the IR analysis, and the molecular weight was found to be 463 in the mass analysis. Therefore, it was shown that the product was 1,1'-bi(diamantane)-6,6'-dicarboxylic acid.

4-2) 1,1'-bi(diamantane)-6,6'-dicarboxylic acid dichloride

The reaction was conducted in accordance with the same procedures as those conducted in 2-3) of Example 11 except that 16.2 g (0.035 moles) of 1,1'-bi(diamantane)-6,6'-dicarboxylic acid was used in place of 27.3 g (0.035 moles) of 3,3'''-bis(4-carboxyphenyl)-1,1',1'',1'''-tetra-adamantane.

When the obtained product was examine, the absorption of the acid chloride group was found at about 1815 to 1785 $cm^{-1}$ in the IR analysis, and the molecular weight was found to be 500 in the mass analysis. Therefore, it was shown that the obtained compound was the object compound.

5) Preparation of a Benzoxazole Resin Precursor

The reaction was conducted in accordance with the same procedures as those conducted in 3) of Example 1 except that, in the preparation of a benzoxazole resin precursor, 53.01 g (0.09 moles) of 6,6'-bis(3-amino-4-hydroxyphenyl)-1,1'-bi (diamantane) obtained above was used in place of 31.5 g (0.09 moles) of 1,3-bis(3-amino-4-hydroxyphenyl)-adamantane used in Example 1 and 50.0 g (0.1 mole) of 1,1'-bi (diamantane)-6,6'-dicarboxylic acid dichloride obtained by repeating the above procedures was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 20,000 expressed as the value of corresponding polystyrene.

Example 14

1) Synthesis of 3,3'-bis(3-amino-4-hydroxyphenyl)(5,5',7,7'-tetramethyl)-1,1'-biadamantane 1-1) Synthesis of 3,3',5,5'-tetramethyl-1,1'-biadamantane Into a 2 liter egg plant-shaped flask, 9.8 g (0.4 moles) of magnesium was weighed and placed. Under the stream of nitrogen gas, 80 ml of diethyl ether was added and stirred. Then, a solution prepared by dissolving 97.28 g (0.4 moles) of 3,5-dimethyl-1-bromoadamantane into 40 ml of diethyl ether was added dropwise. After the addition was completed, the resultant mixture was heated under the refluxing condition for 30 minutes. The temperature was adjusted at the room temperature, and diethyl ether was completely removed using a vacuum pump. Then, a solution prepared by dissolving 48.64 g (0.2 moles) of 3,5-dimethyl-1-bromoadamantane into 600 ml of dichloromethane was added dropwise. After the addition was completed, the resultant mixture was heated under the refluxing condition for 5 hours. The reaction fluid was poured into 400 ml of ion-exchanged water and treated by extraction with dichloromethane using a separation funnel. The solvent was removed using an evaporator. The residue was dissolved into 40 ml of hexane and purified in accordance with the silica gel column chromatography (the solvent of development: hexane). The solvent was removed using an evaporator, and 30.70 g of 3,3',5,5'-tetramethyl-1,1'-biadamantane was obtained (the yield: 47%). Since the molecular weight was 327 in the mass analysis, it was shown that the product was the object compound.

1-2) Synthesis of 3,3'-dibromo-5,5',7,7'-tetramethyl-1,1'-biadamantane

Into a 500 ml egg plant-shaped flask, 30.08 g (0.092 moles) of 3,3',5,5'-tetramethyl-1,1'-biadamantane obtained above was weighed and placed. Under the stream of nitrogen gas, 200 ml of cyclohexane was added, and a solution was prepared. While the solution was kept at 0° C. in an ice bath, 39.2 g (0.252 moles) of t-butyl bromide and 1.6 g (0.0056 moles) of aluminum bromide were added, and the reaction was allowed to proceed for 2 hours. To the reaction fluid, 200 ml of ion-exchanged water was added, and the extraction with cyclohexane was conducted using a separation funnel. The solvent was removed using an evaporator, and 39.66 g of 3,3'-dibromo-5,5',7,7'-tetramethyl-1,1'-biadamantane of the object compound was obtained (the yield: 89%). Since the molecular weight was 484 in the mass analysis, it was shown that the product was the object compound.

1-3) Synthesis of 3,3'-bis(4-hydroxyphenyl)(5,5',7,7'-tetramethyl)-1,1'-biadamantane Into a 5 liter four-necked separable flask equipped with a thermometer, a stirrer, an inlet for nitrogen gas and a reflux condenser, 48.4 g (0.1 mole) of 3,3'-dibromo-5,5',7,7'-tetramethyl-1,1'-biadamantane and 688 g (7.3 moles) of phenol were placed, and the resultant mixture was heated under the refluxing condition at 155° C. for 30 minutes. After the mixture was cooled at the room temperature, 4.3 liters of pure water was added, and the obtained mixture was heated under the refluxing condition at 80° C. for 10 minutes. The formed precipitates were separated by filtration, and the solid substance was mixed with 7 liters of pure water and stirred for 10 minutes. The solid substance was separated by filtration and dried at 60° C. under a reduced pressure for 24 hours, and 50.6 g of 3,3'-bis(4-hydroxyphenyl)(5,5',7,7'-tetramethyl)-1,1'-biadamantane was obtained (the yield: 99%).

When the obtained product was examined, the molecular weight was found to be 511 in the mass analysis, and peaks of proton were found at 9.10 ppm (2H), 7.12 ppm (4H), 6.67 ppm (4H), 1.42-1.05 ppm (24H) and 0.86 ppm (12H) in the NMR analysis in a DMSO-$d_6$ solution. Therefore, it was shown that the obtained product was the object compound.

1-4) Synthesis of 3,3'-bis(3-nitro-4-hydroxyphenyl)(5,5',7,7'-tetramethyl)-1,1'-biadamantane Into a 1 liter four-necked flask equipped with a thermometer, an inlet for nitrogen gas and a stirrer, 51.08 g (0.100 mole) of 3,3'-bis(4-hydroxyphenyl)(5,5',7,7'-tetramethyl)-1,1'-biadamantane obtained above and 770 ml of dichloroethane were placed, and a stream of nitrogen gas was introduced into the flask. While the flask was cooled in a methanol/ice bath under stirring, 25.20 g (0.240 moles) of a 60% by weight aqueous solution of nitric acid was added dropwise. The resultant mixture was stirred at a temperature of the inside of the flask of 0° C. or lower for 30 minutes, at a temperature of 0 to 5° C. in a water/ice bath for 3 hours and at the room temperature without using the water/ice bath for 15 minutes. The reaction fluid was filtered. A yellow solid substance obtained by the filtration was washed 3 times with 1,500 ml of ion-exchanged water and dried at 60° C. under a reduced pressure for 1 day, and 35.44 g of 3,3'-bis(3-nitro-4-hydroxyphenyl)(5,5',7,7'-tetramethyl)-1,1'-biadamantane was obtained (the yield: 59%).

The obtained product was yellow powder. In the NMR analysis shown in the following, it was shown that the product was the object compound.

$^1$H-NMR (δ/ppm. DMSO-$D_6$): 0.88 (s, Me, 12H), 1.07 (m, Adm), 1.09-1.30 (m, Adm), 1.33-1.47 (m, Adm), 7.05 (D, PH, 2H), 7.60 (D, PH, 2H), 7.75 (s, PH, 2H)

1-5) Synthesis of 3,3'-bis(3-amino-4-hydroxyphenyl)(5,5',7,7'-tetra-methyl)-1,1'-biadamantane Under the atmosphere of hydrogen, 35.44 g (0.059 moles) of 3,3'-bis(3-nitro-4-hydroxyphenyl)(5,5',7,7'-tetramethyl)-1,1'-biadamantane obtained above, 2.50 g (0.00118 moles) of a 10% palladium active charcoal, 350 ml of tetrahydrofuran and 71 ml of N-methylpyrrolidone were stirred at the room temperature for 26 hours. Then, 35 ml of N-methyl-pyrrolidone was added and, after the resultant mixture was stirred for 15 minutes, the reaction fluid was filtered. The filtrate was added dropwise to 1,420 ml of ion-exchanged water. The formed solid substance was washed 3 times with a mixed solvent of 710 ml of methanol and 710 ml of ion-exchanged water and dried at 60° C. under a reduced pressure for 2 days, and 5.74 g of 3,3'-bis(3-amino-4-hydroxyphenyl)(5,5',7,7'-tetra-methyl)-1,1'-biadamantane was obtained (the yield: 18%). The obtained product was purple granules. When the obtained product was examined, the molecular weight was found to be 541 in the mass analysis, and the following results were obtained in the NMR analysis. Therefore, it was shown that the product was the object compound $^1$H-NMR (δ/ppm. DMSO-D$_6$): 0.86 (s, Me, 12H), 1.05 (m, Adm), 1.19-1.27 (m, Adm), 1.37-1.40 (m, Adm), 4.38 (s, NH2), 6.33 (D, PH, 2H), 6.53 (D, PH, 2H), 6.61 (s, PH, 2H), 8.70 (s, OH)

2) Synthesis of 5,5',7,7'-tetramethyl-1,1'-biadamantane-3,3'-dicarboxylic acid dichloride

2-1) Synthesis of 5,5',7,7'-tetramethyl-1,1'-biadamantane-3,3'-dicarboxylic acid Into a 1 liter four-necked flask equipped with a thermometer, a stirrer and a reflux condenser, 260 ml of dry ether and 39.23 g (0.081 moles) of 3,3'-dibromo-5,5',7,7'-tetramethyl-1,1'-biadamantane obtained above in 1-2) were placed, and a solution prepared by dissolving 15.1 g (0.235 moles) of butyllithium in 65 ml of dry ether was added in small portions under stirring. The temperature at the inside of the flask was kept at 10° C. or lower during the addition. After the addition was completed and the elevation of the temperature ceased, the reaction was allowed to proceed for further 1 hour by heating under the refluxing condition. Then, the reaction fluid was poured into 325 g (7.38 moles) of crushed dry ice, and the extraction with a 5% aqueous solution of potassium hydroxide was conducted after 30 minutes. The filtrate was adjusted at an acidic condition with hydrochloric acid, and 5,5',7,7'-tetramethyl-1,1'-biadamantane-3,3'-dicarboxylic acid was precipitated, then separated by filtration, washed with pure water and dried. The obtained crude product was purified by recrystallization from hot methanol. The obtained solid substance was dried under a reduced pressure, and 19.48 g of a product was obtained (the yield: 58%). When the product was examined, the absorption of carboxylic acid was found at about 1,710 cm$^{-1}$ to 1,680 cm$^{-1}$ in the IR analysis, and the molecular weight was found to be 415 in the mass analysis. Therefore, it was shown that the product was the object compound.

2-2) Synthesis of 5,5',7,7'-tetramethyl-1,1'-biadamantane-3,3'-dicarboxylic acid dichloride The synthesis was conducted in accordance with the same procedures as those conducted in 2) of Example 3 except that 14.52 g (0.035 moles) of 5,5',7,7'-tetramethyl-1,1'-biadamantane-3,3'-dicarboxylic acid synthesized above was used in place of 7.85 g (0.035 moles) of 1,3-adamantanedicarboxylic acid, and a white solid substance was obtained.

When the obtained product was examined, the absorption of the acid chloride was found at about 1791 cm$^{-1}$ in the IR analysis, peaks of proton were found at 1.51-1.65 ppm (12H), 1.07-1.24 ppm (12H) and 0.92 ppm (12H) in the NMR analysis in a CDCl$_3$ solution, and the molecular weight was found to be 452 in the mass analysis. Therefore, it was shown that the obtained compound was the object compound.

3) Preparation of a Benzoxazole Resin Precursor

The reaction was conducted in accordance with the same procedures as those conducted in 3) of Example 1 except that, in the preparation of a benzoxazole resin precursor, 48.67 g (0.09 moles) of 3,3'-bis(3-amino-4-hydroxyphenyl)(5,5',7,7'-tetramethyl)-1,1'-biadamantane obtained above in accordance with the process of 1) was used in place of 31.5 g (0.09 moles) of 1,3-bis(3-amino-4-hydroxyphenyl)adamantane used in Example 1 and 44.86 g (0.1 mole) of 5,5',7,7'-tetramethyl-1,1'-biadamantane-3,3'-dicarboxylic acid dichloride obtained above in accordance with the process of 2) was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 21,000 expressed as the value of corresponding polystyrene.

Example 15

1) Synthesis of 3,3'-bis[4-(4-amino-3-hydroxyphenoxy)phenyl]-1,1'-bi-adamantane

1-1) Synthesis of 3,3'-bis[4-(4-nitro-3-benzyloxyphenoxy)phenyl]-1,1'-bi-adamantane Into a 1 liter four-necked separable flask equipped with a thermometer, a stirrer, an inlet for nitrogen gas and a reflux condenser, 45.45 g (0.1 mole) of 3,3'-bis(4-hydroxyphenyl)-1,1'-biadamantane obtained in 1-1) of Example 4, 55.6 g (0.225 moles) of 3-benzyloxy-4-nitro-1-fluorobenzene, 55.3 g (0.400 moles) of potassium carbonate and 590 ml of N,N'-dimethylformamide were placed, and the resultant mixture was heated under the refluxing condition at 135° C. for 4 hours. After the mixture was cooled at the room temperature, the formed precipitates were separated by filtration, and the solid substance separated by filtration was mixed with 1800 ml of pure water, stirred for 30 minutes and separated by filtration. The solid substance separated by filtration was mixed with 1800 ml of methanol, stirred for 30 minutes and separated by filtration. The separated solid substance was dried at 60° C. under a reduced pressure for 24 hours, and 69.1 g of a product was obtained (the yield: 76.0%).

When the obtained product was examined, peaks of proton were found at 7.93 ppm (2H), 7.41-7.32 ppm (14H), 6.96 ppm (4H), 6.66 ppm (2H), 6.50 ppm (2H), 2.23 ppm (4H), 1.86 ppm (8H) and 1.73-1.69 ppm (16H) in the NMR analysis in a CDCl$_3$ solution. Therefore, it was shown that the obtained product was the object compound.

1-2) Synthesis of 3,3'-bis[4-(4-amino-3-hydroxyphenoxy)phenyl]-1,1'-bi-adamantane Into a 1 liter egg plant-shaped flask, 90.9 g (0.1 mole) of 3,3'-bis[4-(4-nitro-3-benzyloxyphenoxy)phenyl]-1,1'-biadamantane obtained above, 2.12 g (0.02 moles) of a 10% palladium-active charcoal, 576 ml of tetrahydrofuran and a stirrer rod were placed, and the inside of the flask was filled with hydrogen gas. While the pressure of hydrogen gas in the flask was kept at 50 psi, the resultant mixture was stirred at 20° C. for 72 hours and, then, the reaction fluid was filtered. The filtrate was added into 3.6 liters of ion-exchanged water, and the solid components were recovered by reprecipitation. The obtained solid substance was washed twice in 13.6 liters of ion-exchanged water for 30 minutes under stirring, dried at the room temperature for 24 hours, and 58.2 g of a product in the form of dark red powder was obtained (the yield: 87.0%).

When the obtained product was examined, peaks of proton were found at 9.40-9.10 ppm (2H), 7.27 ppm (4H), 6.80 ppm (4H), 6.56 ppm (2H), 6.35 ppm (2H), 6.26 ppm (2H), 4.60-4.20 ppm (2H), 2.12 ppm (4H), 1.78-1.69 ppm (8H) and 1.58 ppm (16H) in the NMR analysis in a DMSO-$d_6$ solution, and the molecular weight was found to be 669 in the mass analysis. Therefore, it was shown that the obtained product was the object compound.

2) Synthesis of 1,1'-biadamantane-3,3'-dicarboxylic acid dichloride 2-1) Synthesis of 1,1'-biadamantane-3,3'-dicarboxylic acid The synthesis was conducted in accordance with the same procedures as those conducted in 2-1) of Example 14 except that 34.69 g (0.081 moles) of 3,3'-dibromo-1,1'-biadamantane was used in place of 39.23 g (0.081 moles) of 3,3'-dibromo-5,5',7,7'-tetramethyl-1,1'-biadamantane.

When the obtained product was examined, the absorption of the carboxylic acid was found at 1,710 to 1,680 cm$^{-1}$ in the IR analysis, and the molecular weight was found to be 359 in the mass analysis. Therefore, it was shown that the obtained product was the object compound.

2-2) Synthesis of 1,1'-biadamantane-3,3'-dicarboxylic acid chloride

The synthesis was conducted in accordance with the same procedures as those conducted in 2) of Example 3 except that 12.5 g (0.035 moles) of 1,1'-biadamantane-3,3'-dicarboxylic acid synthesized above was used in place of 7.85 g (0.035 moles) of 1,3-adamantanedicarboxylic acid, and white crystals were obtained.

When the obtained product was examined, the absorption of the acid chloride was found at 1,792 cm$^{-1}$ in the IR analysis, peaks of proton were found at 2.21 ppm (4H), 1.85-1.97 ppm (8H), 1.79 ppm (4H) and 1.54-1.67 ppm (12H) in the NMR analysis in a CDCl$_3$ solution, and the molecular weight was found to be 395 in the mass analysis. Therefore, it was shown that the obtained product was the object compound.

3) Preparation of a Benzoxazole Resin Precursor

The reaction was conducted in accordance with the same procedures as those conducted in 3) of Example 1 except that, in the preparation of a benzoxazole resin precursor, 60.21 g (0.09 moles) of 3,3'-bis[4-(4-amino-3-hydroxyphenoxy)phenyl]-1,1'-biadamantane obtained in accordance with the process described above in 1) was used in place of 31.5 g (0.09 moles) of 1,3-bis(3-amino-4-hydroxyphenyl)adamantane used in Example 1 and 39.55 g (0.1 mole) of 1,1'-biadamantane-3,3'-dicarboxylic acid dichloride obtained in accordance with the process described above in 2) was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 22,000 expressed as the value of corresponding polystyrene.

Example 16

1) Synthesis of 3,3'-bis[4-(4-amino-3-hydroxy-6-(1-adamantyl)phenoxy)-phenyl]-1,1'-biadamantane 1-1) Synthesis of 5-(1-adamantyl)-2-benzyloxy-4-fluoronitrobenzene Into a 300 ml egg plant-shaped flask, 87.3 g (779 mmole) of 3-fluorophenol, 83.8 g (389 mmole) of 1-bromoadamantane, 60 ml of toluene and a stirrer rod were placed, and the resultant mixture was stirred at 140° C. for 24 hours under the stream of nitrogen gas. The reaction fluid was left standing at the room temperature, and the formed solid substance was recovered by filtration. The recovered solid substance was washed with cold toluene and dried at 60° C. under a reduced pressure, and 63.2 g of 4-(1-admantyl)-3-fluorophenol was obtained.

Then, into a 500 ml egg plant-shaped flask, 63.2 g (236 mmole) of 4-(1-admantyl)-3-fluorophenol obtained above, 300 ml of dichloromethane, 24.5 g (236 mmole) of a 60% aqueous solution of nitric acid and a stirrer rod was placed, and the resultant mixture was stirred at 10° C. for 1 hour. To the reaction fluid, 100 ml of a 1% aqueous solution of sodium hydrogencarbonate was added. The organic layer was recovered using a separation funnel, and the solvent was removed under a reduced pressure. The obtained solid substance was recrystallized from 1,200 ml of 2-propanol, and 39.5 g of 5-(1-adamantyl)-2-hydroxy-4-fluoronitrobenzene was obtained.

Into a 500 ml egg plant-shaped flask, 30.1 g (103 mmole) of 5-(1-adamantyl)-2-hydroxy-4-fluoronitrobenzene obtained above, 26.5 g (155 mmole) of benzyl bromide, 42.2 g (305 mmole) of potassium carbonate, 200 ml of acetonitrile and a stirrer rod were placed, and the resultant mixture was stirred at 100° C. for 5 hours. The reaction fluid was filtered, and, after the filtrate was left standing at the room temperature, the separated solid substance was recovered by filtration. The recovered solid substance was washed with cold acetonitrile and dried at 60° C. under a reduced pressure, and 27.8 g of 5-(1-adamantyl)-2-benzyloxy-4-fluoro-nitrobenzene was obtained.

1-2) Synthesis of 3,3'-bis[4-(4-amino-3-hydroxy-6-(1-adamantyl)-phenoxy)phenyl]-1,1'-biadamantane The synthesis was conducted in accordance with the same procedures as those conducted in 1-1) and 1-2) of Example 15 except that 92.1 g (0.225 moles) of 3-(1-adamantyl)-2-benzyloxy-4-fluoronitrobenzene obtained above was used in place of 55.6 g (0.225 moles) of 3-benzyloxy-4-nitro-1-fluorobenzene used in the synthesis in 1-1) of Example 15, and the object compound was obtained. It was shown that the obtained compound was the object compound since the molecular weight was 937 in the mass analysis.

2) Synthesis of 5-(phenylethynyl)adamantane-1,3-dicarboxylic acid dichloride 2-1) Synthesis of 5-(phenylethynyl)adamantane-1,3-dicarboxylic acid Under the atmosphere of nitrogen gas, 10 g (73 mmole) of adamantane, 1.2 g (7.4 mmole) of N-hydroxyphthalimide, 80 mg (0.31 mmole) of cobalt(II) acetylacetonate, 9.2 g (90 mmole) of ethynylbenzene and 150 ml of acetic acid were stirred. To the resultant mixture, a mixed gas containing 2.0 liters of carbon monoxide and 0.50 liters of oxygen was introduced under a pressure of 7.5 kg/cm$^2$, and the mixture was stirred at 60° C. for 12 hours. The reaction fluid was added into a 5 mole/liter aqueous solution of hydrochloric acid cooled at 0° C., and the solid substance was recovered by filtration. The obtained solid substance was purified in accordance with the liquid chromatography and recrystallization, and 5-(phenylethynyl)adamantane-1,3-dicarboxylic acid was obtained.

The appearance and the results of the mass analysis and the elemental analysis are shown in the following. These results showed that the obtained compound was the object compound.

Appearance: white solid
MS (FD) (m/z): 324 (M+)
Elemental Analysis:
calculated (%) C, 74.06; H, 6.21; O, 19.73.
found (%) C, 74.54; H, 6.42.

2-2) Synthesis of 5-(phenylethynyl)adamantane-1,3-dicarboxylic acid dichloride

The synthesis was conducted in accordance with the same procedures as those conducted in 2) of Example 3 except that 11.35 g (0.035 moles) of 5-(phenylethynyl)adamantane-1,3-dicarboxylic acid synthesized above was used in place of 7.85 g (0.035 moles) of 1,3-adamantanedicarboxylic acid used in 2) of Example 3.

When the obtained product was examined, the absorption of the acid chloride was found at about 1,815 to 1,785 cm$^{-1}$ in the IR analysis, and the molecular weight was found to be 361 in the mass analysis. Therefore, it was shown that the product was the object compound.

3) Preparation of a Benzoxazole Resin Precursor

The reaction was conducted in accordance with the same procedures as those conducted in 3) of Example 1 except that, in the preparation of a benzoxazole resin precursor, 84.33 g (0.09 moles) of 3,3'-bis[4-(4-amino-3-hydroxy-6-(1-adamantyl)phenoxy)phenyl]-1,1'-biadamantane obtained in accordance with the process described above in 1) was used in place of 31.5 g (0.09 moles) of 1,3-bis(3-amino-4-hydroxyphenyl)adamantane used in Example 1 and 36.13 g (0.1 mole) of 5-(phenylethynyl)adamantane-1,3-dicarboxylic acid dichloride obtained in accordance with the process described above in 2) was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 20,000 expressed as the value of corresponding polystyrene.

Example 17

1) Synthesis of 3,3'-bis(4-hydroxy-3-aminophenyl)-5,5'-di(n-butyl)-1,1'-bi-adamantane 1-1) Synthesis of 1-(n-butyl)adamantane Into a 1 liter egg plant-shaped flask, 4.9 g (0.2 moles) of magnesium was weighed and placed. Under the stream of nitrogen gas, 80 ml of diethyl ether was added and stirred. Then, a solution prepared by dissolving 27.4 g (0.2 moles) of n-butyl bromide into 20 ml of diethyl ether was added dropwise. After the addition was completed, the resultant mixture was heated under the refluxing condition for 30 minutes. The temperature was adjusted at the room temperature, and diethyl ether was completely removed using a vacuum pump. Then, a solution prepared by dissolving 21.5 g (0.1 mole) of 1-bromoadamantane into 300 ml of dichloromethane was added dropwise. After the addition was completed, the resultant mixture was heated under the refluxing condition for 5 hours. The reaction fluid was poured into 200 ml of ion-exchanged water and treated by extraction with dichloromethane using a separation funnel. The solvent was removed using an evaporator. The residue was dissolved into 20 ml of hexane and purified in accordance with the silica gel column chromatography (the solvent of development: hexane). The solvent was removed using an evaporator, and 7.3 g of 1-(n-butyl)-adamantane was obtained as a colorless transparent liquid substance (the yield: 38%).

The appearance and the results of the mass analysis and the elemental analysis are shown in the following. These results showed that the obtained compound was the object compound.

$^1$H-NMR (400 MHz, chloroform-d$_3$): δ 1.92 (s, 3H), 1.65 (m, 6H), 1.45 (d, 6H), 1.22 (m, 4H), 1.02 (m, 2H), 0.89 (t, 3H)
MS (FD) (m/z): 192.2
Elemental Analysis:
calculated C, 87.42%; H, 12.58%.
found C, 88.00%; H, 12.90%.

1-2) Synthesis of 1-bromo-3-(n-butyl)adamantane

Into a 200 ml egg plant-shaped flask, 8.8 g (0.046 moles) of 1-(n-butyl)adamantane obtained above was weighed and placed. Under the stream of nitrogen gas, 100 ml of cyclohexane was added, and a solution was prepared. While the solution was kept at 0° C. in an ice bath, 8.8 g (0.063 moles) of t-butyl bromide and 0.4 g (0.0014 moles) of aluminum bromide were added, and the reaction was allowed to proceed for 2 hours. To the reaction fluid, 100 ml of ion-exchanged water was added, and the extraction with cyclohexane was conducted using a separation funnel. The solvent was removed using an evaporator, and 10.4 g of 1-bromo-3-(n-butyl)adamantane of the object compound was obtained as a colorless transparent liquid substance (the yield: 84%).

The appearance and the results of the mass analysis and the elemental analysis are shown in the following. These results showed that the obtained compound was the object compound.

$^1$H-NMR (400 MHz, chloroform-d$_3$): δ 2.28 (m, 4H), 2.12 (t, 2H), 2.09 (s, 2H), 1.64 (m, 2H), 1.48 (d, 4H), 1.22 (m, 4H), 1.10 (m, 2H), 0.90 (t, 3H)
MS (FD) (m/z): 270.1
Elemental Analysis:
calculated C, 61.99%; H, 8.55%.
found C, 60.99%; H, 8.01%.

1-3) Synthesis of 3,3'-bis(4-hydroxy-3-aminophenyl)-5,5'-di(n-butyl)-1,1'-biadamantane The reaction was conducted in accordance with the same procedures as those conducted in 1-1) of Example 14 except that 108.50 g (0.4 moles) of 1-bromo-3-(n-butyl)adamantane synthesized in accordance with the above process was used in place of 97.28 g (0.4 moles) of 3,5-dimethyl-1-bromoadamantane and 54.25 g (0.2 moles) of 1-bromo-3-(n-butyl)adamantane was used in place of 48.64 g (0.2 moles) of 3,5-dimethyl-1-bromoadamantane, and 3,3'-di(n-butyl)-1,1'-biadamantane was obtained. Then, the reaction was conducted in accordance with the same procedures as those conducted in 1-2) and 1-3) of Example 14, and 3,3'-bis(4-hydroxy-3-aminophenyl)-5,5'-di(n-butyl)-1,1'-biadamantane was obtained.

The mass analysis was conducted using the obtained product, and the molecular weight was found to be 597. Therefore, it was shown that the obtained compound was the object compound.

2) Synthesis of 5,5',7,7'-tetra(n-butyl)-1,1'-biadamantane-3,3'-dicarboxylic acid dichloride

2-1) Synthesis of 1,3-di(n-butyl)adamantane

Into a 1 liter egg plant-shaped flask, 4.9 g (0.2 moles) of magnesium was weighed and placed. Under the stream of nitrogen gas, 80 ml of diethyl ether was added and stirred. Then, a solution prepared by dissolving 27.4 g (0.2 moles) of n-butyl bromide into 20 ml of diethyl ether was added dropwise. After the addition was completed, the resultant mixture was heated under the refluxing condition for 30 minutes. The temperature was adjusted at the room temperature, and diethyl ether was completely removed using a vacuum pump. Then, a solution prepared by dissolving 27.1 g (0.1 mole) of 1-bromo-3-(n-butyl)adamantane obtained in accordance with the process described above in 1-2) into 300 ml of dichloromethane was added dropwise. After the addition was completed, the resultant mixture was heated under the refluxing condition for 5 hours. The reaction fluid was poured into 200 ml of ion-exchanged water and treated by extraction with dichloromethane using a separation funnel. The solvent was removed using an evaporator. The residue was dissolved into 20 ml of hexane and purified in accordance with the silica gel column chromatography (the solvent of development: hexane). The solvent was removed using an evaporator, and 8.20 g of 1,3-di(n-butyl)adamantane of the object compound was obtained (the yield: 33%).

The mass analysis was conducted using the obtained product, and the molecular weight was found to be 249. Therefore, it was shown that the obtained compound was the object compound.

2-2) Synthesis of 1-bromo-3,5-di(n-butyl)adamantane

Into a 200 ml egg plant-shaped flask, 11.43 g (0.046 moles) of 1,3-di(n-butyl)adamantane obtained in accordance with the process described above was weighed and placed. Under the stream of nitrogen gas, 100 ml of cyclohexane was added, and a solution was prepared. While the prepared solution was kept at 0° C. in an ice bath, 8.8 g (0.063 moles) of t-butyl bromide and 0.4 g (0.0014 moles) of aluminum bromide were added, and the reaction was allowed to proceed for 2 hours. To the reaction fluid, 100 ml of ion-exchanged water was added, and the extraction with cyclohexane was conducted using a separation funnel. The solvent was removed using an evaporator, and 12.65 g of 1-bromo-3,5-di(n-butyl)adamantane of the object compound was obtained (the yield: 84%).

The mass analysis was conducted using the obtained product, and the molecular weight was found to be 327. Therefore, it was shown that the obtained compound was the object compound.

2-3) Synthesis of 3,3'-dibromo-5,5',7,7'-tetra(n-butyl)-1,1'-biadamantane

The synthesis was conducted in accordance with the same procedures as those conducted in 1-1) and 1-2) of Example 14 except that 65.47 g (0.2 moles) of 1-bromo-3,5-di(n-butyl)adamantane synthesized in accordance with the process described above was used in place of 48.64 g (0.2 moles) of 3,5-dimethyl-1-bromoadamantane used 1-1) of Example 14, and 3,3'-dibromo-5,5',7,7'-tetra(n-butyl)-1,1'-biadamantane was obtained.

The mass analysis was conducted using the obtained product, and the molecular weight was found to be 653. Therefore, it was shown that the obtained compound was the object compound.

2-4) Synthesis of 5,5',7,7'-tetrabutyl-1,1'-biadamantane-3,3'-dicarboxylic acid dichloride The synthesis was conducted in accordance with the same procedures as those conducted in 2-1) and 2-2) of Example 14 except that 52.87 g of 3,3'-dibromo-5,5',7,7'-tetra(n-butyl)-1, 1'-biadamantane synthesized in accordance with the process described above was used in place of 39.23 g (0.081 moles) of 3,3'-dibromo-5,5',7,7'-tetramethyl-1,1'-biadamantane used 2-1) of Example 14, and 5,5',7,7'-tetrabutyl-1,1'-biadamantane-3,3'-dicarboxylic acid dichloride of the object compound was obtained.

The mass analysis was conducted using the obtained product, and the molecular weight was found to be 620. Therefore, it was shown that the obtained compound was the object compound.

3) Preparation of a Benzoxazole Resin Precursor

The reaction was conducted in accordance with the same procedures as those conducted in 3) of Example 1 except that, in the preparation of a benzoxazole resin precursor, 53.7 g (0.09 moles) of 3,3'-bis(4-hydroxy-3-aminophenyl)-5,5'-di (n-butyl)-1,1'-biadamantane obtained in accordance with the process described above in 1) was used in place of 31.5 g (0.09 moles) of 1,3-bis(3-amino-4-hydroxyphenyl)-adamantane used in Example 1 and 62.0 g (0.1 mole) of 5,5',7,7'-tetra-butyl-1,1'-biadamantane-3,3'-dicarboxylic acid dichloride obtained in accordance with the process described above in 2) was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 23,000 expressed as the value of corresponding polystyrene.

Example 18

1) Synthesis of 3,3'-bis[4-(4-amino-3-hydroxyphenoxy)phenyl]-5,5',7,7'-tetramethyl-1,1'-biadamantane The reaction was conducted in accordance with the same procedures as those conducted in 1) of Example 15 except that 51.08 g of 3,3'-bis(4-hydroxyphenyl)(5,5',7,7'-tetramethyl)-1,1'-biadamantane obtained in 1-3) of Example 14 was used in place of 45.45 g of 3,3'-bis(4-hydroxyphenyl)-1,1'-biadamantane, and 3,3'-bis[4-(4-amino-3-hydroxyphenoxy)phenyl]-5,5',7,7'-tetramethyl-1,1'-biadamantane was obtained.

2) Synthesis of 5-(1-adamantylethynyl)adamantane-1,3-dicarboxylic acid dichloride

2-1) Synthesis of 5-(1-adamantylethynyl)adamantane-1,3-dicarboxylic acid

In accordance with the same procedures as those conducted in Example 16 except that 14 g (87 mmole) of 1-ethynyladamantane was used in place of 9.2 g (90 mmole) of ethynylbenzene used in 2-1) of Example 16, 5-(1-adamantylethynyl)adamantane-1,3-dicarboxylic was obtained.

The appearance and the results of the mass analysis and the elemental analysis are shown in the following. These results showed that the obtained compound was the object compound.

Appearance: white solid
MS (FD) (m/z): 382 (M$^+$)
Elemental Analysis:
calculated (%) C, 75.36; H, 7.91; O, 16.73.
found (%) C, 75.58; H, 7.87.

2-2) Synthesis of 5-(1-adamantylethynyl)adamantane-1,3-dicarboxylic acid dichloride The synthesis was conducted in accordance with the same procedures as those conducted in 2) of Example 3 except that 13.39 g (0.035 moles) of 5-(1-adamantylethynyl)adamantane-1,3-dicarboxylic acid was used in place of 7.85 g (0.035 moles) of 1,3-adamantanedicarboxylic acid.

When the obtained product was examined, the absorption of the acid chloride was found at about 1,815 to 1,785 cm$^{-1}$ in the IR analysis, and the molecular weight was found to be 419 in the mass analysis. Therefore, it was shown that the product was the object compound.

3) Preparation of a Benzoxazole Resin Precursor

The reaction was conducted in accordance with the same procedures as those conducted in 3) of Example 1 except that, in the preparation of a benzoxazole resin precursor, 65.25 g (0.09 moles) of 3,3'-bis[4-(4-amino-3-hydroxyphenoxy)phenyl]-5,5',7,7'-tetramethyl-1,1'-bi adamantane obtained above in accordance with the process of 1) was used in place of 31.5 g (0.09 moles) of 1,3-bis(3-amino-4-hydroxyphenyl)-adamantane used in Example 1 and 41.94 g (0.1 mole) of 5-(1-adamantylethynyl)adamantane-1,3-dicarboxylic acid dichloride obtained above in accordance with the process of 2) was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 21,000 expressed as the value of corresponding polystyrene.

Example 19

1) Synthesis of 3,3'-bis[4-(4-amino-3-hydroxy-6-(3,5-dimethyl-1-adamantyl)phenoxy)phenyl]-5,5',7,7'-tetramethyl-1,1'-biadamantane 1-1) Synthesis of 5-(3,5-dimethyl-1-adamantyl)-2-benzyloxy-4-fluoro-nitrobenzene The synthesis was conducted in accordance with the same procedures as those conducted in 1-1) of Example 16 except that 1-bromo-3,5-dimethyladamantane was used in place of 1-bromo-adamantane, and 5-(3,5-dimethyl-1-adamantyl)-2-benzyloxy-4-fluoro-nitrobenzene was obtained.

Since the molecular weight was found to be 410 in the mass analysis, it was shown that the obtained compound was the object compound.

1-2) Synthesis of 3,3'-bis[4-(4-nitro-3-benzyloxy-6-(3,5-dimethyl)-adamantyl)phenoxy]phenyl-5,5',7,7'-tetramethyl-1,1'-biadamantane Into a 2 liter four-necked separable flask equipped with a thermometer, a stirrer, an inlet for nitrogen gas and a reflux condenser, 51.08 g (0.1 mole) of 3,3'-bis(4-hydroxyphenyl)-5,5',7,7'-tetramethyl-1,1'-biadamantane obtained in accordance with the process described in 1-1) of Example 14, 83.95 g (0.205 moles) of 5-(3,5-dimethyl-1-adamantyl)-2-benzyloxy-4-fluoronitrobenzen obtained in 1-1), 55.3 g (0.400 moles) of potassium carbonate and 1,000 ml of N,N'-dimethylformamide were placed, and the resultant mixture was heated under the refluxing condition at 135° C. for 4 hours. After the fluid was cooled at the room temperature, the reaction fluid was mixed with 10 liters of pure water, and the obtained mixture was stirred for 30 minutes and filtered. The obtained solid substance was mixed with 10 liters of methanol, stirred for 30 minutes and separated by filtration. The separated solid substance was then dried at 60° C. under a reduced pressure for 24 hours, and 109.6 g of a product was obtained (the yield: 85%).

When the obtained product was examined, peaks of proton were found at 7.97 ppm (2H), 7.38 ppm (4H), 7.29 ppm (6H), 7.20 ppm (4H), 6.88 ppm (4H), 6.32 ppm (2H), 4.95 ppm (4H), 2.13-1.17 ppm (50H), 0.96 ppm (12H) and 0.85 ppm (12H) in the NMR analysis in a CDCl$_3$ solution. Therefore, it was shown that the obtained product was the object compound.

1-3) Synthesis of 3,3'-bis[4-(4-nitro-3-hydroxy-6-(3,5-dimethyl)-adamantyl)phenoxy]phenyl-5,5',7,7'-tetramethyl-1,1'-biadamantane Into a 2 liter four-necked separable flask equipped with a thermometer, a stirrer and an inlet for nitrogen gas, 128.97 g (0.1 mole) of 3,3'-bis[4-(4-nitro-3-benzyloxy-6-(3,5-dimethyl)adamantyl)phenoxy]phenyl-5,5',7,7'-tetramethyl-1,1'-biadamantane, 160 g (0.8 moles) of trimethyl-silyl iodide and 1,290 ml of chloroform were placed, and the resultant mixture was stirred at 25° C. for 17 hours. Then, 215 ml of methanol was added, and the obtained mixture was stirred for 10 minutes. The reaction fluid was washed with 1,290 ml of a 5% by weight aqueous solution of sodium hydrogensulfite, 1,290 ml of a 5% by weight aqueous solution of sodium hydrogencarbonate and 1,290 ml of pure water, successively, and a solid substance was obtained by removing the solvent by distillation under a reduced pressure from the organic layer obtained after the washing operations. The solid component was dried at 60° C. under a reduced pressure for 24 hours, and 85.4 g of a product was obtained (the yield: 77.0%).

When the obtained product was examined, peaks of proton were found at 10.73 ppm (2H), 8.03 ppm (2H), 7.44 ppm (4H), 7.03 ppm (4H), 6.28 ppm (2H), 2.17-1.15 ppm (50H), 0.95 ppm (12H) and 0.88 ppm (12H) in the NMR analysis in a CDCl$_3$ solution. Therefore, it was shown that the obtained product was the object compound.

1-4) Synthesis of 3,3'-bis[4-(4-amino-3-hydroxy-6-(3,5-dimethyl)-adamantyl)phenoxy]phenyl-5,5',7,7'-tetramethyl-1,1'-biadamantane Into a 10 liter four-necked flask equipped with a thermometer, a Dimroth condenser and an inlet for nitrogen gas, 110.95 g (0.1 mole) of 3,3'-bis[4-(4-nitro-3-hydroxy-6-(3,5-dimethyl)adamantyl)phenoxy]phenyl-5,5',7,7'-tetramethyl-1,1'-biadamantane obtained above and 1760 ml of dichloromethane were placed, and the resultant mixture was stirred at the room temperature until a complete solution was obtained. Then, 700 ml of acetonitrile and 410 ml of pure water were added, and the stirring was continued at the room temperature under the stream of nitrogen gas. To the obtained mixture, 208.9 g (1.2 moles) of sodium hydrosulfite, an aqueous solution prepared by dissolving 5.42 g (0.01 mole) of 1,1'-dioctyl-4,4'-bipyridium and 124.38 g (0.9 moles) of potassium carbonate into 2,600 ml of water was slowly added dropwise using a dropping funnel. After the reaction was allowed to proceed at 35° C. for 6 hours, the organic solvent layer was obtained by extraction using a separation funnel. The purification was conducted in accordance with a column operation. After drying at the room temperature under a reduced pressure for 24 hours, 87.1 g of a product was obtained (the yield: 83.0%).

When the obtained product was examined, the molecular weight was found to be 1,050 in the mass analysis, and peaks of proton were found at 8.87 ppm (2H), 7.28 ppm (4H), 6.78 ppm (4H), 6.57 ppm (2H), 6.11 ppm (2H), 4.28 ppm (4H), 1.99-1.08 ppm (50H), 0.88 ppm (12H) and 0.77 ppm (12H) in the NMR analysis in a DMSO-$d_6$ solution. Therefore, it was shown that the obtained product was the object compound.

2) Synthesis of 5,5',5",5'",7,7',7",7'"-octamethyl-1,1', 1",1'"-tetra-adamantane-3,3'"-dicarboxylic acid dichloride 2-1) Synthesis of 3-bromo-5,5',7,7'-tetramethyl-1,1'-biadamantane Into a 500 ml egg plant-shaped flask, 30.08 g (0.092 moles) of 3,3',5,5'-tetramethyl-1,1'-biadamantane obtained in 1-1) of Example 14 was weighed and placed. Under the stream of nitrogen gas, 200 ml of cyclohexane was added, and a solution was prepared. While the solution was kept at 0° C. in an ice bath, 19.6 g (0.126 moles) of t-butyl bromide and 0.8 g (0.0028 moles) of aluminum bromide were added, and the reaction was allowed to proceed for 2 hours. To the reaction fluid, 200 ml of ion-exchanged water was added, and the extraction with cyclohexane was conducted using a separation funnel. The solvent was removed using an evaporator, and 32.45 g of 3-bromo-5,5',7,7'-tetramethyl-1,1'-biadamantane of the object compound was obtained (the yield: 87%). Since the molecular weight was 406 in the mass analysis, it was shown that the product was the object compound.

2-2) Synthesis of 3,3',3",3'",5,5',5",5'"-octamethyl-1, 1',1",1'"-tetra-adamantane In accordance with the same procedures as those conducted in 1-1) of Example 14 except that 162.4 g (0.4 moles) of 3-bromo-5,5',7,7'-tetramethyl-1,1'-biadamantane was used in place of 97.28 g (0.4 moles) of 3,5-dimethyl-1-bromoadamantane, 3,3',3",3'",5,5',5",5'"-octamethyl-1,1',1",1'"-tetraadamantane of the object compound was obtained. Since the molecular weight was 651 in the mass analysis, it was shown that the product was the object compound.

2-3) Synthesis of 3,3"-dibromo-5,5',5",5'",7,7',7",7'"-octamethyl-1,1',1",1'"-tetraadamantane Into a 500 ml egg plant-shaped flask, 59.89 g (0.092 moles) of 3,3',3",3'",5,5',5",5'"-octamethyl-1,1',1",1'"-tetraadamantane obtained above was weighed and placed. Under the stream of nitrogen gas, 200 ml of cyclohexane was added, and a solution was prepared. While the prepared solution was kept at 0° C. in an ice bath, 39.2 g (0.252 moles) of t-butyl bromide and 1.6 g (0.0056 moles) of aluminum bromide were added, and the reaction was allowed to proceed for 2 hours. To the reaction fluid, 200 ml of ion-exchanged water was added, and the extraction with cyclohexane was conducted using a separation funnel. The solvent was removed using an evaporator, and 63.26 g of 3,3"-dibromo-5,5',5",5'",7,7',7",7'"-octamethyl-1,1',1",1'"-tetraadamantane of the object compound was obtained (the yield: 85%). Since the molecular weight was 809 in the mass analysis, it was shown that the product was the object compound.

2-4) Synthesis of 5,5',5",5'",7,7',7",7'"-octamethyl-1, 1',1",1'"-tetra-adamantane-3,3'"-dicarboxylic acid dichloride The synthesis was conducted in accordance with the same procedures as those conducted in 2-1) and 2-2) of Example 14 except that 65.52 g of 3,3'"-dibromo-5,5',5",5'",7,7',7",7'"-octamethyl-1,1',1",1'"-tetraadamantane was used in place of 39.23 g (0.081 moles) of 3,3'-dibromo-5,5',5",5'"-tetramethyl-1,1'-biadamantane used in 2-1) of Example 14, and 5,5',5",5'",7,7',7",7'"-octamethyl-1,1',1",1'"-tetraadamantane-3,3'"-dicarboxylic acid dichloride of the object compound was obtained.

When the obtained product was examined, the absorption of acid chloride was found at about 1,815 to 1,785 cm$^{-1}$ in the IR analysis, and the molecular weight was found to be 776 in the mass analysis. Therefore, it was shown that the product was the object compound.

3) Preparation of a Benzoxazole Resin Precursor

The reaction was conducted in accordance with the same procedures as those conducted in 3) of Example 1 except that, in the preparation of a benzoxazole resin precursor, 94.46 g (0.09 moles) of 3,3'-bis[4-(4-amino-3-hydroxy-6-(3,5-dimethyl-1-adamantyl)phenoxy)phenyl]-5,5',7,7'-tetramethyl-1,1'-biadamantane obtained in accordance with the process of 1) described above was used in place of 31.5 g (0.09 moles) of 1,3-bis(3-amino-4-hydroxyphenyl)adamantane used in Example 1 and 77.61 g (0.1 mole) of 5,5',5",5'",7,7',7",7'"-octamethyl-1,1',1",1'"-tetra-adamantane-3,3'"-dicarboxylic acid dichloride obtained in accordance with the process of 2) described above was used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 26,000 expressed as the value of corresponding polystyrene.

Example 20

1) Synthesis of 5-(2-(4-(1-(3,5-dimethyladamantyl)) phenyl)ethynyl)isophthalic acid dichloride 1-1) Synthesis of 4-(1-(3,5-dimethyladamantyl)phenol Into a 2 liter flask equipped with a thermometer, a Dimroth condenser, an inlet for nitrogen gas and a stirrer, 77.4 g (0.822 moles) of phenol and 20.0 g (0.0822 moles) of 1-bromo-3,5-dimethyladamantane were placed. A stream of nitrogen gas was introduced into the flask, and the resultant mixture was heated under the refluxing condition in an oil bath for 30 minutes. Then, 800 ml of water was added, and the obtained mixture was heated under the refluxing condition in an oil bath for 10 minutes to obtain a fluid separated in two layers. The fluid was cooled in an ice bath, and the lower layer having an orange color was solidified to obtain a white solid substance. The white solid substance was taken out by decantation, stirred twice in 500 ml of a 2% aqueous solution of sodium hydroxide and twice in 500 ml of water and then filtered, and 7.8 g of 4-(1-(3,5-dimethyladamantyl)phenol was obtained (the yield: 37%).

1-2) Synthesis of 1-(1-(3,5-dimethyladamantyl)-4-trifluoromethane-sulfonyloxybenzene Into a 100 ml four-necked flask equipped with a thermometer, an inlet for nitrogen gas and a stirrer, 4.0 g (0.0157 moles) of 4-(1-(3,5-dimethyladamantyl)phenol obtained above and 20 ml of pyridine were placed. A stream of nitrogen gas was introduced into the flask, and a solution was prepared under stirring. The obtained solution was cooled at −15° C. in an ice/methanol bath. Using a dropping funnel, trifluoromethanesulfonic acid anhydride was added dropwise. After the addition was completed, the obtained mixture was stirred at the room temperature for 2 hours. To the reaction fluid, 100 ml of ethyl acetate and 100 ml of a saturated aqueous solution of sodium chloride were added, and the obtained mixture was transferred to a separation funnel. The layer of ethyl acetate was taken out and washed twice with 100 ml of a saturated aqueous solution of sodium chloride. Then, ethyl acetate was removed by distillation under a reduced pressure using a rotary evaporator, and 5.4 g of 1-(1-(3,5-dimethyladamantyl)-4-trifluoromethane-sulfonyloxybenzene was obtained (the yield: 88%).

1-3) Synthesis of 1-(1-(3,5-dimethyladamantyl)-4-(3-hydroxy-3-methyl-(1-butynyl)benzene Into a 100 ml four-necked flask equipped with a thermometer, a Dimroth condenser, an inlet for nitrogen gas and a stirrer, 2.0 g (0.0051 moles) of 1-(1-(3,5-dimethyladamantyl)-4-trifluoromethanesulfonyloxy-benzene obtained above, 0.4 g (0.0015 moles) of triphenylphosphine, 0.2 g (0.0010 mole) of copper iodide and 1.1 g (0.0134 moles) of 2-methyl-3-butyn-2-ol were placed, and a stream of nitrogen gas was introduced into the flask. To the resultant mixture, 10 ml of dehydrated triethylamine and 10 ml of dehydrated pyridine were added and dissolved under stirring. After the flow of nitrogen gas was continued for 1 hour, 0.2 g (0.0003 moles) of dichlorobis(triphenylphosphine)palladium was rapidly added, and the resultant mixture was heated under the refluxing condition in an oil bath for 1 hour. Then, triethylamine and pyridine were removed by distillation under a reduced pressure, and a viscous brown solution was obtained. The obtained viscous brown solution was poured into 500 ml of water, and the formed solid substance was separated by filtration and washed twice with 500 ml of water, twice with 500 ml of a 5 mole/liter hydrochloric acid and twice with 500 ml of water. The obtained solid substance was dried at 50° C. under a reduced pressure, and 1.5 g of 1-(1-(3,5-dimethyladamantyl)-4-(3-hydroxy-3-methyl-(1-butynyl))benzene was obtained (the yield: 91%).

1-4) Synthesis of 1-(4-ethynylphenyl)-3,5-dimethyladamantane

Into a 5 liter four-necked flask equipped with a thermometer, a Dimroth condenser and a stirrer, 3 liters of n-butanol and 226 g (2.72 moles) of potassium hydroxide (85%) were placed, and potassium hydroxide was dissolved by heating under the refluxing condition. To the obtained solution, 110 g (0.341 moles) of 1-(1-(3,5-dimethyladamantyl)-4-(3-hydroxy-3-methyl(1-butynyl))benzene obtained above was added. The obtained mixture was heated under the refluxing condition for 30 minutes and then cooled in a ice bath, and the formed crystals were separated by filtration. The obtained crystals were washed twice with 1 liter of ethanol and dried at 60° C. under a reduced pressure, and 81.1 g of 1-(4-ethynylphenyl)-3,5-dimethyladamantane was obtained (the yield: 90%).

1-5) Synthesis of dimethyl 5-(2-(4-(1-(3,5-dimethyladamantyl))phenyl)-ethynyl)isophthalate from dimethyl 5-bromoisophthalate Into a 1 liter four-necked flask equipped with a thermometer, a Dimroth condenser, an inlet for nitrogen gas and a stirrer, 125 g (0.458 moles) of dimethyl 5-bromoisophthalate, 1.1 g (0.00419 moles) of triphenylphosphine, 0.275 g (0.00144 moles) of copper iodide and 106.0 g (0.401 moles) (0.401 moles) of 1-(4-ethynylphenyl)-3,5-dimethyl-adamantane obtained above were placed, and a stream of nitrogen gas was introduced into the flask. To the resultant mixture, 375 ml of dehydrated triethylamine and 200 ml of dehydrated pyridine were added and dissolved under stirring. After the flow of nitrogen gas was continued for 1 hour, 0.3 g (0.000427 moles) of dichlorobis(triphenyl-phosphine)palladium was rapidly added, and the resultant mixture was heated under the refluxing condition in an oil bath for 1 hour. Then, triethylamine and pyridine were removed by distillation under a reduced pressure, and a viscous brown solution was obtained. The obtained viscous brown solution was poured into 500 ml of water, and the formed solid substance was separated by filtration and washed twice with 500 of water, twice with 500 of a 5 mole/liter hydrochloric acid and twice with 500 of water. The obtained solid substance was dried at 50° C. under a reduced pressure, and 137.3 g of dimethyl 5-(2-(4-(1-(3,5-dimethyl-adamantyl))phenyl)ethynyl)isophthalate was obtained (the yield: 75%).

1-6) Synthesis of dipotassium 5-(2-(4-(1-(3,5-dimethyladamantyl))-phenyl)ethynyl)isophthalate from dimethyl 5-(2-(4-(1-(3,5-dimethyl-adamantyl))phenyl)ethynyl)isophthalate Into a 5 liter four-necked flask equipped with a thermometer, a Dimroth condenser and a stirrer, 3 liters of n-butanol and 226 g (2.72 moles) of potassium hydroxide (85%) were placed, and potassium hydroxide was dissolved by heating under the refluxing condition. To the obtained solution, 137.3 g (0.301 moles) of dimethyl 5-(2-(4-(1-(3,5-dimethyladamantyl))phenyl)ethynyl)isophthalate obtained above was added. The obtained mixture was heated under the refluxing condition for 30 minutes and then cooled in a ice bath, and the formed crystals were separated by filtration. The obtained crystals were washed twice with 1 liter of ethanol and dried at 60° C. under a reduced pressure, and 142.8 g of dipotassium 5-(2-(4-(1-(3,5-dimethyladamantyl))phenyl)ethynyl)isophthalate was obtained (the yield: 94%).

1-7) Synthesis of 5-(2-(4-(1-(3,5-dimethyladamantyl))phenyl)ethynyl)-isophthalic acid from dipotassium 5-(2-(4-(1-(3,5-dimethyladamantyl))-phenyl)ethynyl)isophthalate Dipotassium 5-(2-(4-(1-(3,5-dimethyladamantyl))phenyl) ethynyl)-isophthalate obtained above in an amount of 9.6 g (0.019 moles) was dissolved into 20 ml of ion-exchanged water, and insoluble substances were removed by filtration through a 5° C. filter paper. To the filtrate, a 5 mole/liter hydrochloric acid was added under stirring until pH was adjusted at 1, and the formed solid substance was separated by filtration, washed twice with ion-exchanged water and filtered twice. The obtained solid substance was dried at 50° C. under a reduced pressure, and 80 g of 5-(2-(4-(1-(3,5-dimethyladamantyl))phenyl)ethynyl)isophthalic acid was obtained (the yield: 98%).

1-8) Synthesis of 5-(2-(4-(1-(3,5-dimethyladamantyl))phenyl)ethynyl)-isophthalic acid dichloride from dipotassium 5-(2-(4-(1-(3,5-dimethyl-adamantyl))phenyl)ethynyl)isophthalate Into a 2 liter four-necked flask equipped with a thermometer, a Dimroth condenser and a stirrer, 121.1 g (0.24 moles) of dipotassium 5-(2-(4-(1-(3,5-dimethyladamantyl))phenyl) ethynyl)isophthalate obtained above and 400 ml of 1,2-dichloroethane were placed, and the resultant mixture was cooled at 0° C. To the cooled mixture, 391 g (4.5 moles) of thionyl chloride was added dropwise at 5° C. or lower over 1 hour. Then, 4 ml of dimethylformamide and 4 g of hydroquinone were added, and the obtained mixture was stirred at 45 to 50° C. for 3 hours. After the reaction mixture was cooled, crystals formed by the cooling were separated by filtration and washed with 150 ml of chloroform. The filtrate and the washing fluid were combined and concentrated at 40° C. or lower under a reduced pressure. The obtained residue was treated twice by extraction with 200 ml of diethyl ether. Diethyl ether was removed from the extract by distillation under a reduced pressure, and a crude product of a semisolid substance was obtained. The crude product was washed with dried n-hexane and recrystallized from diethyl ether, and 38.0 g of 5-(2-(4-(1-(3,5-dimethyladamantyl))phenyl)ethynyl) isophthalic acid dichloride was obtained (the yield: 34%).

The spectral data of 5-(2-(4-(1-(3,5-dimethyladamantyl)) phenyl)-ethynyl)isophthalic acid dichloride obtained above are shown in the following. These data show that the obtained compound was the object compound.

5-(2-(4-(1-(3,5-dimethyladamantyl))phenyl)ethynyl) isophthalic acid dichloride ($C_{28}H_{26}Cl_2O_2$):
Appearance: white powder
IR: 1800-1770 $cm^{-1}$ (carboxylic acid chloride), 2260-2190 $cm^{-1}$ (ethynyl group)
MS (FD) (m/z): 394 ($M^+$-2Cl)
Elemental Analysis:
calculated C, 72.26%; H, 5.63%; Cl, 15.24%; O, 6.88%.
found C, 72.41%; H, 5.08%; Cl, 15.70%; O, 6.81%.

2) Preparation of a Benzoxazole Resin Precursor

The reaction was conducted in accordance with the same procedures as those conducted in 3) of Example 1 except that, in the preparation of a benzoxazole resin precursor, 17.1 g (0.045 moles) of 9,9-bis(3-amino-4-hydroxyphenyl)fluorene obtained in 3-1) of Example 9 and 24.3 g (0.045 moles) of 3,3'-bis(3-amino-4-hydroxyphenyl)(5,5',7,7'-tetramethyl)-1, 1'-biadamantane obtained in 1) of Example 14 were used in place of 31.5 g (0.09 moles) of 1,3-bis(3-amino-4-hydroxyphenyl)-adamantane used in Example 1 and 31.64 g (0.07 moles) of the synthesis of 5,5',7,7'-tetramethyl-1,1'-diadamantane-3,3'-dicarboxylic acid dichloride obtained in 2) of Example 14 and 13.95 g (0.03 moles) of 5-(2-(4-(1-(3,5-dimethyladamantyl))phenyl)ethynyl)isophthalic acid dichloride obtained above were used in place of 20.3 g (0.10 mole) of isophthalic acid dichloride used in Example 1, and a benzoxazole resin precursor was obtained.

The number-average molecular weight (Mn) of the obtained benzoxazole resin precursor was obtained using GPC manufactured by TOSO Co., Ltd. and was found to be 25,000 expressed as the value of corresponding polystyrene.

Comparative Example 1

1) Bisaminophenol Compound Having No Functional Group

As the bisaminophenol having no functional group, 3,3'-dihydroxy-4,4'-diaminobiphenyl [manufactured by TOKYO KASEI KOGYO Co., Ltd.] was used.

2) Dicarboxylic Acid Having No Functional Group

As the dicarboxylic acid having no functional group, isophthalic acid dichloride [manufactured by TOKYO KASEI KOGYO Co., Ltd.] was used.

3) Preparation of a Benzoxazole Resin Precursor

The reaction was conducted in accordance with the same procedures as those conducted in 3) of Example 1 except that 19.5 g (0.09 moles) of 3,3'-dihydroxy-4,4'-diaminobiphenyl was used in place of 31.5 g (0.09 moles) of 1,3-bis(3-amino-4-hydroxyphenyl)adamantane, and a benzoxazole resin precursor was obtained.

The number-average molecular weight (Mn) of the obtained benzoxazole resin precursor was obtained using GPC manufactured by TOSO Co., Ltd. and was found to be 17,000 expressed as the value of corresponding polystyrene.

Comparative Example 2

1) Bisaminophenol Compound Having No Functional Group (No Substituent)

As the bisaminophenol having no functional group, 9,9-bis(3-amino-4-hydroxyphenyl)fluorene synthesized in accordance with the same procedures as those conducted in 3-1) of Example 9 was used.

2) Dicarboxylic Acid Having a Functional Group

As the dicarboxylic acid having a functional group, 5-phenylethynyl-isophthalic acid dichloride synthesized in accordance with the same procedures as those conducted in 3) of Example 2 was used.

3) Preparation of a Benzoxazole Resin Precursor

The reaction was conducted in accordance with the same procedures as those conducted in 3) of Example 1 except that 34.25 g (0.09 moles) of 9,9-bis(3-amino-4-hydroxyphenyl) fluorene was used in place of 31.5 g (0.09 moles) of 1,3-bis (3-amino-4-hydroxyphenyl)adamantane and 30.3 g (0.10 mole) of 5-phenylethynylisophthalic acid dichloride was used in place of 20.3 g (0.10 mole) of isophthalic acid dichloride, and a benzoxazole resin precursor was obtained.

The number-average molecular weight (Mn) of the obtained benzoxazole resin precursor was obtained using GPC manufactured by TOSO Co., Ltd. and was found to be 22,000 expressed as the value of corresponding polystyrene.

The following evaluations were conducted using the resin films obtained in Examples 1 to 20 and Comparative Example 1 and 2. The items and the methods of the evaluations are shown in the following.

The obtained results are shown in Table 1.

1. Solubility

A polybenzoxazole resin precursor in an amount of 1 g and 3 g of N-methyl-2-pyrrolidone were accurately weighed, placed into a glass sample container having a cap and stirred by a stirrer rod for 1 hour.

The solubility was evaluated by the visual observation on the presence or the absence of insoluble substances.

2. Heat Resistance

The heat resistance was evaluated from the glass transition temperature and the temperature of thermal decomposition. For the measurement of the glass transition temperature, an obtained resin film was examined using an apparatus for measuring the dynamic viscoelasticity [manufactured by SEIKO INSTRUMENTS Co., Ltd.; DMS6100] under the stream of nitrogen gas of 300 ml/min under the condition of a rate of temperature elevation of 3° C./min and a frequency of 1 Hz, and the temperature at the top of the peak of tan δ was used as the glass transition temperature.

For the measurement of the temperature of thermal decomposition, an obtained resin film was examined using an apparatus for measuring TG/DTA [manufactured by SEIKO INSTRUMENTS Co., Ltd.; TG/DTA220] under the stream of nitrogen gas of 200 ml/min under the condition of a rate of temperature elevation of 10° C./min, and the temperature at which the decrease in the weight reached 5% was used as the temperature of thermal decomposition.

3. Dielectric Constant

The electric capacity of an adhesive film for semiconductors was measured in accordance with the method of Japanese Industrial Standard K 6911 using PRECISION LCR METER HP-4284 manufactured by HEWLETT PACKARD Company at a frequency of 100 kHz, and the dielectric constant was calculated in accordance with the following equation:

Dielectric constant=(obtained value of electric capacity×thickness of film)/(permittivity of vacuum× area of measurement)

TABLE 1

| | Solubility | Glass transition temperature (° C.) | Temperature of thermal decomposition (° C.) | Dielectric constant (−) |
|---|---|---|---|---|
| Example 1 | good | 420 | 530 | 2.7 |
| Example 2 | good | 435 | 540 | 2.5 |
| Example 3 | good | 450 or higher | 545 | 2.5 |
| Example 4 | good | 450 or higher | 539 | 2.4 |
| Example 5 | good | 446 | 550 | 2.7 |
| Example 6 | good | 430 | 544 | 2.5 |
| Example 7 | good | 441 | 542 | 2.6 |
| Example 8 | good | 450 or higher | 546 | 2.7 |
| Example 9 | good | 450 or higher | 542 | 2.7 |
| Example 10 | good | 442 | 535 | 2.7 |
| Example 11 | good | 413 | 528 | 2.3 |
| Example 12 | good | 419 | 525 | 2.3 |
| Example 13 | good | 430 | 541 | 2.3 |
| Example 14 | good | 440 | 530 | 2.3 |
| Example 15 | good | 410 | 543 | 2.5 |
| Example 16 | good | 450 or higher | 541 | 2.3 |
| Example 17 | good | 430 | 533 | 2.2 |
| Example 18 | good | 450 or higher | 534 | 2.5 |
| Example 19 | good | 415 | 532 | 2.2 |
| Example 20 | good | 416 | 522 | 2.5 |
| Comparative Example 1 | poor | — | — | — |
| Comparative Example 2 | good | 450 or higher | 543 | 3.1 |

As clearly shown in Table 1, in Examples 1 to 20, the glass transition temperature and the temperature of thermal decomposition were high, and the heat resistance was excellent.

In Examples 1 to 20, it is shown that the resins were soluble in solvents, had small dielectric constants and exhibited excellent workability and dielectric property.

In Comparative Example 1, no resin films could be prepared due to the poor solubility, and the measurements of the glass transition, the temperature of thermal decomposition and the dielectric constant were not possible.

In Comparative Example 2, the dielectric constant was great although the glass transition temperature and the temperature of thermal decomposition were excellent.

The interlayer insulation film and the semiconductor device will be described in the following.

Example 21

Preparation of a Varnish for Coating and a Semiconductor Device

The benzoxazole resin precursor obtained in Example 3 was dissolved into N-methyl-2-pyrrolidone. The obtained solution was filtered through a TEFLON (a registered trade name) filter, and a varnish for coating was obtained.

A silicon nitride layer was formed on a substrate of a semiconductor and coated with the varnish for coating obtained above. The formed coating layer was heated at 250° C. for 1 hour and at 420° C. for 1 hour, and an interlayer insulation film having a thickness of 0.3 µm was formed.

Then, a metal wiring was formed in a manner such that the prescribed pattern was formed on the interlayer insulation film formed above, and a semiconductor device was obtained.

Example 22

1) Bisaminophenol Compound Having the Diamondoid Structure and a Functional Group 9,9-bis(3-Amino-4-hydroxyphenyl)-2,7-bisadamantyl-ethynylfluorene synthesized in accordance with the same procedures as those conducted in Example 3 was used.

2) Dicarboxylic Acid Having the Diamondoid Structure 1.3-Adamatanedicarboxylic acid synthesized in accordance with the same procedures as those conducted in Example 3 was used.

3) Reactive Oligomer which can be Decomposed by Heating

As the reactive oligomer, poly(propylene glycol)-block-poly(ethylene glycol)-block-poly(propylene glycol)bis(2- aminopropyl ether) having a number-average molecular weight of 2,000 [manufactured by ALDRICH CHEMICAL Company, Inc.] was used.

4) Preparation of a Benzoxazole Resin Precursor

Under the stream of nitrogen gas, 62.7 g (0.09 moles) of 9,9-bis(3-amino-4-hydroxyphenyl)-2,7-bisadamantylethynylfluorene obtained above was dissolved into 200 g of dried N-methyl-2-pyrrolidone. After 17.4 g (0.22 moles) of pyridine was added, the resultant solution was cooled at −15° C., and 26.1 g (0.10 mole) of 1,3-adamantanedicarboxylic acid obtained above was added in small portions. After the addition was completed, the resultant mixture was stirred at −15° C. for 1 hour. Then, the temperature was adjusted at the room temperature, and the mixture was stirred at the room temperature for 5 hours. After the reaction fluid was cooled at −15° C., 40 g (0.02 moles) of poly(propylene glycol)-block-poly(ethylene glycol)-block-poly(propylene glycol)bis(2-aminopropyl ether) having a number-average molecular weight of 2,000 was added dropwise in small portions. After the obtained reaction fluid was stirred at −15° C. for 1 hour, the temperature was adjusted at the room temperature, and the reaction fluid was stirred at the room temperature for 5 hours. Then, the reaction fluid was added to 4 liters of distilled water as small droplets. The formed precipitates were collected and dried, and a benzoxazole resin precursor having a functional group at the side chains was obtained.

The number-average molecular weight (Mn) of the obtained benzoxazole resin precursor was obtained using GPC manufactured by TOSO Co., Ltd. and was found to be 26,000 expressed as the value of corresponding polystyrene. The benzoxazole resin precursor obtained above was dissolved into N-methyl-2-pyrrolidone and filtered through a TEFLON (a registered trade name) filter, and a varnish for coating was obtained.

A silicon nitride layer was formed on a substrate of a semiconductor and coated with the varnish for coating obtained above. The formed coating layer was heated at 250° C. for 1 hour and at 420° C. for 1 hour, and an interlayer insulation film having a thickness of 0.3 μm was formed.

Then, a metal wiring was formed in a manner such that the prescribed pattern was formed on the interlayer insulation film formed above, and a semiconductor device was obtained.

Example 23

The same procedures as those conducted in Example 21 were conducted except that the following components were used for the varnish for coating.

1) Bisaminophenol Compound Having the Diamondoid Structure 1,3-bis(3-Amino-4-hydroxyphenyl)adamantane synthesized in accordance with the same procedures as those conducted in Example 1 was used.

2) Dicarboxylic Acid Having No Substituents

As the dicarboxylic acid, isophthalic acid chloride [manufactured by TOKYO KASEI KOGYO Co., Ltd.] was used similarly to Example 1.

3) Bisaminophenol Compound Having the Diamondoid-Ethynyl Structure 9,9-bis(3-Amino-4-hydroxyphenyl)-2,7-bisadamantyl-ethynylfluorene synthesized in accordance with the same procedures as those conducted in Example 3 was used.

4) Dicarboxylic Acid Having the Diamondoid Structure 1.3-Adamatanedicarboxylic acid synthesized in accordance with the same procedures as those conducted in Example 3 was used.

5) Reactive Oligomer which can be Decomposed by Heating

As the reactive oligomer, poly(propylene glycol)bis(2-aminopropyl ether) having a molecular weight of 4,000 [manufactured by ALDRICH CHEMICAL Company, Inc.] was used.

6) Preparation of a Benzoxazole Resin Precursor

Under the stream of nitrogen gas, 15.8 g (0.045 moles) of 1,3-bis(3-amino-4-hydroxyphenyl)adamantane obtained above and 31.4 g (0.045 moles) of 9,9-bis(3-amino-4-hydroxyphenyl)-2,7-bisadamantyl-ethynylfluorene were dissolved into 200 g of dried N-methyl-2-pyrrolidone. After 17.4 g (0.22 moles) of pyridine was added, the resultant solution was cooled at −15° C., and 10.2 g (0.05 moles) of isophthalic acid chloride and 13.1 g (0.05 moles) of 1,3-adamantanedicarboxylic acid obtained above were added in small portions. When the addition was completed, the temperature was adjusted at the room temperature, and the mixture was stirred at the room temperature for 5 hours. After the mixture was cooled at −15° C., 40 g (0.01 mole) of poly(propylene glycol) bis-(2-aminopropyl ether) having a number-average molecular weight of 4,000 was added dropwise in small portions. After the obtained reaction fluid was stirred at −15° C. for 1 hour, the temperature was adjusted at the room temperature, and the reaction fluid was stirred at the room temperature for 5 hours. Then, the reaction fluid was added to 4 liters of distilled water as small droplets. The formed precipitates were collected and dried, and a benzoxazole resin precursor having a functional group at the side chains was obtained.

The number-average molecular weight (Mn) of the obtained benzoxazole resin precursor was obtained using GPC manufactured by TOSO Co., Ltd. and was found to be 28,000 expressed as the value of corresponding polystyrene. The benzoxazole resin precursor obtained above was dissolved into N-methyl-2-pyrrolidone and filtered through a TEFLON (a registered trade name) filter, and a varnish for coating was obtained.

The interlayer films and the semiconductor devices obtained above were evaluated in accordance with the same methods as those used for evaluation of the resin film. The obtained results are shown in Table 2. For the evaluation of the pore size, the small angle X-ray scattering method was used.

TABLE 2

| | Solubility | Glass transition temperature (° C.) | Temperature of thermal decomposition (° C.) | Dielectric constant (−) | Pore size (nm) |
|---|---|---|---|---|---|
| Example 21 | good | 450 or higher | 545 | 2.5 | — |
| Example 22 | good | 450 or higher | 543 | 2.0 | 2 or smaller |
| Example 23 | good | 446 | 549 | 2.1 | 1 or smaller |

As clearly shown in Table 3, the results of Examples 21, 22 and 23 show that the glass transition temperature and the temperature of thermal decomposition were high and the heat resistance was excellent.

The products of Examples 21, 22 and 23 were soluble in solvents and exhibited significantly small dielectric constants and excellent workability and dielectric properties.

Using the obtained semiconductor devices, the delay in the wiring was evaluated.

The degree of delay in the wiring was compared between the semiconductor devices obtained by using the interlayer insulation films of Examples 21, 22 and 23 and semiconductor devices having the same structure as the above devices except that an insulation film of $SiO_2$ was used. For the evaluation, the signal delay time obtained by calculation from the corresponding output frequency of a ring oscillator was used. As the result of comparing the performances of the semiconductor devices, it was confirmed that the semiconductor devices obtained in the present invention showed smaller delays in the wiring, i.e., an increase in the speed by about 10% in Example 21 and increases in the speed by about 20% in Examples 22 and 23.

INDUSTRIAL APPLICABILITY

In accordance with the present invention, the benzoxazole resin precursor providing the polybenzoxazole resin exhibiting excellent heat resistance can be obtained.

In accordance with the present invention, the benzoxazole resin and the resin film exhibiting excellent heat resistance and small permittivity and the semiconductor device using the resin film can be obtained.

In the case of the benzoxazole resin precursor having a specific functional group, excellent workability can be maintained since excellent solubility is maintained, and heat resistance after the ring-closure of the oxazole ring can be improved.

When the resin film having fine pores is formed, in particular, the resin film exhibiting excellent electrical properties (the dielectric property, in particular), physical properties and mechanical properties can be obtained.

The invention claimed is:

1. A benzoxazole resin precursor comprising a repeating unit obtained by reaction of a bisaminophenol compound and a dicarboxylic acid compound, wherein the repeating unit is:
   a repeating unit obtained by reaction of a bisaminophenol compound having a diamondoid structure and a dicarboxylic acid compound having no diamondoid structure and is represented by following formula [1]:

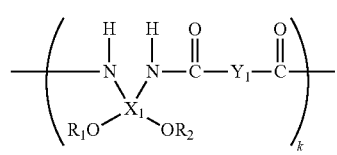

[1]

wherein $R_1$ and $R_2$ each independently represent hydrogen atom or an organic group;

k represents an integer of 2 to 1,000;

$X_1$ represents at least one group selected from the group consisting of a group represented by following formulae [2-1], a group represented by following formulae [2-2] and a group represented by following formulae [3]:

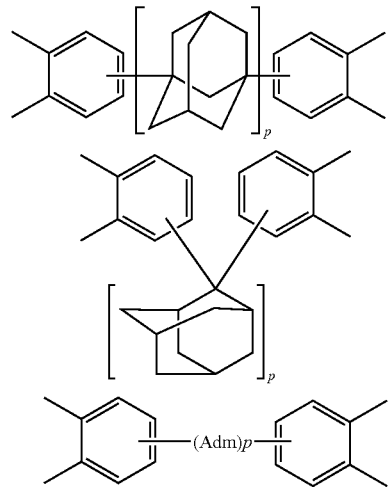

[2-1]

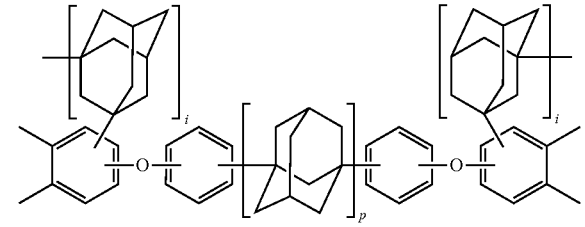

[2-2]

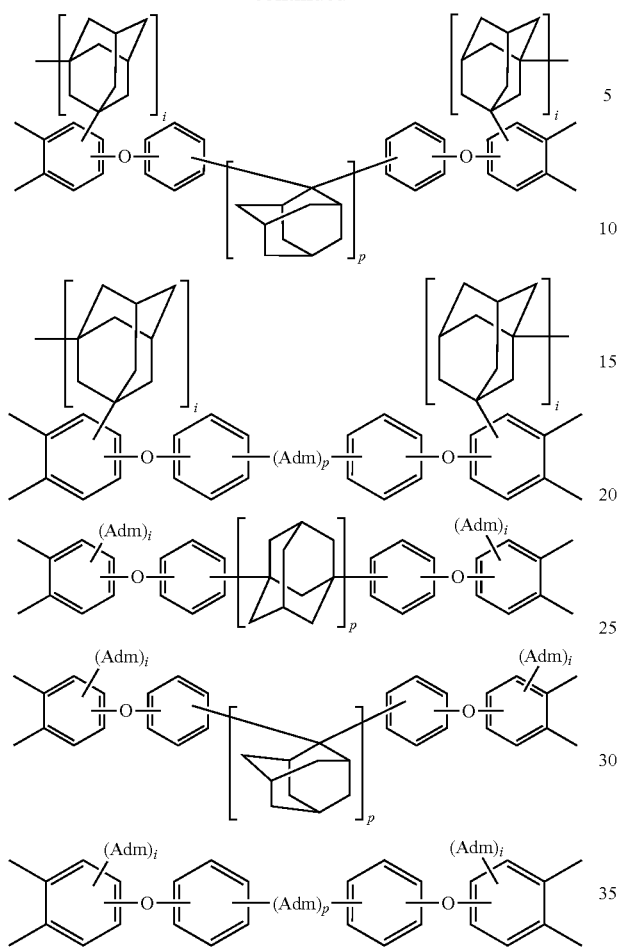

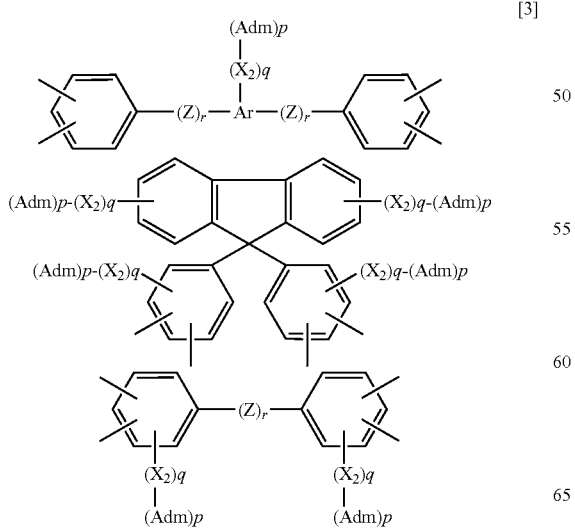

in formulae [2-1] and [2-2], Adm representing adamantyl group which is a smallest unit of the diamondoid structure, p representing a number of 2 or greater and 12 or smaller, and i representing a number of 1 or greater and 12 or smaller,

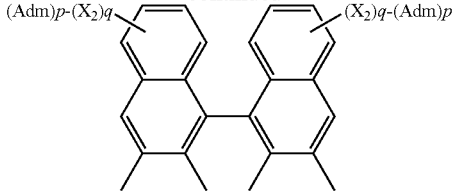

in formulae [3], Adm representing adamantyl group which is a smallest unit of the diamondoid structure, p representing a number of 1 or greater and 12 or smaller, X2 representing ethynyl group or propargyl ether group, Z representing —O—, —SO2-, —CH2-, —C(CH3)2-, —C(CF3)2- or an aromatic group, Ar representing an aromatic group having a functionality of 3 or greater, r representing 0 or 1, and q representing an integer of 1 to 4; and $Y_1$ represents at least one group selected from the group consisting of:

a group represented by following formulae [4]:

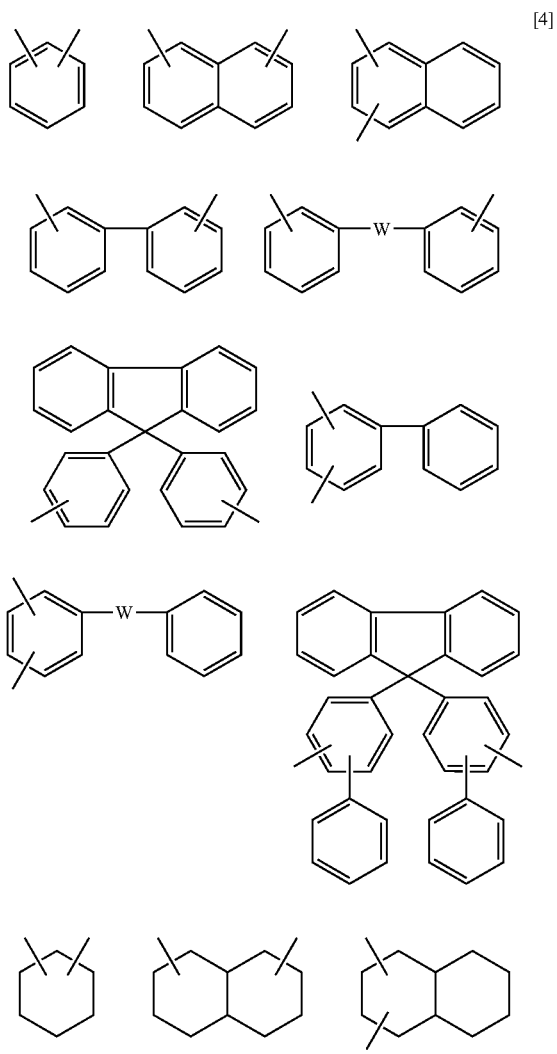

W representing at least one group selected from groups expressed by following formulae [5]:
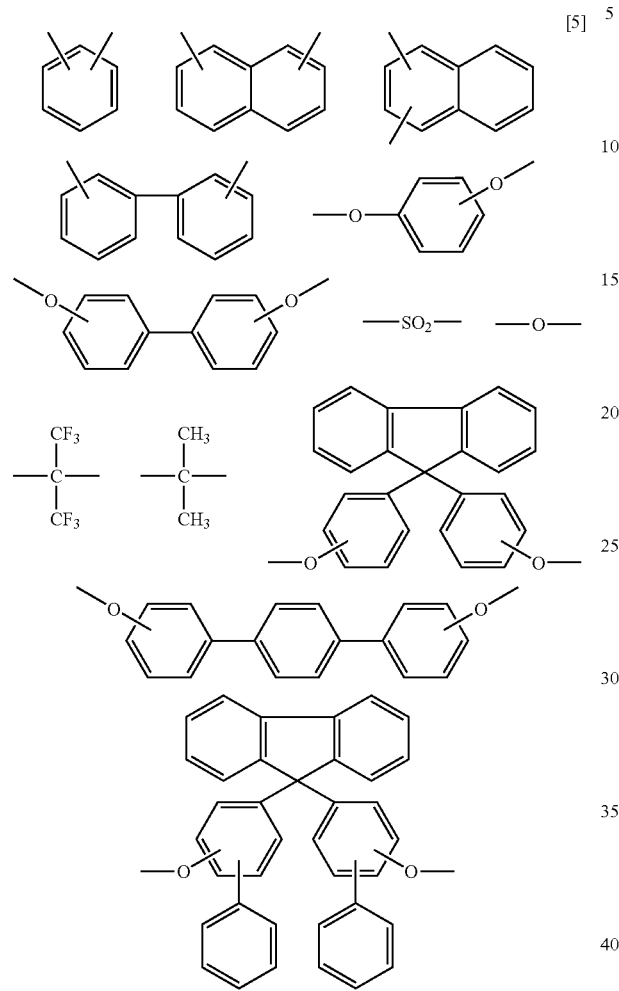
a group represented by following formulae [6-1]:
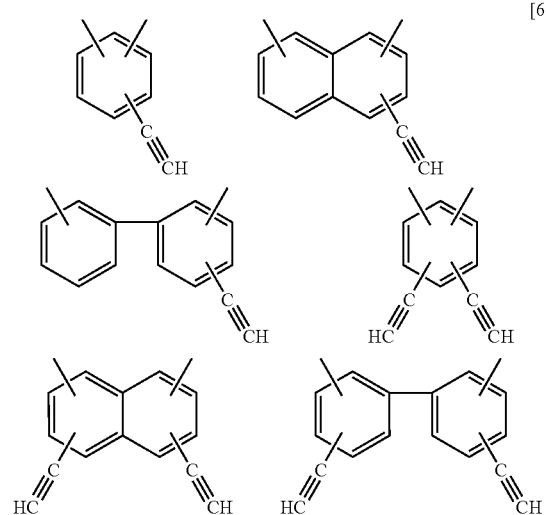
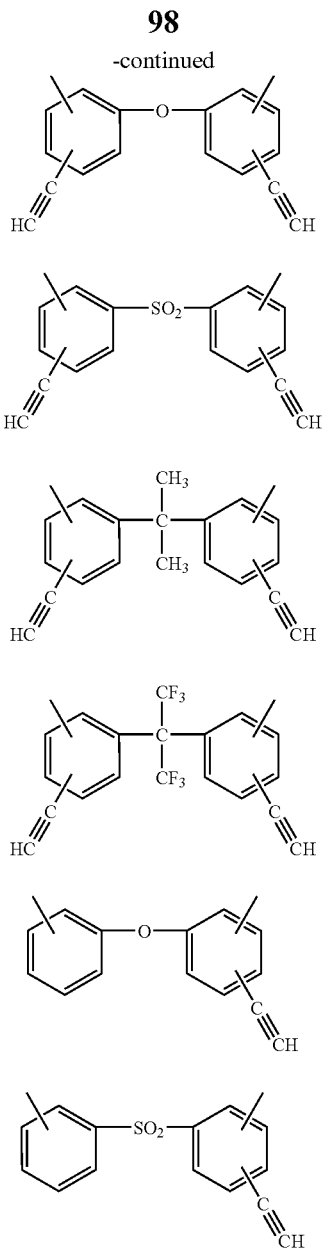
a group represented by following formulae [6-2]
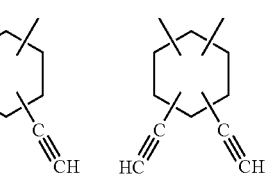

-continued
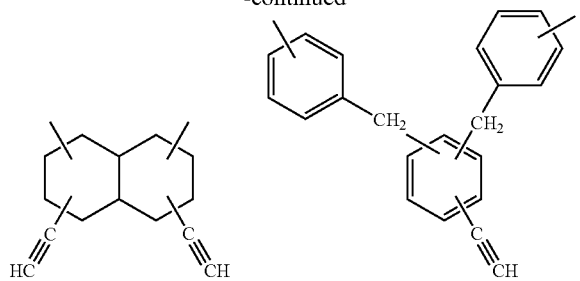
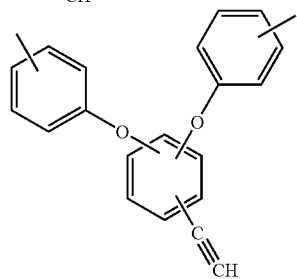
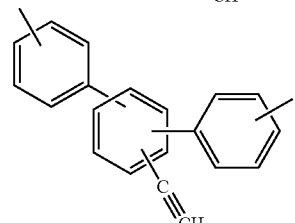
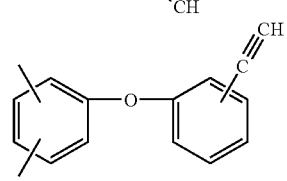
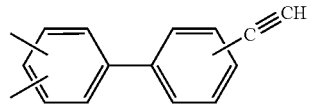
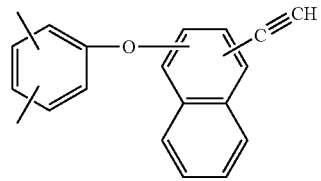
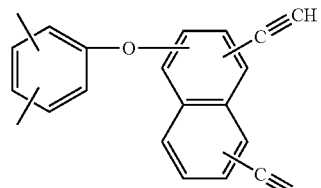
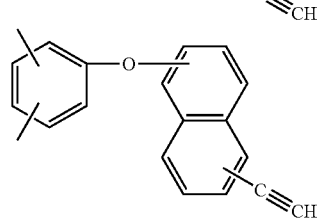
a group represented by following formulae [7-1]:
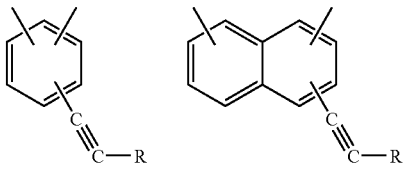
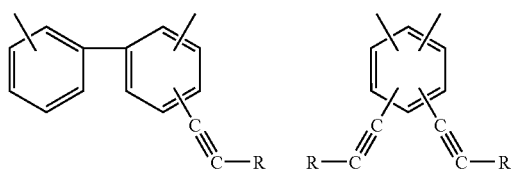
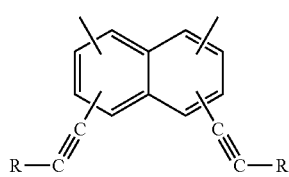
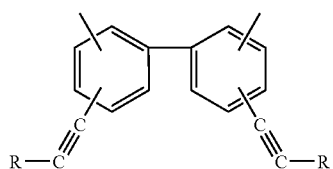
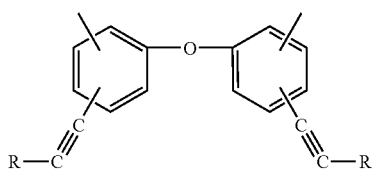
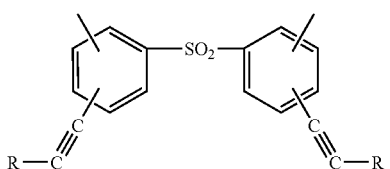
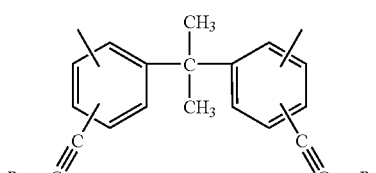
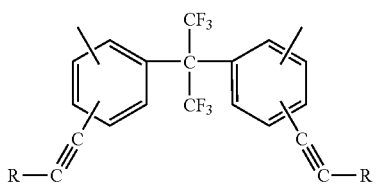
[7-1]

101
-continued
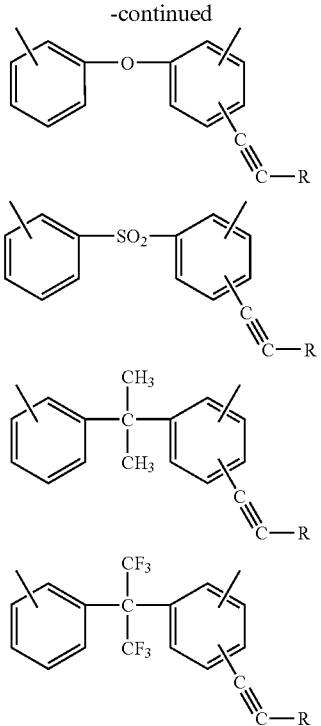
a group represented by following formulae [7-2]
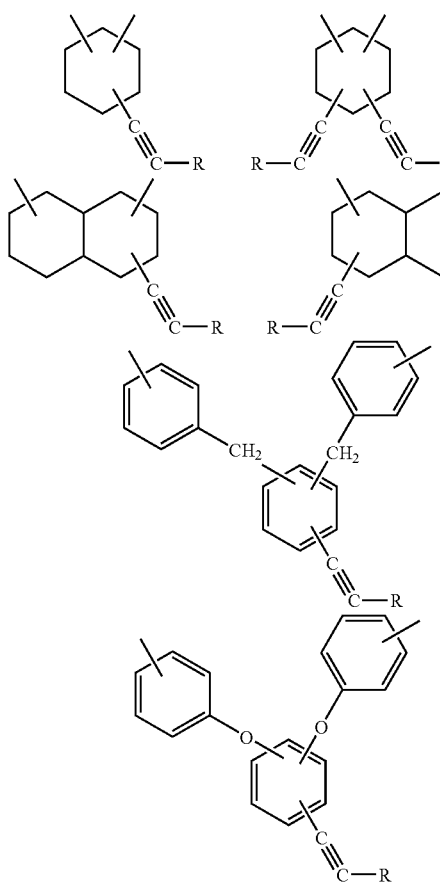
102
-continued
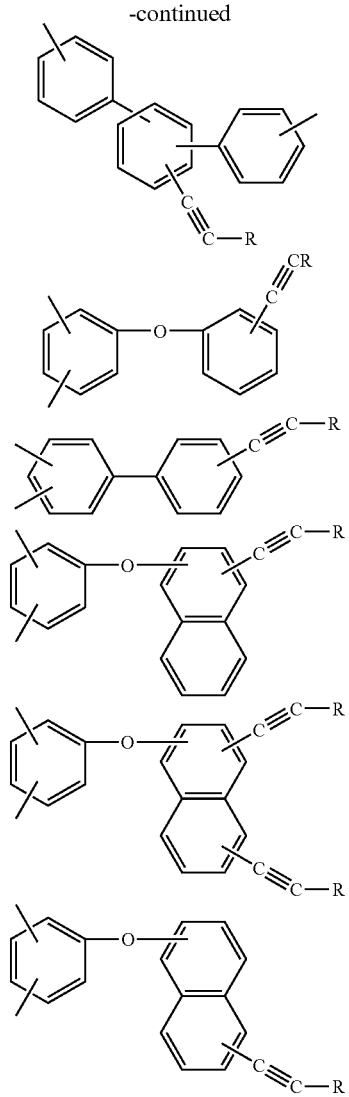
R representing an organic group,
a group represented by following formula [8]:
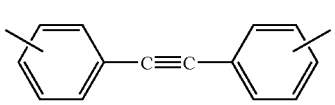
[8]
and
a group represented by following formulae [9]:
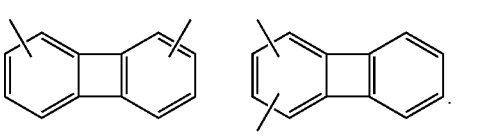
[9]
2. The benzoxazole resin precursor according to claim 1, wherein the diamondoid structure is bonded to a functional group other than the diamondoid structure.

3. The benzoxazole resin precursor according to claim 1, wherein the diamondoid structure of the repeating unit represented by formula [1] has an alkyl group.

4. The benzoxazole resin precursor according to claim 2, wherein the functional group other than the diamondoid structure has an acetylene bond.

5. The benzoxazole resin precursor according to claim 1, which further comprises a repeating unit represented by following formula [10]:

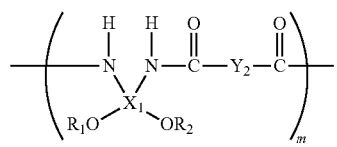

[10]

wherein
$R_1$ and $R_2$ each independently represent hydrogen atom or an organic group;
m represents a number of 2 to 1,000;
$X_1$ represents a group selected from the group consisting of a group represented by following formulae [2-1], a group represented by following formulae [2-2] and a group represented by following formulae [3]:

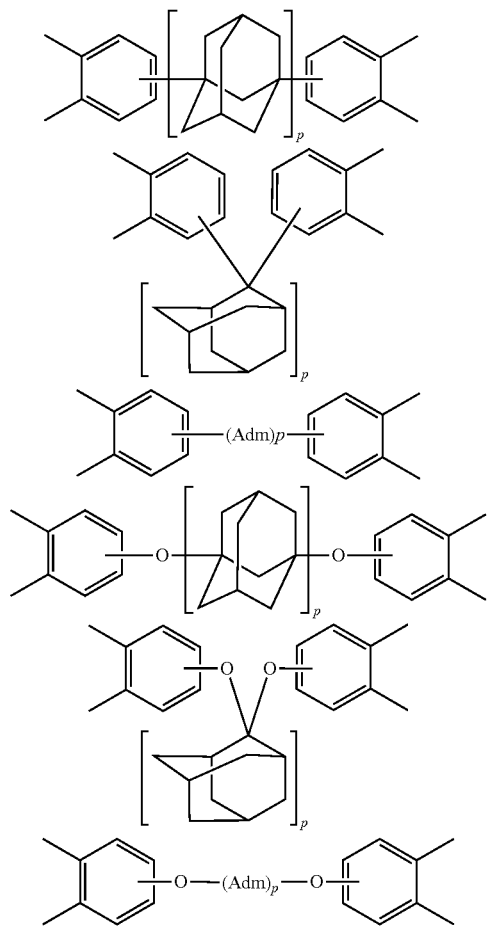

[2-1]

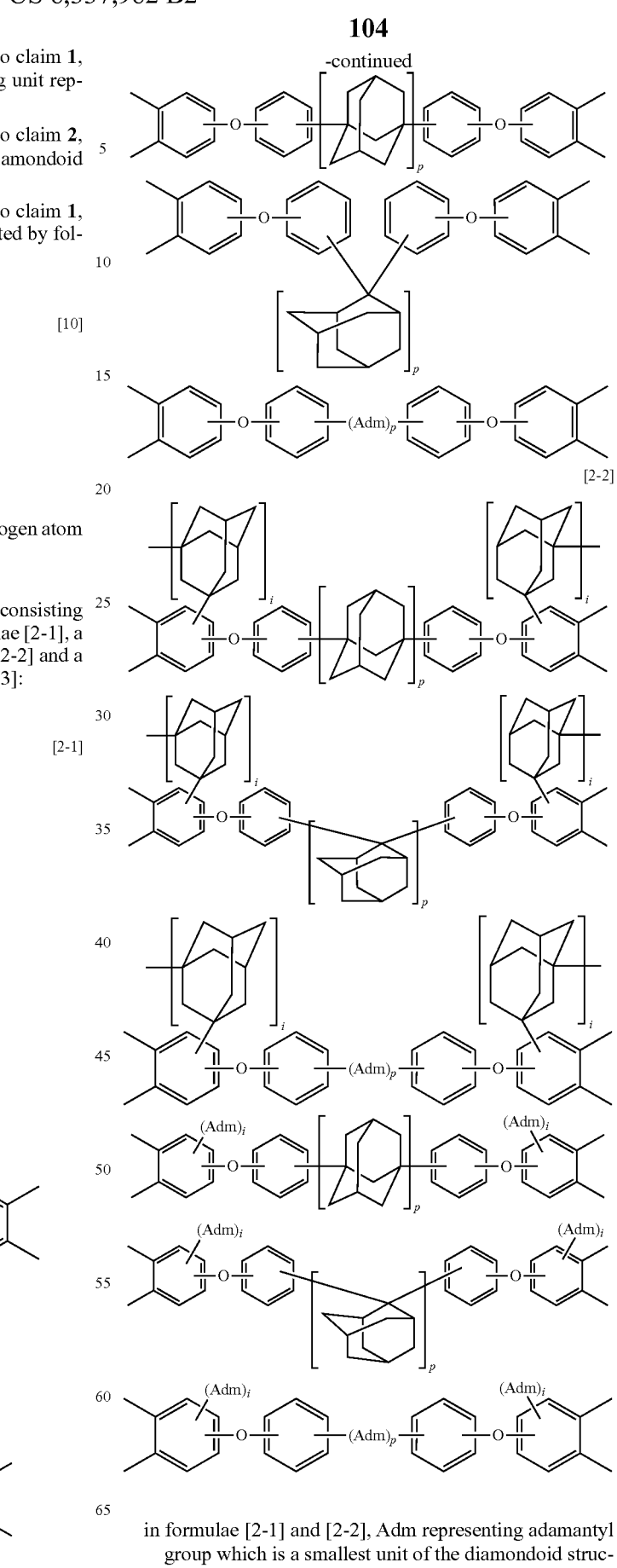

[2-2]

in formulae [2-1] and [2-2], Adm representing adamantyl group which is a smallest unit of the diamondoid structure, p representing a number of 2 or greater and 12 or smaller, and i representing a number of 1 or greater and 12 or smaller,

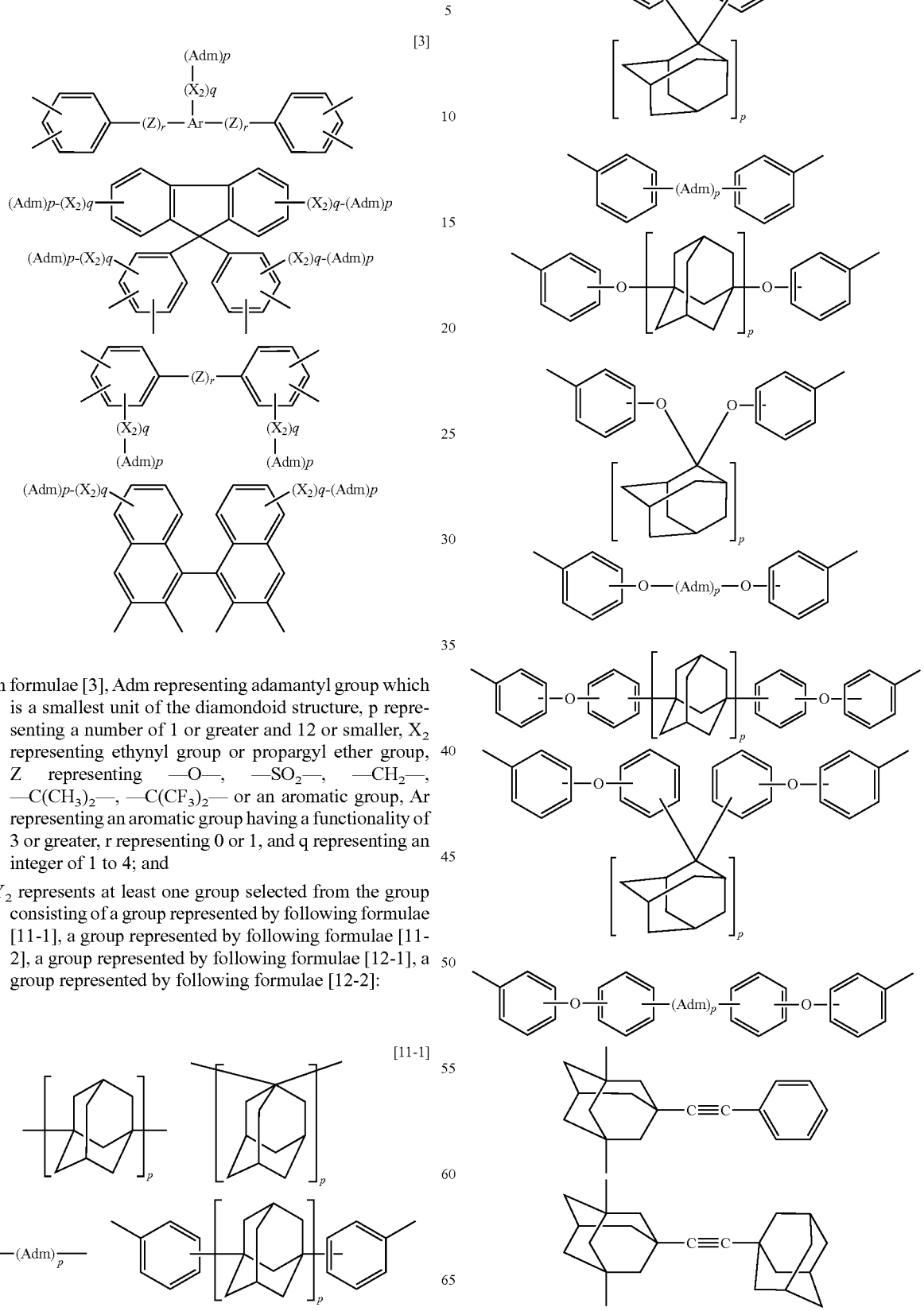

in formulae [3], Adm representing adamantyl group which is a smallest unit of the diamondoid structure, p representing a number of 1 or greater and 12 or smaller, $X_2$ representing ethynyl group or propargyl ether group, Z representing —O—, —$SO_2$—, —$CH_2$—, —$C(CH_3)_2$—, —$C(CF_3)_2$— or an aromatic group, Ar representing an aromatic group having a functionality of 3 or greater, r representing 0 or 1, and q representing an integer of 1 to 4; and $Y_2$ represents at least one group selected from the group consisting of a group represented by following formulae [11-1], a group represented by following formulae [11-2], a group represented by following formulae [12-1], a group represented by following formulae [12-2]:

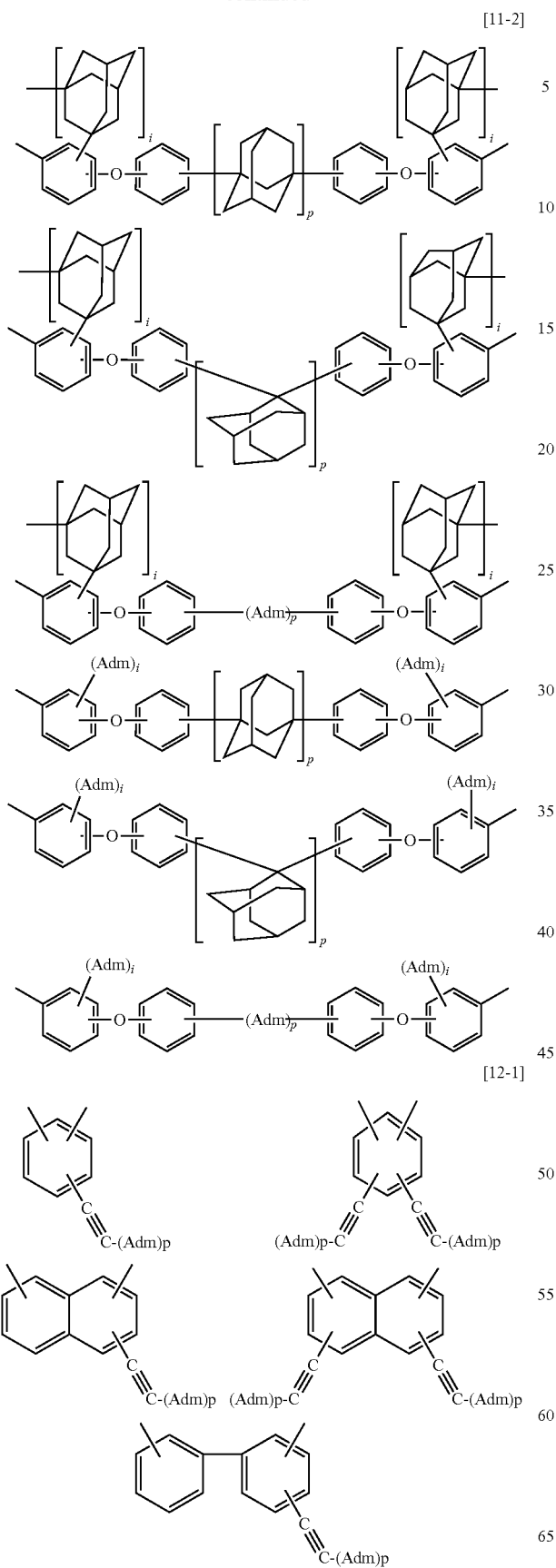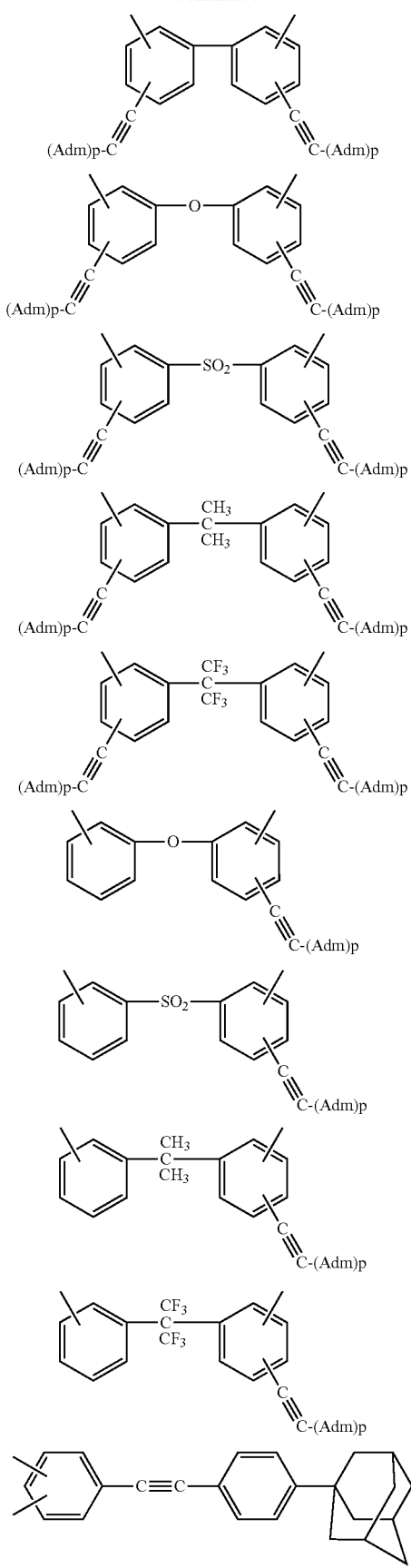

-continued

[12-2]

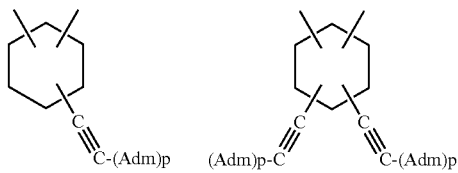

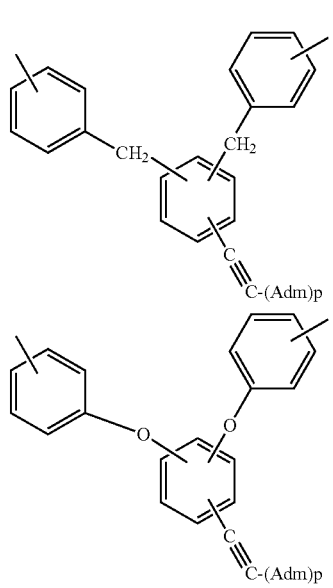

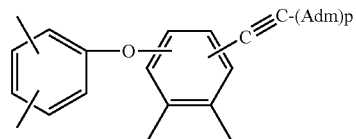

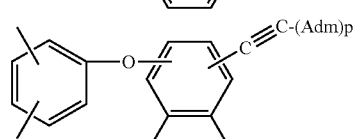

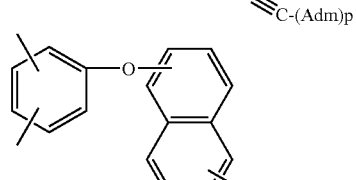

Adm in formulae [11-1], [11-2], [12-1] and [12-2] representing adamantyl group which is a smallest unit of the diamondoid structure, p representing a number of 1 or greater and 12 or smaller, and i representing a number of 1 or greater and 12 or smaller.

6. The benzoxazole resin precursor according to claim 5, which further comprises a repeating unit represented by following formula [13]:

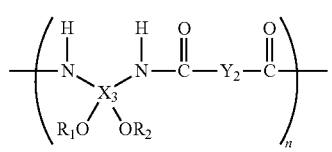

[13]

wherein $R_1$ and $R_2$ each independently represent hydrogen atom or an organic group;

n represents an integer of 2 to 1,000;

$X_3$ represents at least one group selected from the group consisting of:

a group represented by following formulae [14]:

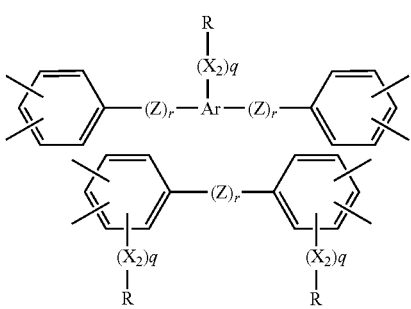

[14]

111

-continued

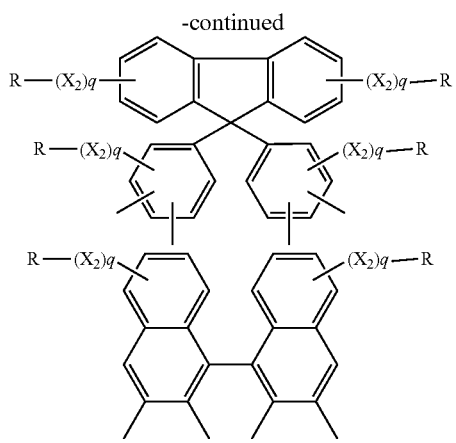

X2 representing ethynyl group or propargyl ether group, Z representing —O—, —SO2-, —CH2-, —C(CH3)2-, —C(CF3)2- or an aromatic group, Ar representing an aromatic group having a functionality of 3 or greater, R representing a hydrogen atom or an organic group, r representing 0 or 1, and q representing an integer of 1 to 4, and a group represented by following formulae [15]:

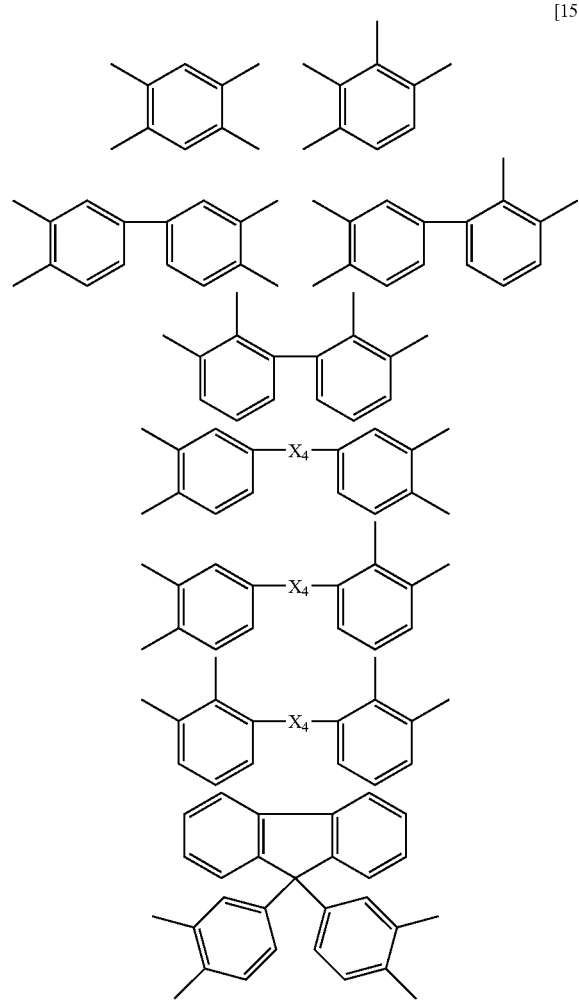

[15]

112

-continued

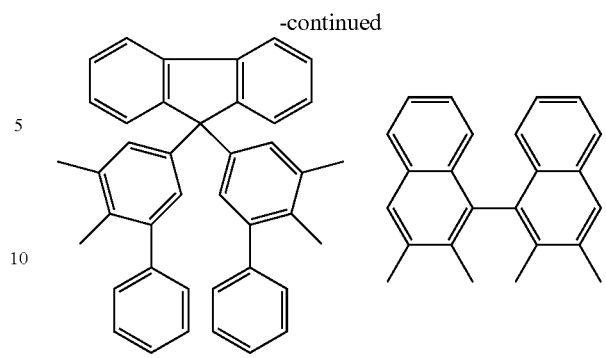

$X_4$ representing at least one group selected from groups expressed by following formulae [16]:

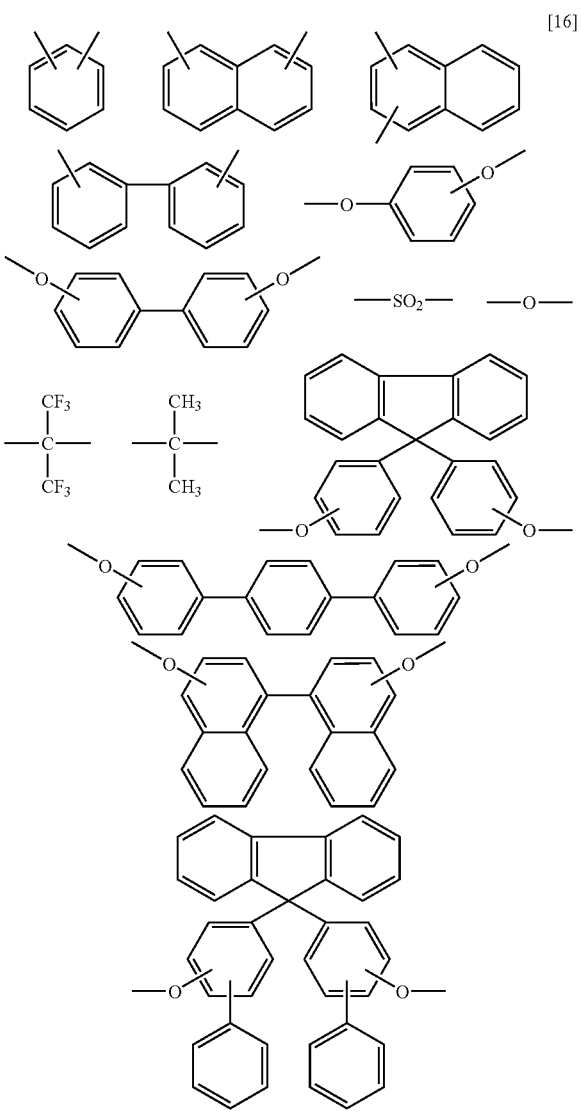

[16]

and $Y_2$ represents at least one group selected from the group consisting of a group represented by following formulae [11-1], a group represented by following formulae [11-

2], a group represented by following formulae [12-1] and a group represented by following formulae [12-2]:
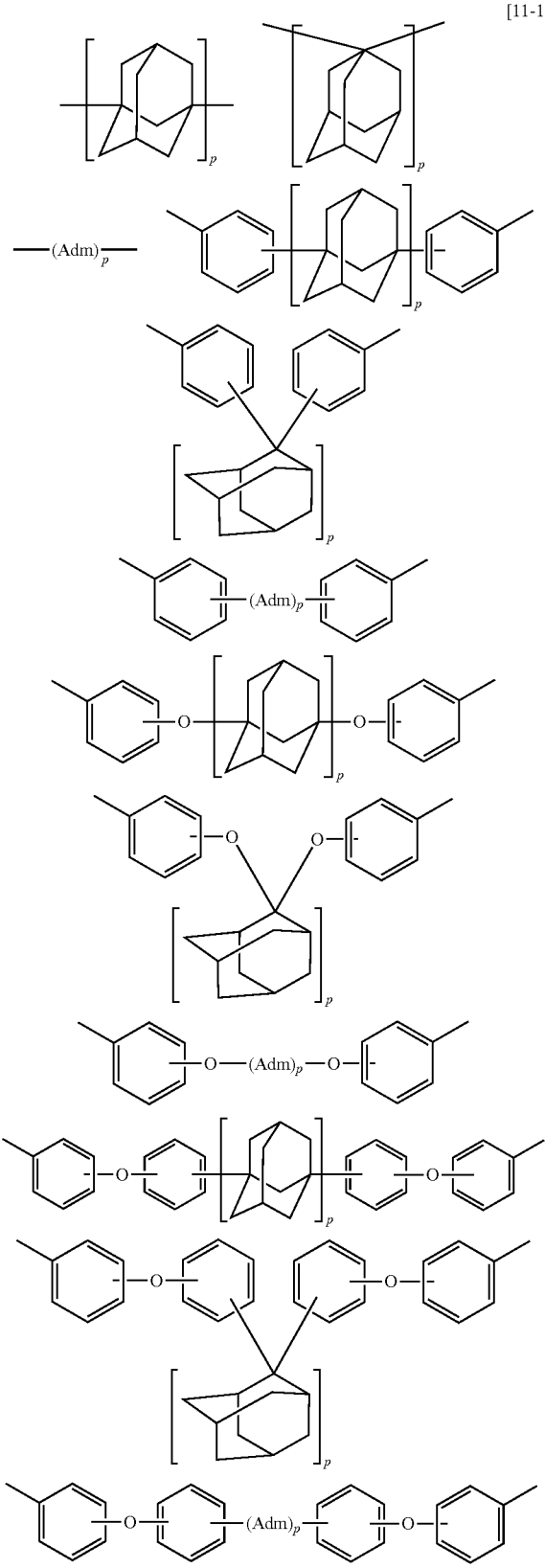
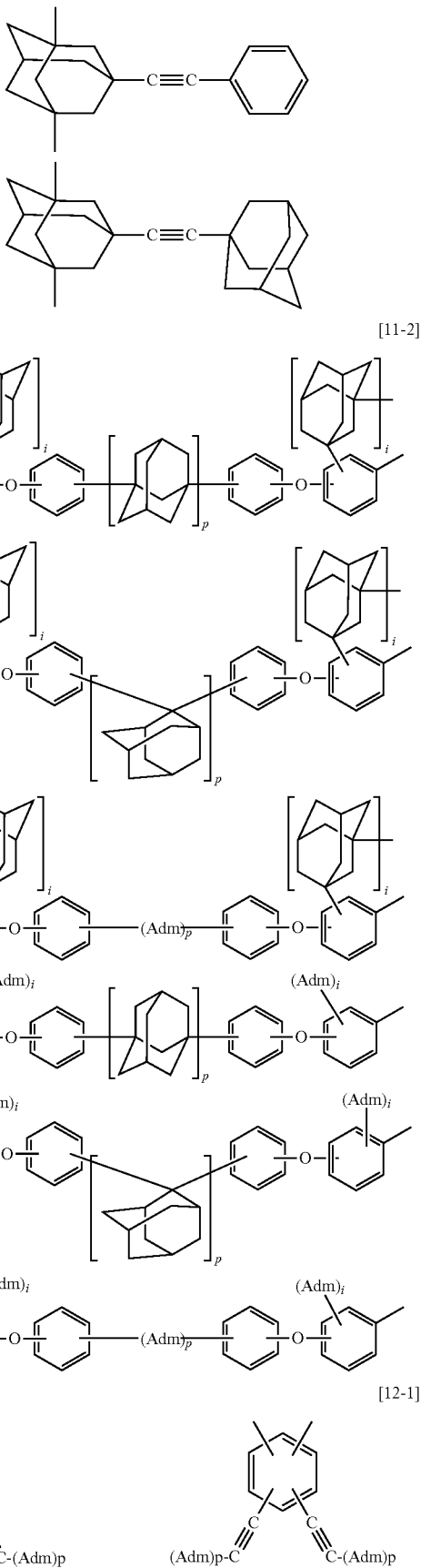

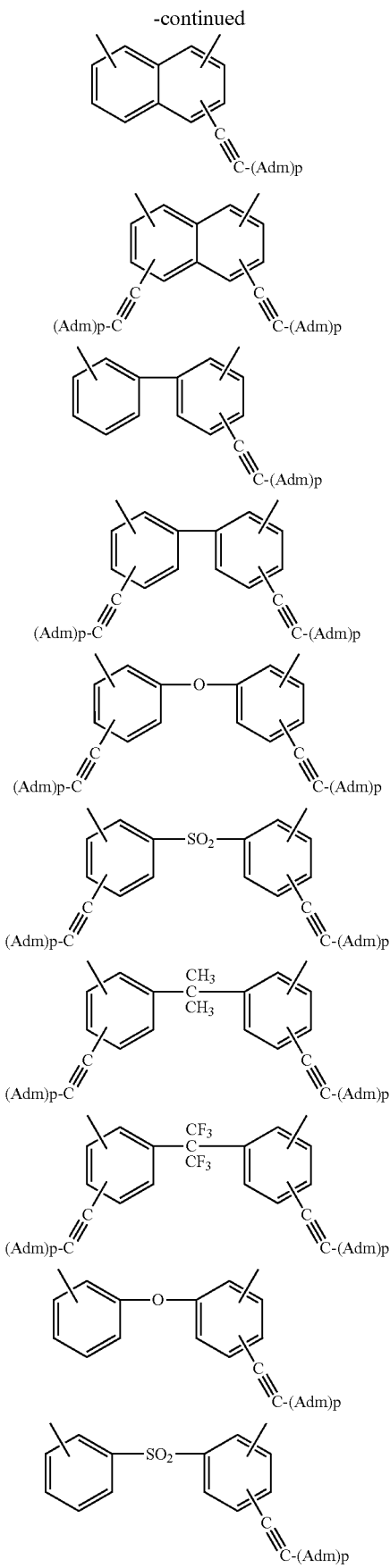
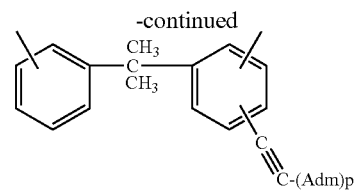

-continued

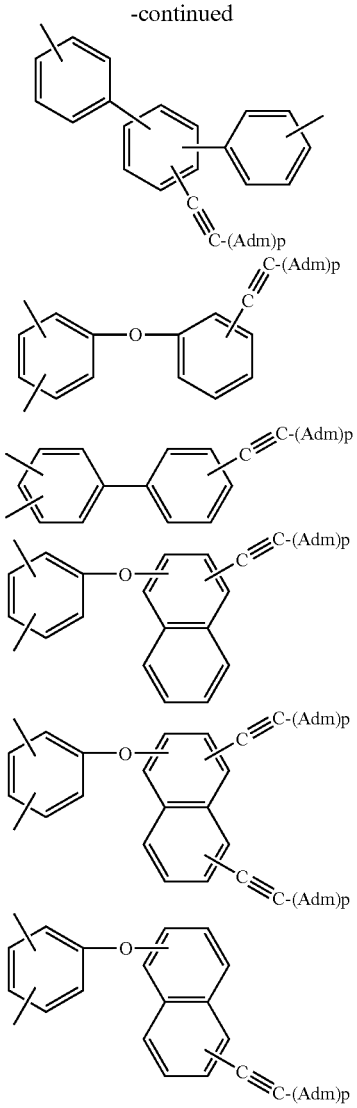

Adm in formulae [11-1], [11-2], [12-1] and [12-2] representing adamantyl group which is a smallest unit of the diamondoid structure, p representing a number of 1 or greater and 12 or smaller, and i representing a number of 1 or greater and 12 or smaller.

7. The benzoxazole resin precursor according to claim 6, which further comprises a repeating unit represented by following formula [17]:

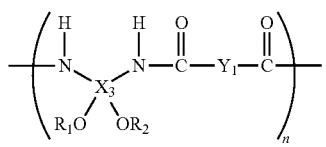

[17]

wherein $R_1$ and $R_2$ each independently represent hydrogen atom or an organic group; n represents an integer of 2 to 1,000; $X_3$ represents at least one group selected from the group consisting of a group represented by formulae [14] and a group represented by formulae [15] which are defined in claim 6; and $Y_1$ represents at least one group selected from the group consisting of a group represented by formulae [4], a group represented by formulae [6-1], a group represented by formulae [6-2], a group represented by formulae [7-1] a group represented by formulae [7-2], a group represented by formula [8] and a group represented by formulae [9], each of afore-said formulae being defined in claim 1.

8. A polybenzoxazole resin obtained by a ring-closing reaction with dehydration of the benzoxazole resin precursor described in claim 1.

9. A benzoxazole resin precursor composition which comprises at least two benzoxazole resin precursors selected from the group consisting of:

(a) benzoxazole resin precursor described in claim 1

(b) the benzoxazole resin precursor described in (a) which further comprises a repeating unit represented by following formula [10]:

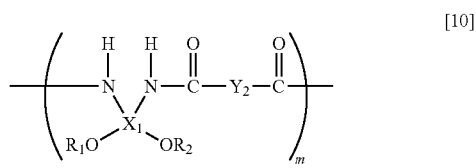

[10]

wherein $R_1$ and $R_2$ each independently represent hydrogen atom or an organic group;

m represents a number of 2 to 1,000;

$X_1$ represents a group selected from the group consisting of a group represented by formulae [2-1], a group represented by formulae [2-2] and a group represented by formula [3] as defined in claim 1 above: and $Y_2$ represents at least one group selected from the group consisting of a group represented by following formulae [11-1], a group represented by following formulae [11-2], a group represented by following formulae [12-1], a group represented by following formulae [12-2]:

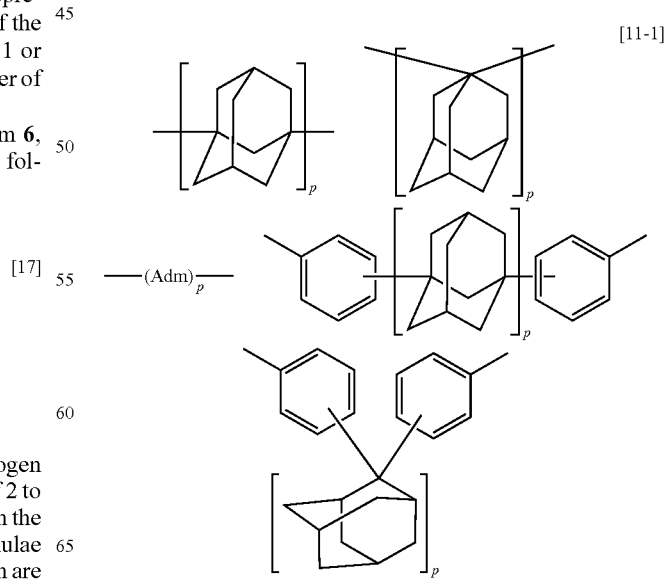

[11-1]

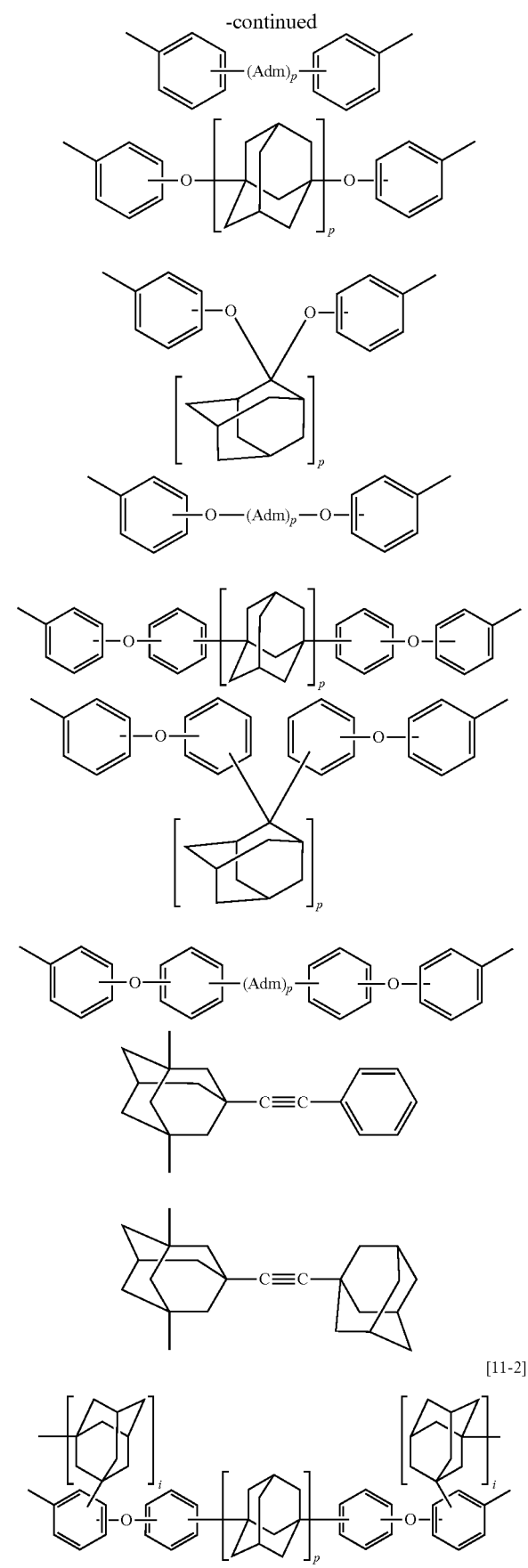
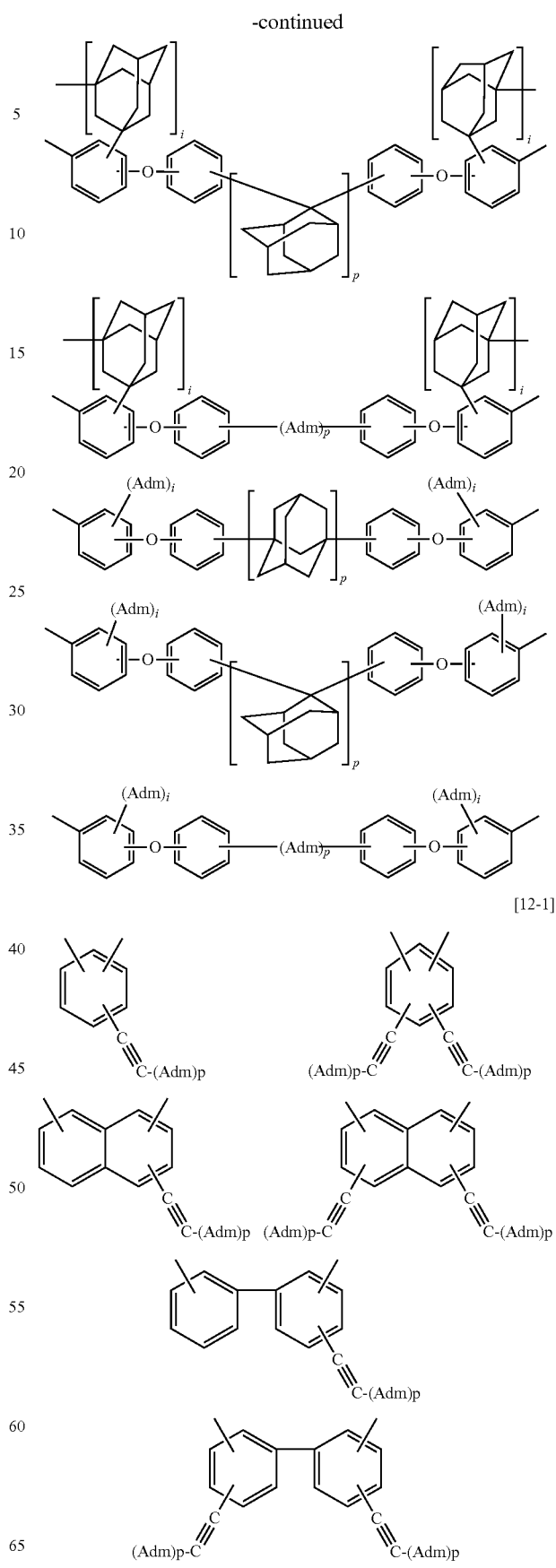

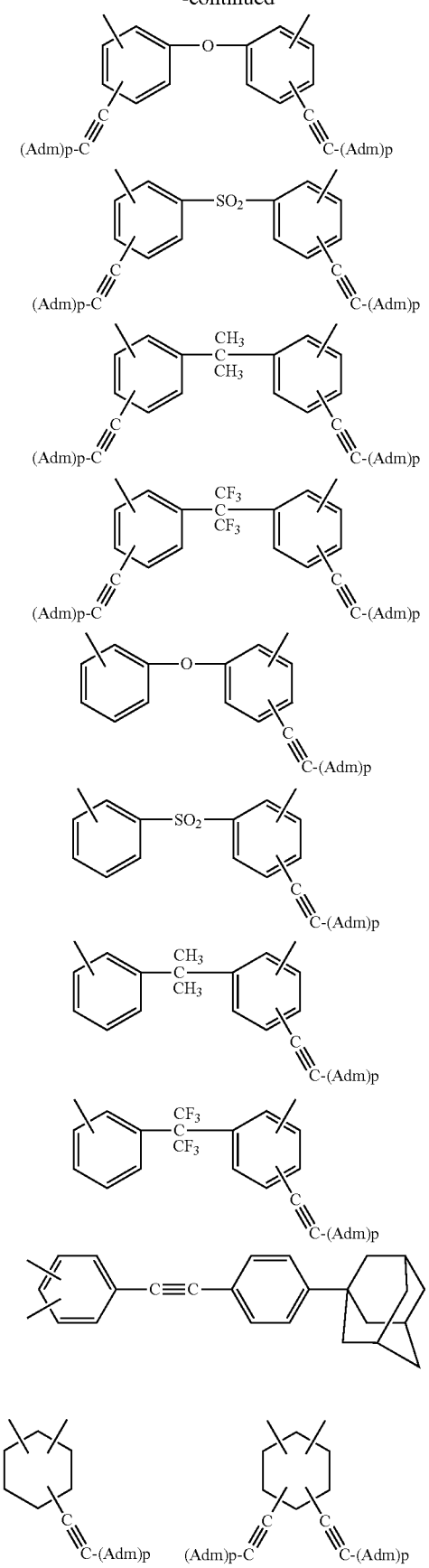
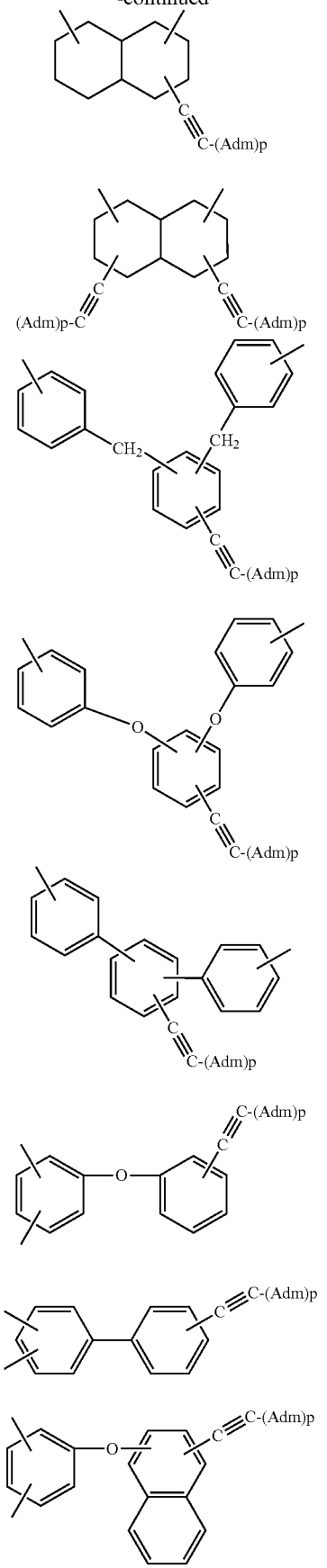

-continued

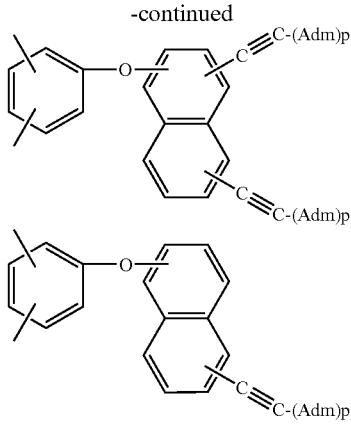

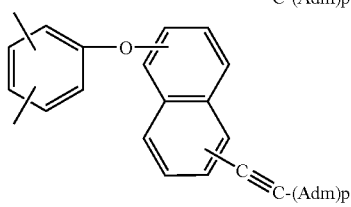

Adm in formulae [11-1], [11-2], [12-1] and [12-2] representing adamantyl group which is a smallest unit of the diamondoid structure, p representing a number of 1 or greater and 12 or smaller, and i representing a number of 1 or greater and 12 or smaller, (c) the benzoxazole resin precursor described in (a) or (b) above, which further comprises a repeating unit represented by following formula [13]:

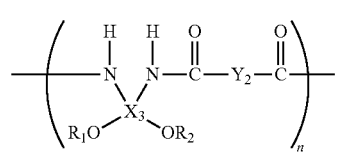

[13]

wherein
$R_1$ and $R_2$ each independently represent hydrogen atom or an organic group;
n represents an integer of 2 to 1,000;
$X_3$ represents at least one group selected from the group consisting of:
a group represented by following formulae [14]:

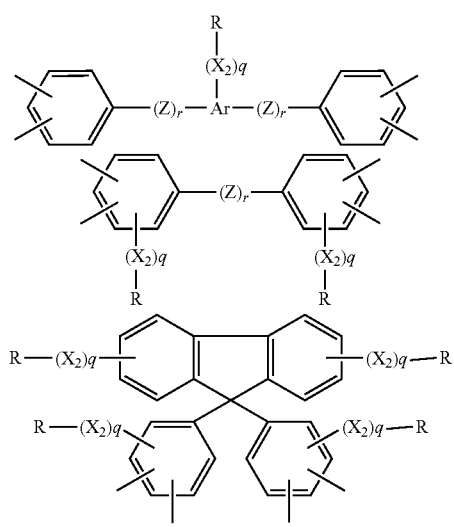

[14]

-continued

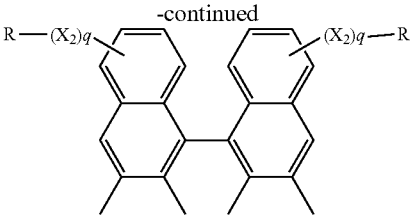

$X_2$ representing ethynyl group or propargyl ether group, Z representing —O—, —SO$_2$—, —CH$_2$—, —C(CH$_3$)$_2$—, —C(CF$_3$)$_2$— or an aromatic group, Ar representing an aromatic group having a functionality of 3 or greater, R representing a hydrogen atom or an organic-group, r representing 0 or 1, and q representing an integer of 1 to 4, and a group represented by following formulae [15]:

[15]

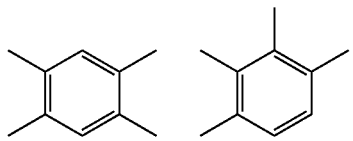

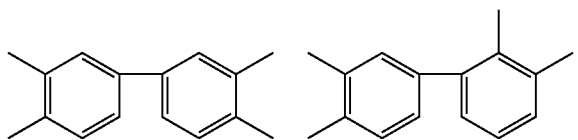

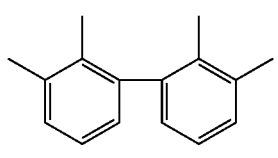

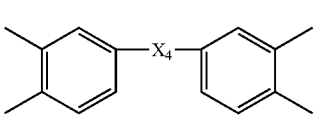

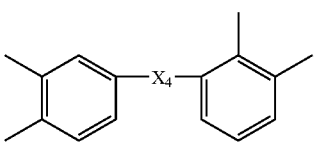

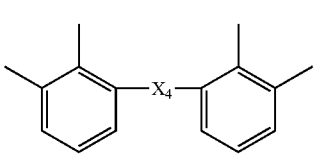

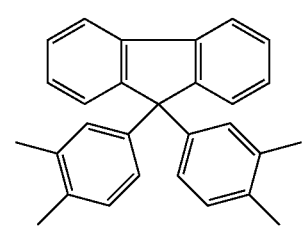

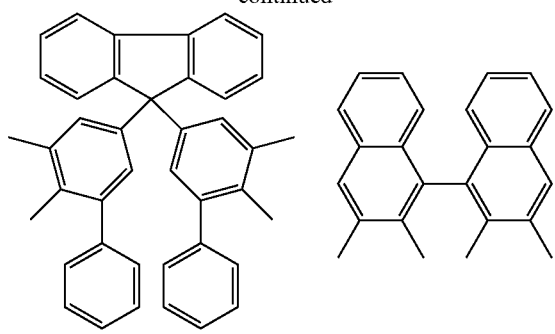

$X_4$ representing at least one group selected from groups expressed by following formulae [16]:

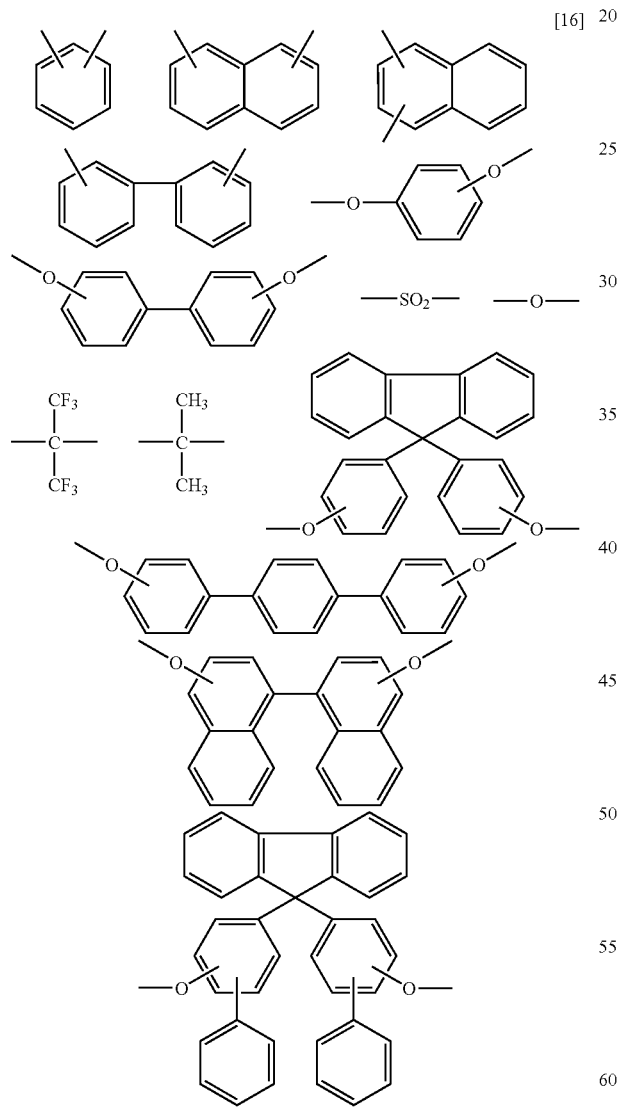

and $Y_2$ represents at least one group selected from the group consisting of a group represented by formulae [11-1], a group represented by formulae [11-2], a group represented by formulae [12-1] and a group represented by formulae [12-2] each of afore-said formulae being defined in (c) above, (d) the benzoxazole resin precursor described in (a) or (b), wherein the diamondoid structure is bonded to a functional group other than the diamondoid structure, (e) the benzoxazole resin precursor described in (a), (b) or (c), wherein the diamondoid structure having the repeating unit represented by formula [1] in (a), formula [10] in (b) or formula [13] in (c) above, respectively, has an alkyl group, (f) the benzoxazole resin precursor described in (d), wherein the functional group other than the diamondoid structure has an acetylene bond, and (g) the benzoxazole resin precursor described in (c) which further comprises a repeating unit represented by following formula [17]:

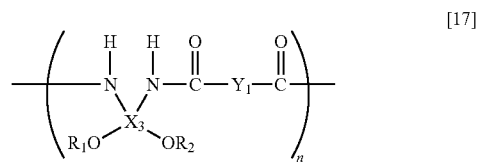

wherein $R_1$ and $R_2$ each independently represent hydrogen atom or an organic group; n represents an integer of 2 to 1,000; $X_3$ represents at least one group selected from the group consisting of a group represented by formulae [14] and a group represented by formulae [15] which are defined in (c) above; and $Y_1$ represents at least one group selected from the group consisting of a group represented by formulae [4], a group represented by formulae [6-1], a group represented by formulae [6-2], a group represented by formulae [7-1], a group represented by formulae [7-2], a group represented by formula [8] and a group represented by formulae [9] each of afore-said formulae being defined in (a) above, wherein said composition comprises at least one benzoxazole resin precursor as defined in (a) to (f) above.

10. A varnish which comprises:
(a) benzoxazole resin precursor described in claim 1
(b) the benzoxazole resin precursor described in (a) which further comprises a repeating unit represented by following formula [10]:

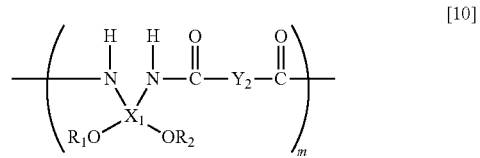

wherein
$R_1$ and $R_2$ each independently represent hydrogen atom or an organic group;
m represents a number of 2 to 1,000;
$X_1$ represents a group selected from the group consisting of a group represented by formulae [2-1], a group represented by formulae [2-2] and a group represented by formula [3] each of afore-said formulae being defined in claim 1 above; and $Y_2$ represents at least one group selected from the group consisting of a group represented by following formulae [11-1], a group represented by following formulae [11-2], a group represented by following formulae [12-1], a group represented by following formulae [12-2]:
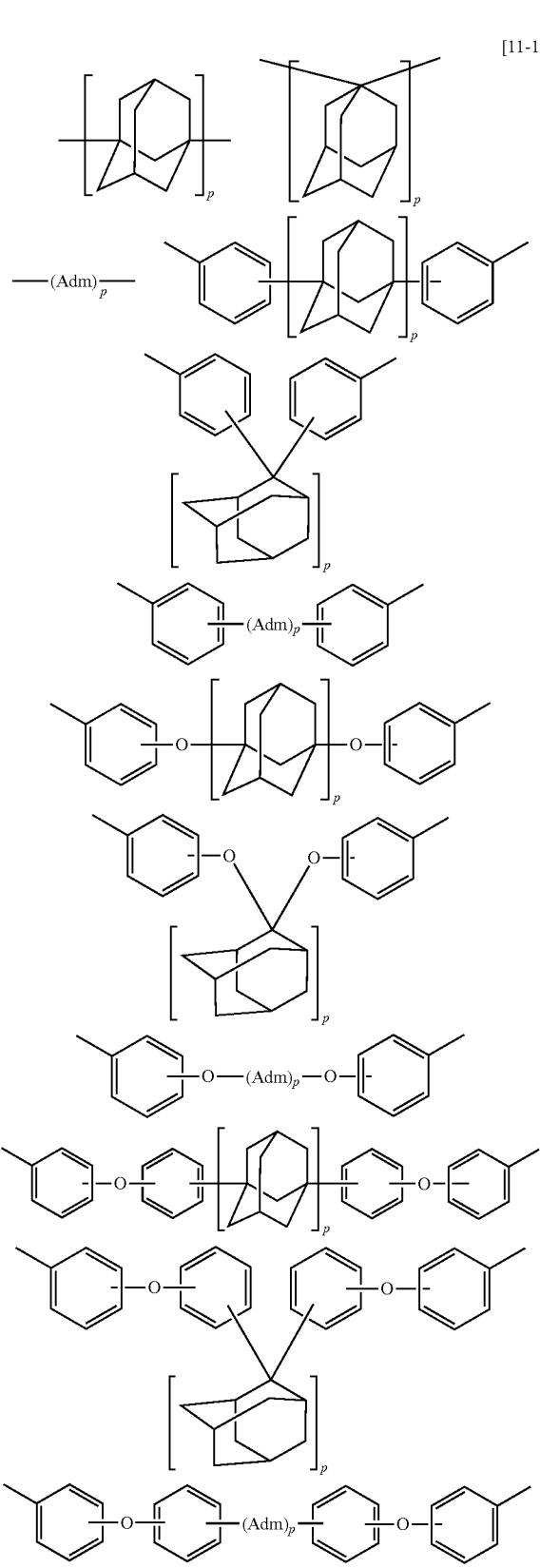
[11-1]
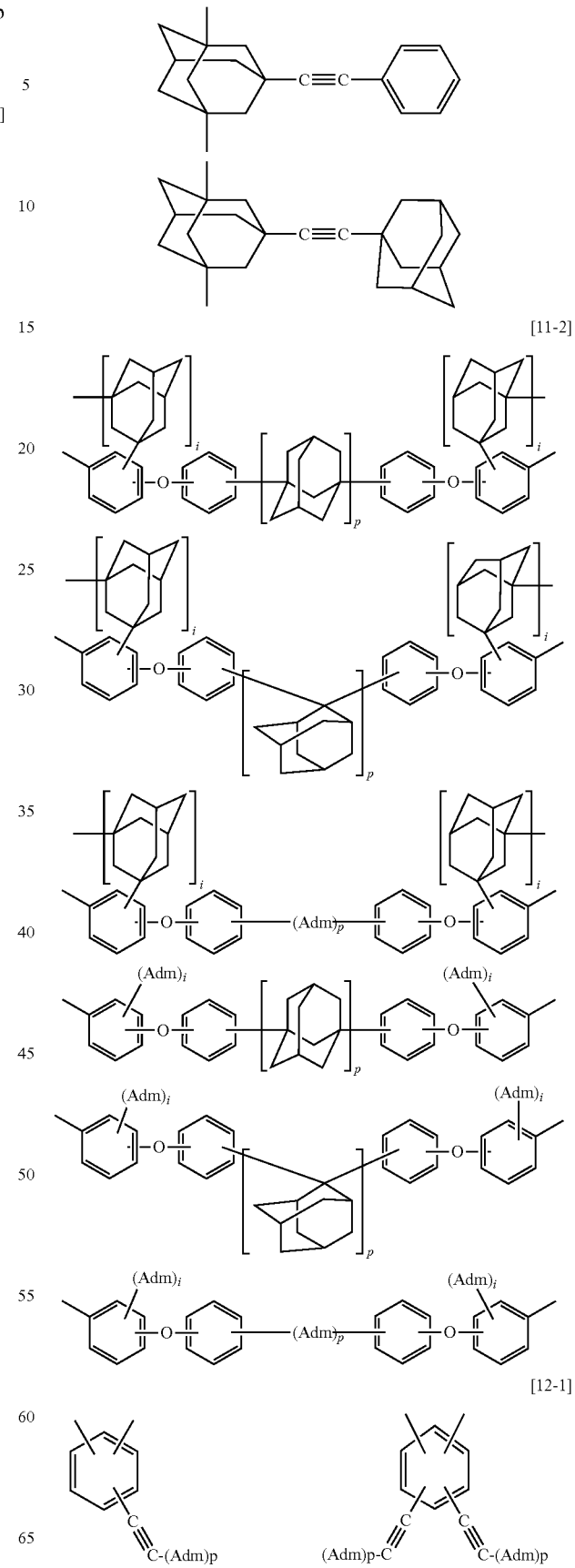
-continued
[11-2]
[12-1]

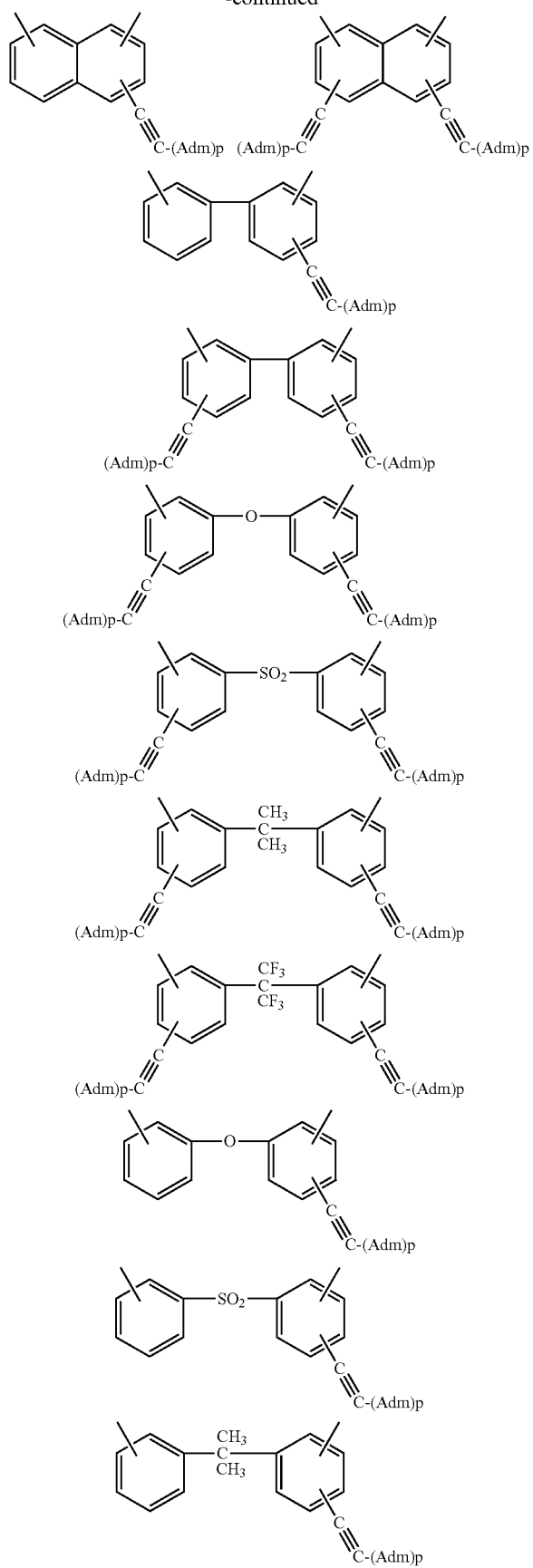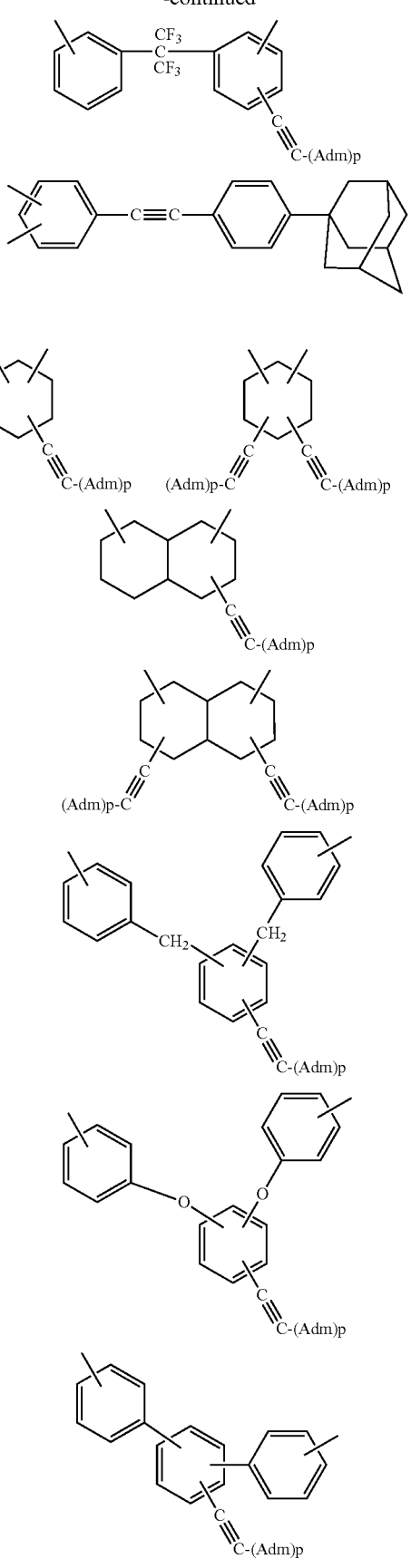

-continued

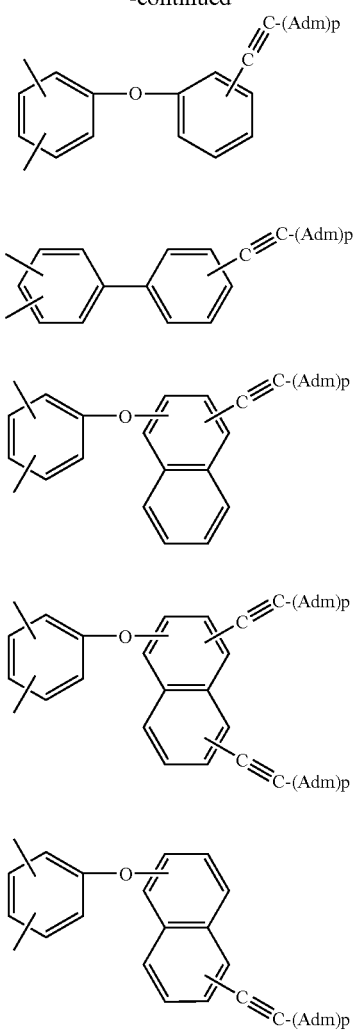

Adm in formulae [11-1], [11-2], [12-1] and [12-2] representing adamantyl group which is a smallest unit of the diamondoid structure, p representing a number of 1 or greater and 12 or smaller, and i representing a number of 1 or greater and 12 or smaller, (c) the benzoxazole resin precursor described in (a) or (b) which further comprises a repeating unit represented by following formula [13]:

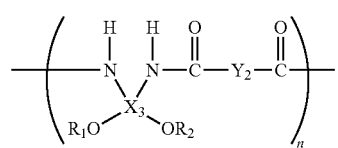

[13]

wherein

R1 and R2 each independently represent hydrogen atom or an organic group;

n represents an integer of 2 to 1,000;

X3 represents at least one group selected from the group consisting of:

a group represented by following formulae [14]:

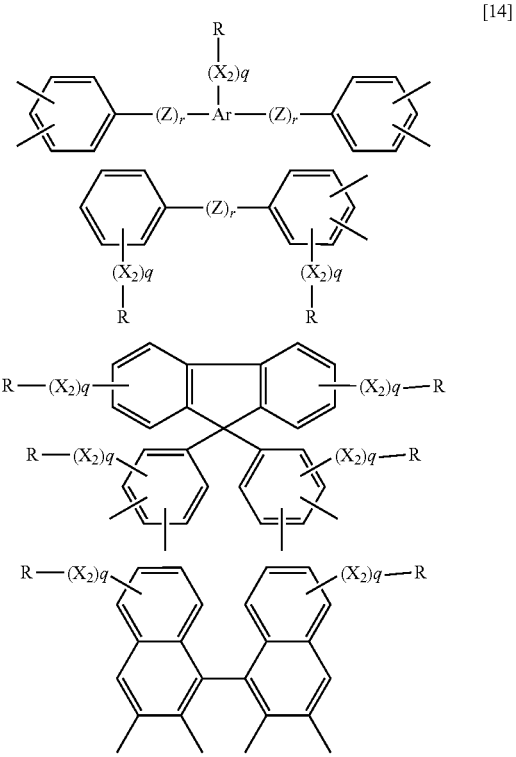

[14]

$X_2$ representing ethynyl group or propargyl ether group, Z representing —O—, —SO$_2$—, —CH$_2$—, —C(CH$_3$)$_2$—, —C(CF$_3$)$_2$— or an aromatic group, Ar representing an aromatic group having a functionality of 3 or greater, R representing a hydrogen atom or an organic group, r representing 0 or 1, and q representing an integer of 1 to 4, and a group represented by following formulae [15]:

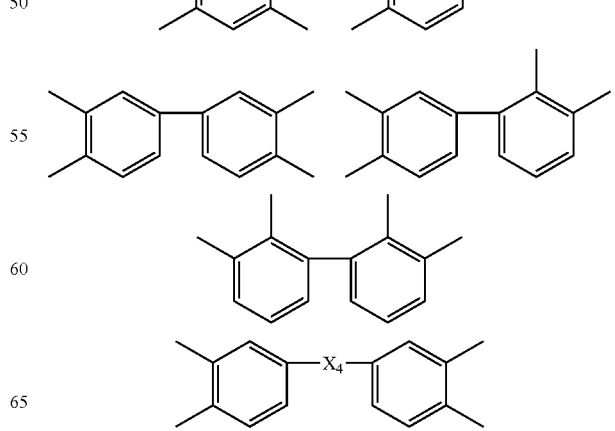

[15]

-continued

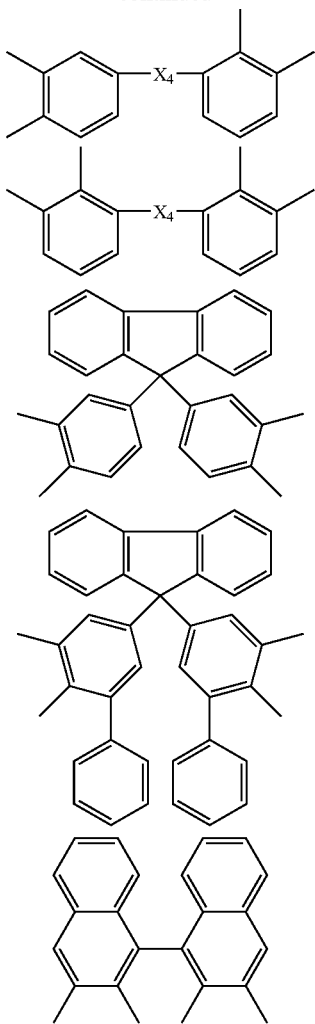

$X_4$ representing at least one group selected from groups expressed by following formulae [16]:

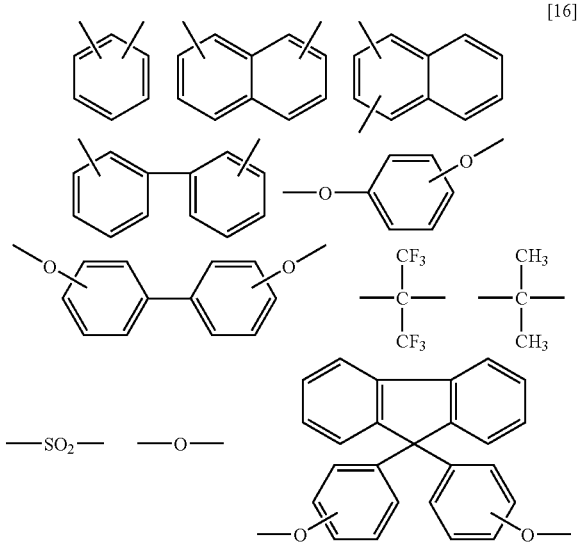

-continued

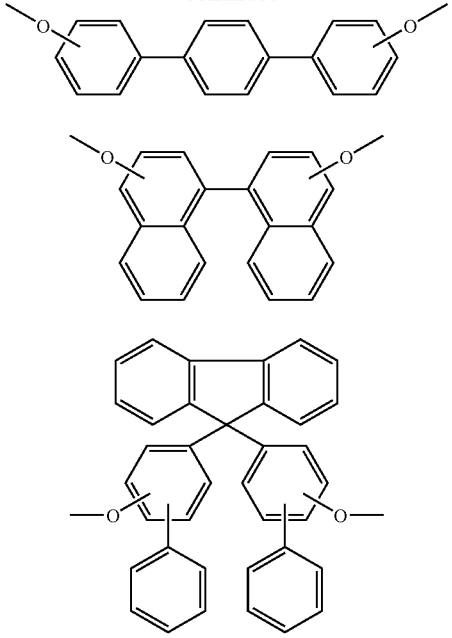

and $Y_2$ represents at least one group selected from the group consisting of a group represented by formulae [11-1], a group represented by formulae [11-2], a group represented by formulae [12-1] and a group represented by formulae [12-2] each of afore-said formulae being defined above, (d) the benzoxazole resin precursor described in (a) or (b), wherein the diamondoid structure is bonded to a functional group other than the diamondoid structure, (e) the benzoxazole resin precursor described in (a), (b), or (c), wherein the diamondoid structure having the repeating unit represented by formulae [1] in (a), [10] in (b) or [13] in (c) above, respectively, has an alkyl group, (f) the benzoxazole resin precursor described in (d), wherein the functional group other than the diamondoid structure has an acetylene bond, and (g) a benzoxazole resin precursor described in (c) which further comprises a repeating unit represented by following formula [17]:

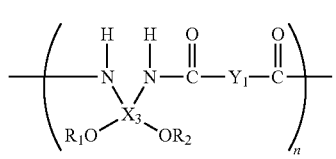

wherein $R_1$ and $R_2$ each independently represent hydrogen atom or an organic group; n represents an integer of 2 to 1,000; $X_3$ represents at least one group selected from the group consisting of a group represented by formulae [14] and a group represented by formulae [15] which are defined in (c) above; and $Y_1$ represents at least one group selected from the group consisting of a group represented by formulae [4], a group represented by formulae [6-1] a group represented by formulae [6-2], a group represented by formulae [7-1], a group represented by formulae [7-2], a group represented by formula [8] and a group represented by formulae [9], each of afore-said formulae being defined in (a) above, or (h) a polybenzoxazole resin obtained by a ring-closing reaction with dehydration of the benzoxazole resin precursor described in any one of (a) to (g) above, or (i) a benzoxazole resin precursor composition which comprises at least two benzoxazole resin precursors defined in (a) to (g) above, wherein said composition comprises at least a benzoxazole resin precursor as defined in (a) to (f) above, and an organic solvent which can dissolve or disperse the benzoxazole resin precursor, the polybenzoxazole resin or the benzoxazole resin precursor composition.

11. A resin film which comprises at least one benzoxazole resin precursor, a polybenzoxazole resin or a benzoxazole resin precursor composition, which is selected from the group consisting of:

(a) the benzoxazole resin precursor described in claim 1;

(b) the benzoxazole resin precursor described in (a) which further comprises a repeating unit represented by following formula [10]:

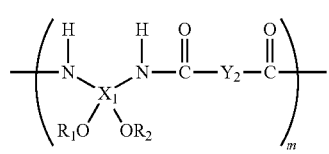

[10]

wherein $R_1$ and $R_2$ each independently represent hydrogen atom or an organic group;

m represents a number of 2 to 1,000;

$X_1$ represents a group selected from the group consisting of a group represented by formulae [2-1], a group represented by formulae [2-2] and a group represented by formula [3], each of the formulae being defined above; and $Y_2$ represents at least one group selected from the group consisting of a group represented by following formulae [11-1], a group represented by following formulae [11-2], a group represented by following formulae [12-1], a group represented by following formulae [12-2]:

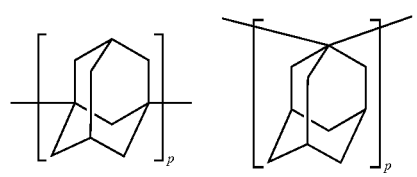

[11-1]

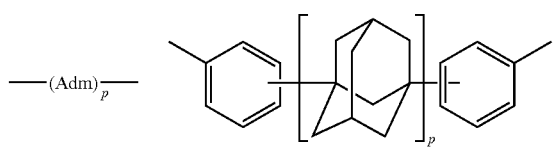

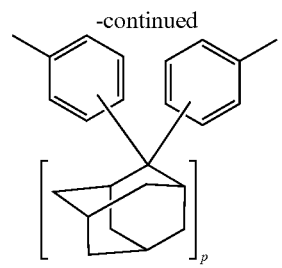

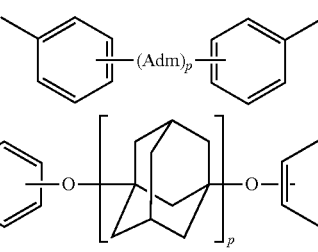

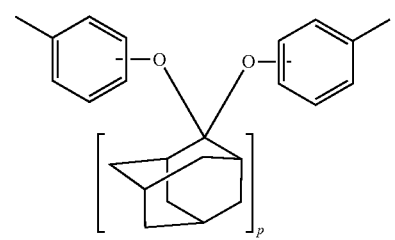

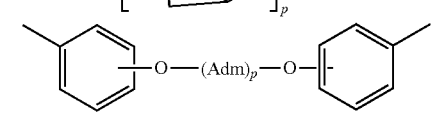

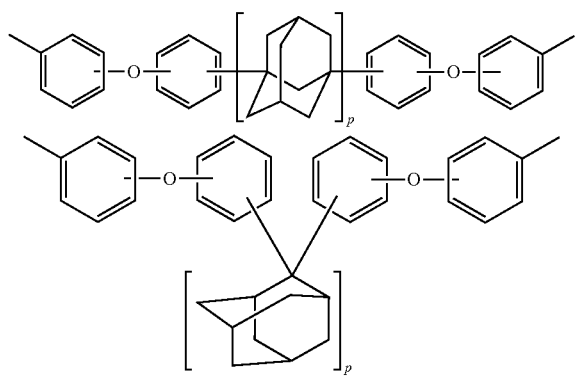

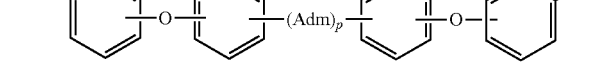

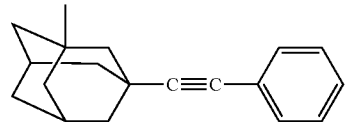

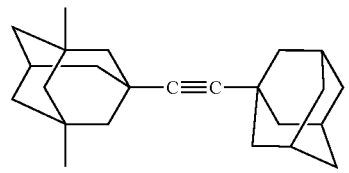

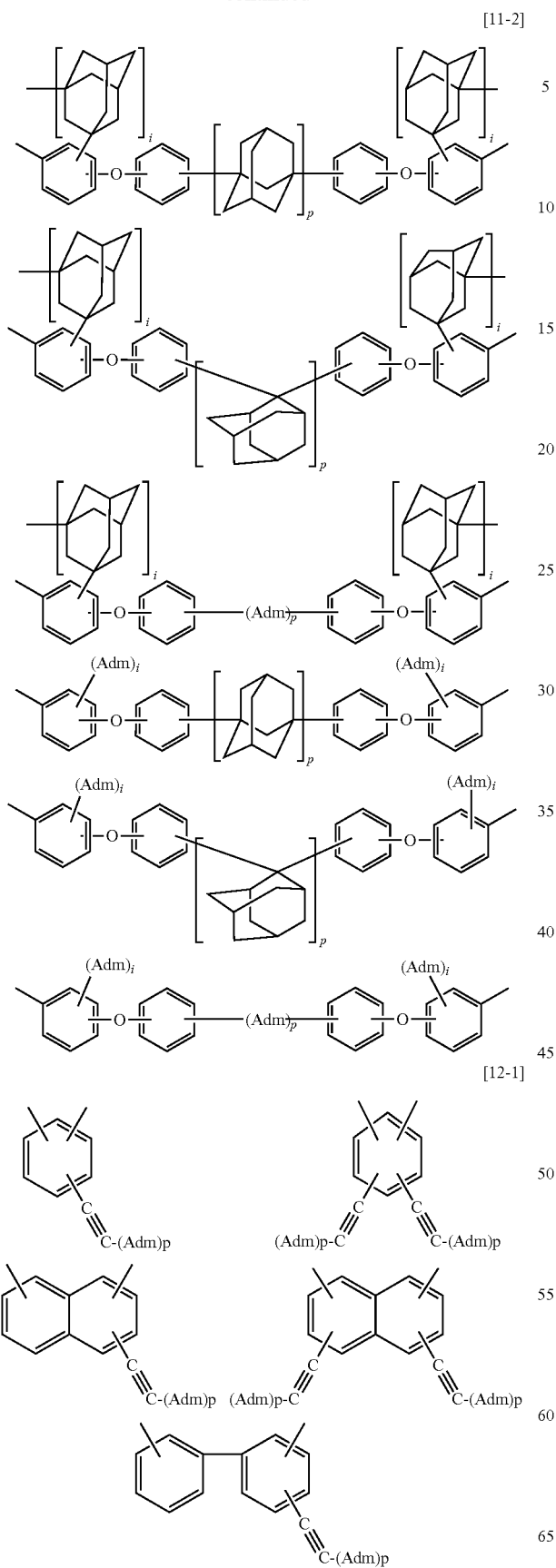
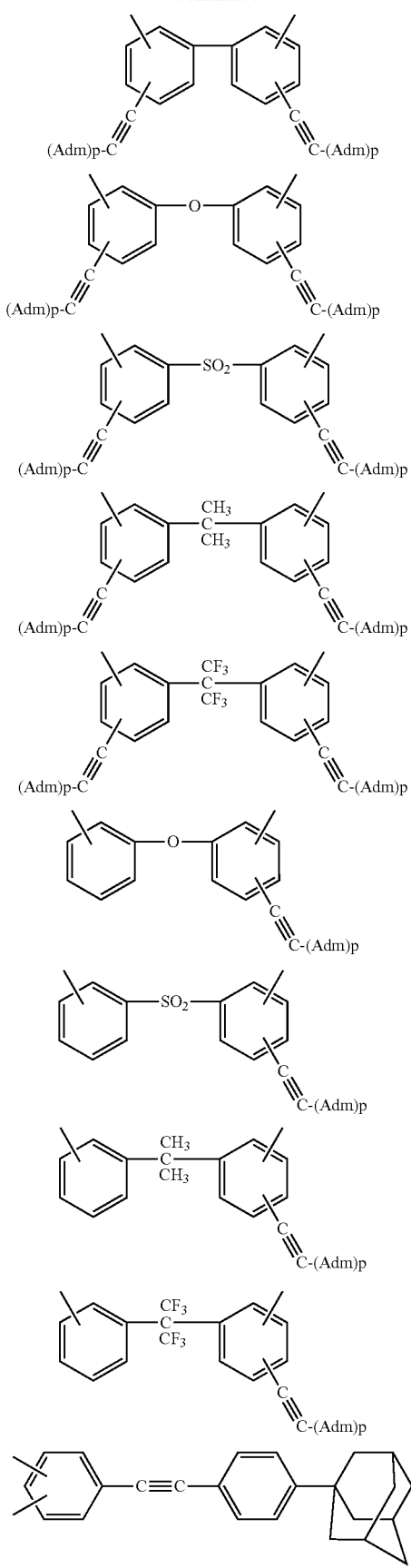

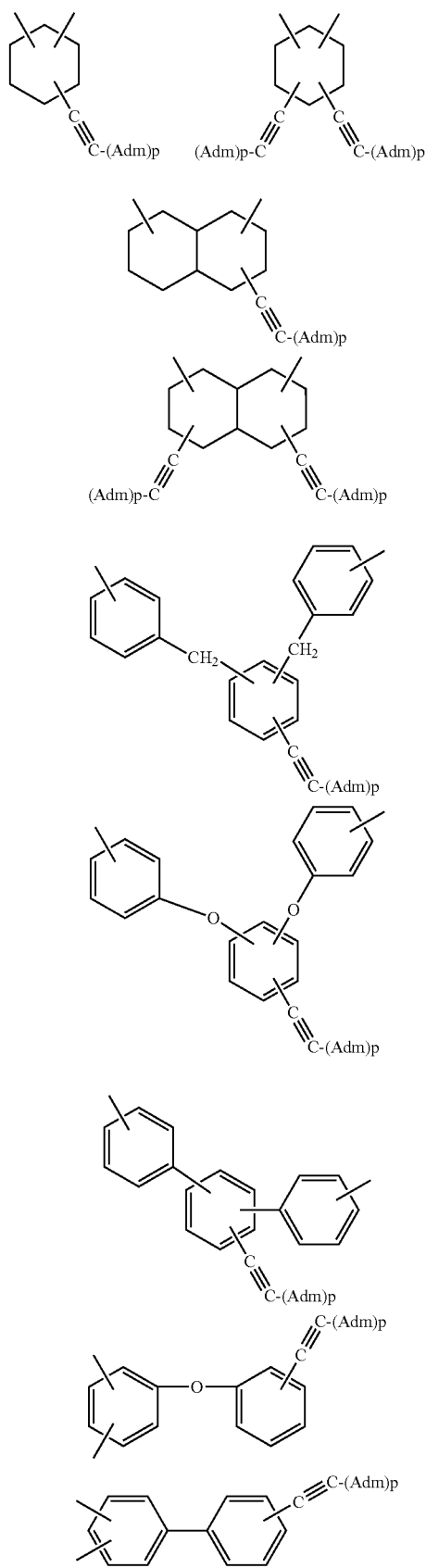

Adm in formulae [11-1], [11-2], [12-1] and [12-2] representing adamantyl group which is a smallest unit of the diamondoid structure, p representing a number of 1 or greater and 12 or smaller, and i representing a number of 1 or greater and 12 or smaller, (c) the benzoxazole resin precursor described in (a) or (b) which further comprises a repeating unit represented by following formula [13]:

$$\left(\begin{array}{c} \underset{|}{\mathrm{N}}\overset{\mathrm{H}}{\underset{|}{\phantom{M}}}\underset{X_3}{\phantom{M}}\overset{\mathrm{H}}{\underset{|}{\phantom{M}}}\underset{|}{\mathrm{N}}-\overset{\mathrm{O}}{\underset{\phantom{M}}{\mathrm{C}}}-Y_2-\overset{\mathrm{O}}{\underset{\phantom{M}}{\mathrm{C}}} \\ R_1O\phantom{MMM}OR_2 \end{array}\right)_n$$ [13]

wherein $R_1$ and $R_2$ each independently represent hydrogen atom or an organic group;

n represents an integer of 2 to 1,000;

$X_3$ represents at least one group selected from the group consisting of:

a group represented by following formulae [14]:

[14]

-continued

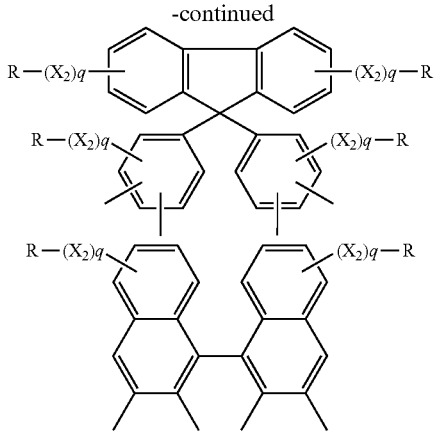

$X_2$ representing ethynyl group or propargyl ether group, Z representing —O—, —SO$_2$—, —CH$_2$—, —C(CH$_3$)$_2$—, —C(CF$_3$)$_2$— or an aromatic group, Ar representing an aromatic group having a functionality of 3 or greater, R representing a hydrogen atom or an organic group, r representing 0 or 1, and q representing an integer of 1 to 4, and a group represented by following formulae [15]:

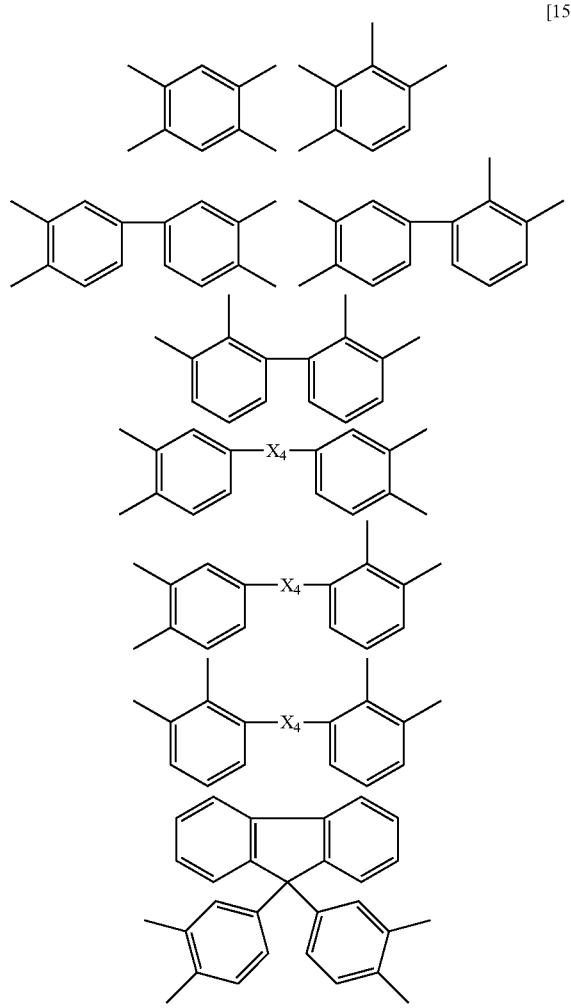

[15]

-continued

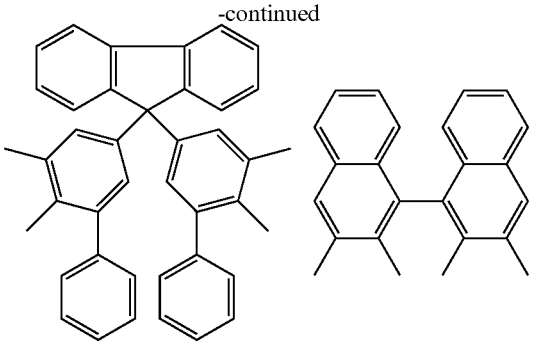

$X_4$ representing at least one group selected from groups expressed by following formulae [1]:

[16]

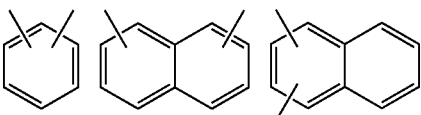
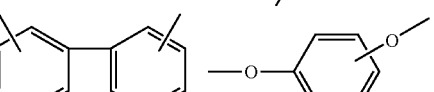
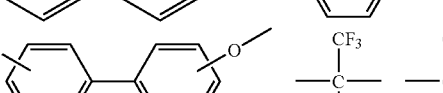
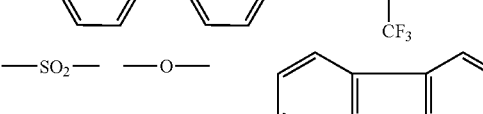
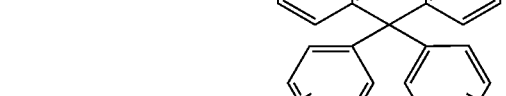
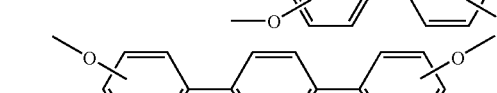
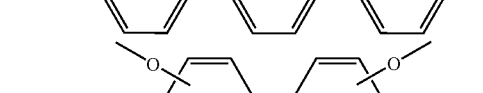
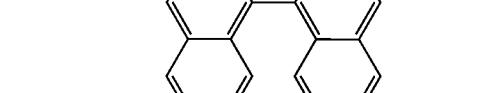
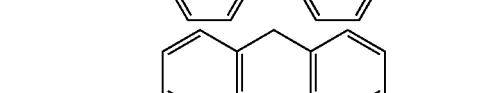
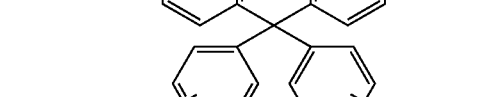
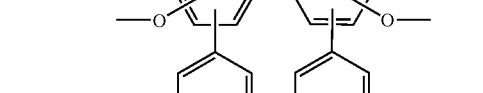
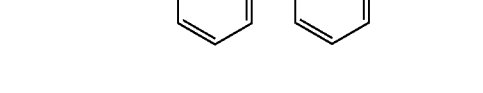

and $Y_2$ represents at least one group selected from the group consisting of a group represented by formulae [11-1], a group represented by formulae [11-2], a group represented by formulae [12-1] and a group represented by formulae [12-2] each of afore-said formulae being defined above, (d) the benzoxazole resin precursor described in (a) or (b), wherein the diamondoid structure is bonded to a functional group other than the diamondoid structure, (e) the benzoxazole resin precursor described in (a), (b), or (c), wherein the diamondoid structure having the repeating unit represented by formulae [1] in (a), [10] in (b) or [13] in (c) above, respectively, has an alkyl group, (f) the benzoxazole resin precursor described in (d), wherein the functional group other than the diamondoid structure has an acetylene bond, and (g) a benzoxazole resin precursor described in (c) which further comprises a repeating unit represented by following formula [17]:

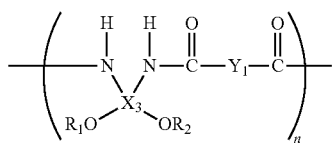

wherein $R_1$ and $R_2$ each independently represent hydrogen atom or an organic group; n represents an integer of 2 to 1,000; $X_3$ represents at least one group selected from the group consisting of a group represented by formulae [14] and a group represented by formulae [15] which are defined in (c) above; and $Y_1$ represents at least one group selected from the group consisting of a group represented by formulae [4], a group represented by formulae [6-1] a group represented by following formulae [6-2], a group represented by formulae [7-1] a group represented by following formulae [7-2], a group represented by formulae [8] and a group represented by formulae [9] each of afore-said formulae being defined in (a) above, or (h) a polybenzoxazole resin obtained by a ring-closing reaction with dehydration of the benzoxazole resin precursor described in any one of (a) to (g) above, or (i) a benzoxazole resin precursor composition which comprises at least two benzoxazole resin precursors defined in (a) to (g) above, wherein said composition comprises at least one benzoxazole resin precursor as defined in (a) to (f) above.

12. The resin film according to claim 11, which comprises fine pores having an average diameter of 10 nm or smaller.

13. The resin film according to claim 11, which is a film selected from the group consisting of a interlayer insulation film for semiconductors, a protective film for semiconductors and a protective film for etching.

14. A semiconductor device which comprises a resin film described in claim 11.

15. The benzoxazole resin precursor according to claim 5, wherein the diamondoid structure of the repeating unit represented by formula [10] has an alkyl group.

16. The benzoxazole resin precursor according to claim 1, wherein $Y_1$ in formula [1] is selected from the groups represented by formulae [6-1], [6-2], [7-1] or [7-2].

17. The benzoxazole resin precursor according to claim 5, wherein $Y_1$ in formula [1] is selected from the groups represented by formulae [6-1], [6-2], [7-1] or [7-2].

18. The benzoxazole resin precursor according to claim 6, wherein $Y_1$ in formula [1] is selected from the groups represented by formulae [6-1], [6-2], [7-1] or [7-2].

19. The benzoxazole resin precursor according to claim 7, wherein $Y_1$ in formula [17] is selected from the groups represented by formulae [6-1], [6-2], [7-1] or [7-2].

* * * * *